(12) United States Patent
Brannon et al.

(10) Patent No.: US 9,787,460 B2
(45) Date of Patent: Oct. 10, 2017

(54) SELF-INTERFERENCE CHANNEL ESTIMATION SYSTEM AND METHOD

(71) Applicant: LGS INNOVATIONS LLC, Herndon, VA (US)

(72) Inventors: Alan Scott Brannon, Denver, CO (US); Riley Nelson Pack, Broomfield, CO (US); Benjamin Joseph Baker, Broomfield, CO (US)

(73) Assignee: LGS INNOVATIONS LLC, Herndon, VA (US)

( * ) Notice: Subject to any disclaimer, the term of this patent is extended or adjusted under 35 U.S.C. 154(b) by 103 days.

(21) Appl. No.: 14/982,442

(22) Filed: Dec. 29, 2015

(65) Prior Publication Data

US 2017/0019272 A1   Jan. 19, 2017

Related U.S. Application Data

(60) Provisional application No. 62/193,148, filed on Jul. 16, 2015.

(51) Int. Cl.
*H04B 1/10* (2006.01)
*H04L 5/14* (2006.01)
(Continued)

(52) U.S. Cl.
CPC ......... *H04L 5/1461* (2013.01); *H04B 1/0003* (2013.01); *H04B 1/0042* (2013.01);
(Continued)

(58) Field of Classification Search
CPC .... H04B 1/401; H04B 1/0042; H04B 1/0003; H04B 1/1036; H04B 15/02; H04B 15/00;
(Continued)

(56) References Cited

U.S. PATENT DOCUMENTS

| 4,952,193 A | 8/1990 | Talwar |
| 4,991,165 A | 2/1991 | Cronyn |

(Continued)

FOREIGN PATENT DOCUMENTS

| CA | 2281676 A1 | 6/1999 |
| CA | 2405295 A1 | 6/1999 |

(Continued)

OTHER PUBLICATIONS

Chen, et al., "Division-Free Duplex for Wireless Applications", Electronics Letters, vol. 34, No. 2, pp. 147-148, (1998).

(Continued)

*Primary Examiner* — Ricky Ngo
*Assistant Examiner* — Lan Huong Truong
(74) *Attorney, Agent, or Firm* — Baker and Hostetler LLP

(57) ABSTRACT

The present application describes a method for characterizing a self-interference channel of a frequency division duplex transceiver including a transmitter and a receiver. The method includes transmitting, from a transmitter of a frequency division duplex transceiver in a transmission band, a transmission signal including a message signal and a swept tone that changes frequency from below an upper edge to above a lower edge of a reception band of a receiver, the self-interference channel being defined between the transmitter and the receiver of the frequency division duplex transceiver, such that at least a portion of the message signal leaks into a signal received the receiver, determining, at an infinite impulse response (IIR) filter of the receiver, an infinite impulse response of the self-interference channel based upon a reception of the swept tone swept at each frequency in the reception band, and estimating the self-interference channel, based upon the infinite impulse response.

20 Claims, 33 Drawing Sheets

(51) Int. Cl.
*H04B 1/04* (2006.01)
*H04B 1/00* (2006.01)
*H04B 15/02* (2006.01)
*H04L 25/02* (2006.01)
*H04B 15/00* (2006.01)
*H04B 1/401* (2015.01)
*H04B 1/713* (2011.01)
*H04B 1/715* (2011.01)

(52) U.S. Cl.
CPC ............ *H04B 1/0475* (2013.01); *H04B 1/10* (2013.01); *H04B 1/1036* (2013.01); *H04B 1/401* (2013.01); *H04B 15/00* (2013.01); *H04B 15/02* (2013.01); *H04L 5/14* (2013.01); *H04L 25/025* (2013.01); *H04L 25/0212* (2013.01); *H04B 1/713* (2013.01); *H04B 1/715* (2013.01); *H04B 2001/0408* (2013.01)

(58) Field of Classification Search
CPC ........ H04B 1/0475; H04B 1/10; H04B 1/715; H04B 1/713; H04B 2001/0408; H04L 5/1461; H04L 25/025; H04L 5/14; H04L 25/0212
See application file for complete search history.

(56) References Cited

U.S. PATENT DOCUMENTS

| | | | |
|---|---|---|---|
| 5,691,978 A | 11/1997 | Kenworthy | |
| 5,701,595 A | 12/1997 | Green, Jr. | |
| 5,729,829 A | 3/1998 | Talwar et al. | |
| 5,896,563 A | 4/1999 | Kawanami et al. | |
| 6,226,275 B1 | 5/2001 | Yang et al. | |
| 6,246,713 B1 | 6/2001 | Mattisson | |
| 6,311,045 B1 | 10/2001 | Domokos | |
| 6,531,918 B1 | 3/2003 | Posner et al. | |
| 6,600,905 B2 | 7/2003 | Greeff et al. | |
| 6,671,268 B2 | 12/2003 | Leung | |
| 6,704,349 B1 | 3/2004 | Masenten | |
| 6,725,018 B1 | 4/2004 | Gross, Jr. | |
| 6,771,931 B2 | 8/2004 | Waltho | |
| 6,788,729 B1 | 9/2004 | Posti | |
| 6,952,408 B2 | 10/2005 | Schwaller et al. | |
| 7,023,928 B2 | 4/2006 | Laroia et al. | |
| 7,096,042 B2 | 8/2006 | Marinier | |
| 7,218,693 B2 | 5/2007 | Troulis | |
| 7,228,104 B2 | 6/2007 | Collins et al. | |
| 7,349,505 B2 | 3/2008 | Blount et al. | |
| 7,406,130 B2 | 7/2008 | Huang et al. | |
| 7,436,757 B1 | 10/2008 | Wilson et al. | |
| 7,463,691 B2 | 12/2008 | Tao et al. | |
| 7,548,594 B2 | 6/2009 | Wang | |
| 7,688,907 B2 | 3/2010 | Dang | |
| 7,702,295 B1 | 4/2010 | Nicholls et al. | |
| 7,709,433 B2 | 5/2010 | Veltman et al. | |
| 7,720,506 B1 | 5/2010 | Gribble | |
| 7,738,586 B2 | 6/2010 | Landmark | |
| 7,769,075 B2 | 8/2010 | Hosseinian et al. | |
| 7,778,337 B2 | 8/2010 | Tong et al. | |
| 7,778,611 B2 | 8/2010 | Asai et al. | |
| 7,801,230 B2 | 9/2010 | Sung et al. | |
| 7,817,641 B1 | 10/2010 | Khandani | |
| 7,830,954 B2 | 11/2010 | Welz et al. | |
| 7,848,711 B2 | 12/2010 | Asai et al. | |
| 7,885,289 B2 | 2/2011 | Ross et al. | |
| 7,970,354 B1 | 6/2011 | Nicholls et al. | |
| 8,139,683 B2 | 3/2012 | Eldar et al. | |
| 8,199,631 B2 | 6/2012 | Bianchi et al. | |
| 8,199,681 B2 | 6/2012 | Zinser et al. | |
| 8,213,877 B1 | 7/2012 | Nicholls et al. | |
| 8,244,190 B2 | 8/2012 | Larsson et al. | |
| 8,254,246 B2 | 8/2012 | Ma et al. | |
| 8,335,270 B2 | 12/2012 | Hua et al. | |
| 8,379,584 B2 | 2/2013 | Hartman et al. | |
| 8,379,773 B2 | 2/2013 | Krasny et al. | |
| 8,416,896 B2 | 4/2013 | Kent et al. | |
| 8,428,650 B2 | 4/2013 | Pottenger | |
| 8,442,099 B1 | 5/2013 | Sederat | |
| 8,462,613 B2 | 6/2013 | Zhang et al. | |
| 8,467,738 B2 | 6/2013 | Gorbachov | |
| 8,483,240 B2 | 7/2013 | Ross et al. | |
| 8,483,626 B2 | 7/2013 | Gupta | |
| 8,498,584 B2 | 7/2013 | Roussel et al. | |
| 8,582,674 B2 | 11/2013 | Yu et al. | |
| 8,588,204 B2 | 11/2013 | Kumar et al. | |
| 8,638,892 B2 | 1/2014 | Dabiri et al. | |
| 8,655,301 B2 | 2/2014 | Roussel et al. | |
| 8,665,910 B2 | 3/2014 | Haustein et al. | |
| 8,670,356 B1 | 3/2014 | Keese et al. | |
| 8,681,847 B2 | 3/2014 | Seo et al. | |
| 8,681,887 B2 | 3/2014 | Lo et al. | |
| 8,699,595 B2 | 4/2014 | Martinez | |
| 8,725,067 B2 | 5/2014 | Ahn et al. | |
| 8,755,464 B2 | 6/2014 | Park et al. | |
| 8,767,886 B2 | 7/2014 | Sezginer et al. | |
| 8,817,853 B2 | 8/2014 | Balijapalli et al. | |
| 2002/0012238 A1 | 1/2002 | Takahashi et al. | |
| 2002/0183013 A1 | 12/2002 | Auckland et al. | |
| 2003/0072254 A1 | 4/2003 | Ma et al. | |
| 2004/0071103 A1 | 4/2004 | Henttu | |
| 2005/0040909 A1 | 2/2005 | Waight et al. | |
| 2005/0100117 A1 | 5/2005 | Jensen | |
| 2005/0195967 A1 | 9/2005 | Pessoa et al. | |
| 2005/0254589 A1 | 11/2005 | Higuchi et al. | |
| 2006/0291578 A1 | 12/2006 | Singh et al. | |
| 2007/0002979 A1 | 1/2007 | Verdi | |
| 2007/0123176 A1 | 5/2007 | Han et al. | |
| 2007/0195906 A1 | 8/2007 | Kim et al. | |
| 2007/0291883 A1 | 12/2007 | Welz et al. | |
| 2008/0146166 A1 | 6/2008 | Khan et al. | |
| 2008/0152033 A1 | 6/2008 | Gore et al. | |
| 2008/0287076 A1 | 11/2008 | Shen et al. | |
| 2009/0061759 A1* | 3/2009 | Stoddard | H04K 3/41 455/1 |
| 2009/0170444 A1 | 7/2009 | Retnasothie et al. | |
| 2010/0231321 A1 | 9/2010 | Czajkowski | |
| 2011/0263195 A1 | 10/2011 | Nightingale et al. | |
| 2012/0201153 A1 | 8/2012 | Bharadia et al. | |
| 2012/0201173 A1 | 8/2012 | Jain et al. | |
| 2012/0314560 A1 | 12/2012 | Alapuranen | |
| 2013/0005284 A1 | 1/2013 | Dalipi | |
| 2013/0023201 A1 | 1/2013 | Coleman et al. | |
| 2013/0101063 A1 | 4/2013 | Jiang et al. | |
| 2013/0301487 A1* | 11/2013 | Khandani | H04W 16/14 370/278 |
| 2013/0301488 A1 | 11/2013 | Hong et al. | |
| 2014/0169236 A1 | 6/2014 | Choi et al. | |
| 2014/0177484 A1 | 6/2014 | Balijapalli et al. | |
| 2014/0179246 A1 | 6/2014 | Balijapalli et al. | |
| 2014/0204808 A1 | 7/2014 | Choi et al. | |
| 2014/0206300 A1 | 7/2014 | Hahn et al. | |
| 2014/0219139 A1 | 8/2014 | Choi et al. | |
| 2015/0171903 A1 | 6/2015 | Mehlman et al. | |
| 2015/0180640 A1 | 6/2015 | Liu | |
| 2015/0244436 A1 | 8/2015 | Le-Ngoc et al. | |
| 2015/0311882 A1 | 10/2015 | Bulja | |
| 2015/0318976 A1 | 11/2015 | Eltawil et al. | |
| 2016/0094332 A1 | 3/2016 | Griffiths et al. | |

FOREIGN PATENT DOCUMENTS

| | | | |
|---|---|---|---|
| CA | 2553746 A1 | 8/2005 | |
| CA | 2554415 A1 | 8/2005 | |
| CN | 1826785 A | 8/2006 | |
| CN | 101242383 A | 8/2008 | |
| CN | 101242388 A | 8/2008 | |
| CN | 101291306 A | 10/2008 | |
| CN | 101437010 A | 5/2009 | |
| CN | 101505168 A | 8/2009 | |
| CN | 101997807 A | 3/2011 | |
| CN | 102256384 A | 11/2011 | |
| CN | 102387115 A | 3/2012 | |
| CN | 103117966 A | 5/2013 | |

(56) References Cited

FOREIGN PATENT DOCUMENTS

| | | |
|---|---|---|
| CN | 103179056 A | 6/2013 |
| CN | 103236994 A | 8/2013 |
| EP | 1587264 A2 | 10/2005 |
| EP | 1709774 | 10/2006 |
| EP | 1723755 | 11/2006 |
| EP | 1932306 | 6/2008 |
| EP | 2151964 A1 | 2/2010 |
| EP | 2259516 A2 | 12/2010 |
| WO | 2004102910 A1 | 11/2004 |
| WO | 2005055543 A1 | 6/2005 |
| WO | 2005069568 A1 | 7/2005 |
| WO | 2005074218 A1 | 8/2005 |
| WO | 2006138288 A2 | 12/2006 |
| WO | 2007028100 A2 | 3/2007 |
| WO | 2008034811 A1 | 3/2008 |
| WO | 2008051658 A1 | 5/2008 |
| WO | 2008089596 A1 | 7/2008 |
| WO | 2009020942 A1 | 2/2009 |
| WO | 2009104144 A1 | 8/2009 |
| WO | 2010025587 A1 | 3/2010 |
| WO | 2010054593 A1 | 5/2010 |
| WO | 2010063214 A1 | 6/2010 |
| WO | 2010078819 A1 | 7/2010 |
| WO | 2011044846 A1 | 4/2011 |
| WO | 2013138457 A1 | 9/2013 |
| WO | 2014079370 A1 | 5/2014 |
| WO | 2014113725 A1 | 7/2014 |
| WO | 2014121290 A1 | 8/2014 |

OTHER PUBLICATIONS

Raghavan, et al., "Analysis and Design of an Interference Canceller for Collocated Radios", Microwave Theory and Techniques, vol. 53, No. 11, pp. 3498-3508, (2005).

Yao, et al., "A 0.18 um CMOS Programmable Interference Canceller for Cognitive Radio Front-End", IEEE 8th International Conference on ASIC, pp. 391-394, (2009).

Ahmed, et al., "Interference Issues at Co-Located Base Stations and an Adaptive Cancellation Solution", Electromagnetic Compatibility Symposium—Melbourne, pp. 1-4, (2010).

Radunovic, et al., "Rethinking Indoor Wireless Mesh Design: Low Power, Low Frequency, Full-Duplex", Fifth IEEE Workshop on Wireless Mesh Networks (WIMESH 2010), pp. 1-6, (2010).

Duarte, et al., "Full-Duplex Wireless Communications Using Off-The-Shelf Radios: Feasibility and First Results", Conference Record of the Forty Fourth Asilomar Conference on Signals, Systems and Computers (ASILOMAR), pp. 1558-1562, (2010).

Weeraddana, et al., "The Benefits from Simultaneous Transmission and Reception in Wireless Networks", Information Theory Workshop (ITW), 2010 IEEE, pp. 1-5, (2010).

Ahmed, et al., "An Adaptive Cancellation System for a Colocated Receiver and Its Dynamic Range", Radio and Wireless Symposium (RWS), 2011 IEEE, pp. 271-274, (2011).

Ahmed, et al., "Optimized Interference Canceling for Colocated Base Station Transceivers", IEEE Transactions on Vehicular Technology, vol. 60, No. 9, pp. 4175-4183, (2011).

Trippe, et al., "An Adaptive Broadband BiCMOS Active Spur Canceller", Microwave Symposium Digest (MTT), pp. 1-4, (2011).

Ahmed, et al., "Interference at Colocated Base Stations: A Review", IEEE 23rd International Symposium on Personal Indoor and Mobile Radio Communications, pp. 1716-1721, (2012).

Hua, et al., "A Method for Broadband Full-Duplex MIMO Radio", Signal Processing Letters, vol. 19, No. 12, pp. 793-796, (2012).

McMichael, et al., "Optimal Tuning of Analog Self-Interference Cancellers for Full-Duplex Wireless Communication", 50th Annual Allerton Conference on Communication, Control, and Computing (Allerton), pp. 246-251, (2012).

Sahai, et al.,"Asynchronous Full-Duplex Wireless", Fourth International Conference on Communication Systems and Networks (COMSNETS), pp. 1-9, (2012).

Duarte, et al., "Experiment-Driven Characterization of Full-Duplex Wireless Systems", arXiv:1107.1276, pp. 1-31, (2012).

Habibi, et al., "Experimental Evaluation of an Adaptive Nonlinear Interference Suppressor for Multimode Transceivers", IEEE Journal on Emerging and Selected Topics in Circuits and Systems, vol. 3, No. 4, pp. 602-614, (2013).

Habibi, et al., Suppression of Constant Modulus Interference in Multimode Transceivers Using an Adaptive Nonlinear Circuit NASA/ESA Conference on Adaptive Hardware and Systems (AHS), pp. 150-155, (2013).

Kolodziej, et al., "Adaptive RF Canceller for Transmit-Receive Isolation Improvement", Radio and Wireless Symposium (RWS), pp. 172-174, (2014).

Choi, et al., "Achieving Single Channel, Full Duplex Wireless Communication", Proceedings of the sixteenth annual international conference on Mobile computing and networking (Mobicom 2010), pp. 1-12, (2010).

Choi, et al., "A Working Single Channel, Full Duplex Wireless System", MobiCom 2010, Stanford University, p. 1.

Choi, et al., "Achieving Single Channel, Full Duplex Wireless Communication", pp. 1-12.

Bharadia, et al., "Full Duplex MIMO Radios", NSDI'14 Proceedings of the 11th USENIX Conference on Networked Systems Design and Implementation, pp. 1-13, (2014).

Hong, et al., "Picasso: Flexible RF and Spectrum Slicing", SIGCOMM '12 Proceedings of the ACM SIGCOMM 2012 conference on Applications, technologies, architectures, and protocols for computer communication, (2012).

Bharadia, et al., "Full Duplex Radios", SIGCOMM '13 Proceedings of the ACM SIGCOMM 2013 conference on SIGCOMM, pp. 1-12, (2013).

* cited by examiner

SELF-INTERFERENCE CHANNEL ESTIMATION SYSTEM AND METHOD

CROSS-REFERENCE TO RELATED APPLICATIONS

This application claims priority to U.S. Provisional Application No. 62/193,148, filed on Jul. 16, 2015, the disclosure of which is incorporated herein by reference in its entirety.

FIELD

The present invention generally relates to radio frequency (RF) front end subsystems and methods of use. The present invention is more particularly related to a self-interference channel estimation system and a method.

BACKGROUND

Conventionally, attempts have been made to remove self-interference in non-FDD (Frequency Division Duplex), full duplex systems (where simultaneous transmission and reception occurs in overlapping frequencies) by use of electronic means or a combination of passive and active electronics means. Recent work has focused on a solution for the case where the transmit and receive operations occur in the same frequency band. In traditional systems, either Time Domain Duplex (TDD) or FDD has been utilized. TDD allows for use of the same frequencies but at different times. FDD allows for use of two separate frequencies at the same time. In FDD, the energy in the receive band results from the nonlinearities of the power amplifier.

Other cancellation work has focused on "full-duplex" operation within the same frequency band at the same time. This is the type of scheme that has relied upon balun-type cancellers. The balun-based methods assume a certain group delay between the transmit and receive antennas. Balun-based or transformer-based coupler are employed to provide to the receiver canceller a sample of the interference that is 180° out-of-phase and free from additional group delay. In such conventional balun based systems, the exact delay needs to be controlled.

Thus there is a need to address the non-linearities and the exact group delay control issues seen in the conventional systems.

SUMMARY

In one aspect, a method for characterizing a self-interference channel of a frequency division duplex transceiver including a transmitter and a receiver is provided. The method includes transmitting, from a transmitter of a frequency division duplex transceiver in a transmission band, a transmission signal including a message signal and a swept tone that changes frequency from below an upper edge to above a lower edge of a reception band of a receiver, the self-interference channel being defined between the transmitter and the receiver of the frequency division duplex transceiver, such that at least a portion of the message signal leaks into a signal received the receiver, determining, at an infinite impulse response (IIR) filter of the receiver, an infinite impulse response of the self-interference channel based upon a reception of the swept tone swept at each frequency in the reception band, and estimating the self-interference channel between the transmitter and the receiver, based upon the infinite impulse response.

In another aspect, a self-interference channel estimation system is provided. The self-interference channel estimation system includes a frequency division duplex transceiver including a transmitter and a receiver, the transmitter and the receiver forming a self-interference channel. The transmitter includes a signal generator configured to generate a swept tone having a frequency ranging from an upper edge of the reception band to a lower edge of the reception band, and to generate a message signal, and a combiner configured to up convert the swept tone and the message signal to a radio frequency signal centered about a center frequency of the reception band. The receiver includes an infinite impulse response (IIR) filter configured to equalize an infinite impulse response of the self-interference channel based upon a reception of the swept tone swept at each frequency in the reception band by the receiver over two receive paths, and a processor configured to estimate the self-interference channel between the transmitter and the receiver, based upon seethe equalized infinite impulse response.

In yet another aspect, non-transitory computer-readable medium including computer executable instructions, which when executed by a processor cause the processor to transmit, from a transmitter of a frequency division duplex transceiver in a transmission band, a transmission signal including a message signal and a swept tone that changes frequency from below an upper edge to above a lower edge of a reception band of a receiver, the self-interference channel being defined between the transmitter and the receiver of the frequency division duplex transceiver, such that at least a portion of the message signal leaks into a signal received at the receiver, determine, at an infinite impulse response (IIR) filter of the receiver, an infinite impulse response of the self-interference channel based upon a reception of the swept tone swept at each frequency in the reception band, and estimate the self-interference channel between the transmitter and the receiver, based upon the infinite impulse response.

There has thus been outlined, rather broadly, certain embodiments of the invention in order that the detailed description thereof may be better understood, and in order that the present contribution to the art may be better appreciated.

BRIEF DESCRIPTION OF THE DRAWINGS

In order to facilitate a more robust understanding of the application, reference is now made to the accompanying drawings, in which like elements are referenced with like numerals. These drawings should not be construed to limit the application and are intended only to be illustrative.

DETAILED DESCRIPTION OF THE ILLUSTRATIVE EMBODIMENTS

A detailed description of the illustrative embodiments will be discussed in reference to various figures, embodiments and aspects herein. Although this description provides detailed examples of possible implementations, it should be understood that the details are intended to be examples and thus do not limit the scope of the application.

Reference in this specification to "one embodiment," "an embodiment," "one or more embodiments," "an aspect" or the like means that a particular feature, structure, or characteristic described in connection with the embodiment is included in at least one embodiment of the disclosure. Moreover, the term "embodiment" in various places in the specification is not necessarily referring to the same embodiment. That is, various features are described which may be exhibited by some embodiments and not by the other.

Figure 1A:
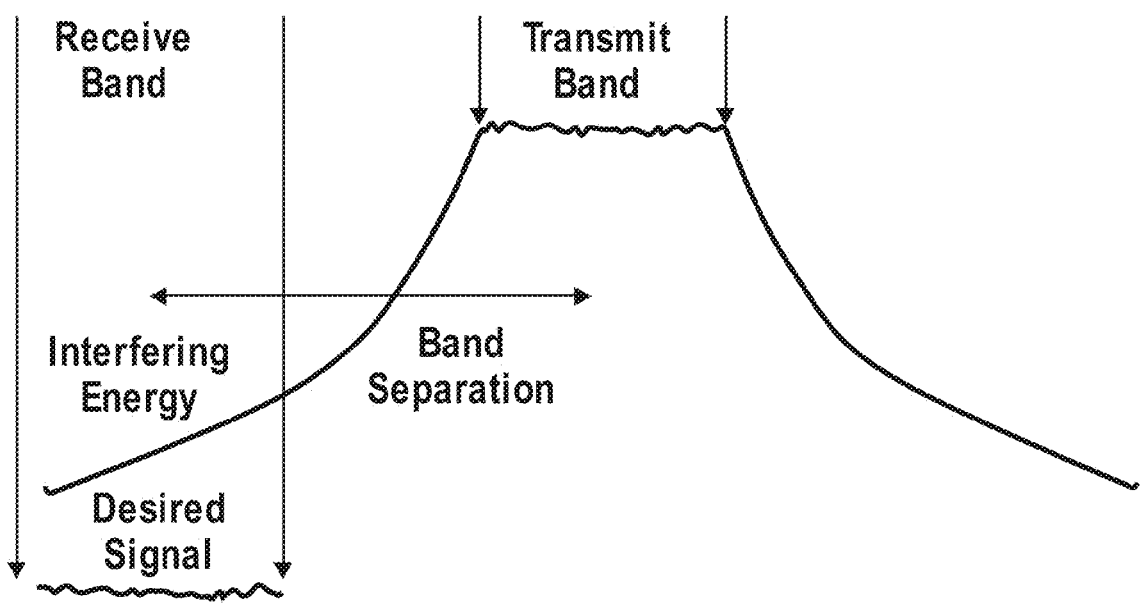
FIG. 1A illustrates an example of interfering energy.

Generally, many cellular and other communications systems operate in a frequency division duplex manner—simultaneous transmission and reception—using different frequency bands to transmit and receive, known as Frequency Division Duplex (FDD). FDD refers to the physically-defined frequency-based division between uplink and downlink, as opposed to time division, code division, polarization division, spatial division, and related variants. A frequency band is the set of allowed operating frequencies for communications. As illustrated in FIG. 1A there is a frequency separation between transmit and receive bands. In a wireless transceiver, information is transmitted at a power level that is typically many times higher than the received power. Interfering energy, which is generated by the transmitter nonlinearities and other noise processes, is leaked into the receive band frequencies where it interferes with desired reception. This interference is referred to as self-interference in this description. Proper receiver operation requires attenuation or transmit-to-receive isolation of this self-interference, in many cases on the order of 100 dB or more. It will be appreciated by one of ordinary skill in the art reading this disclosure that although this disclosure refers to frequency division duplex transceiver, various aspects may alternatively or additionally be implemented in a full duplex transceiver without departing from the scope of this disclosure.

In one aspect, a RF front end solution for a FDD wireless system is provided. This solution reduces some of the entire isolation requirement on the duplexer and can eliminate the duplexer in many cases. This is accomplished by use of interference cancellation. The method incorporates multiple cancellation methods which may be separately-employable methods: 1) Feed-forward Cancellation which reduces the transmitter's interference before it is presented at the receiver, and 2) Digital Cancellation which digitally samples and subtracts the interference from the desired signal at the receiver. Feed-forward Cancellation and Digital Cancellation can be applied independently in given applications or the two methods may be combined. Also antenna techniques may be applied in a given application. By stacking the isolation obtainable with the multiple cancellation methods and antenna techniques, isolation levels in excess of 100 dB are obtainable.

In an embodiment, the first method is based on the use of analog means for generation of an inverted signal which approximates the transmit signal received in the receive band and which is then subtracted from the transmit signal before it reaches the antenna and receiver. This part of the schema accommodates cancellation of signals at high power and with higher interference levels. The resultant signal after feed-forward cancellation contains residual energy from the transmit signal which may then be removed using another method such as antenna isolation or the second Digital Cancellation method.

In another embodiment, the digital self-interference means includes a channel estimation schema which properly determines the magnitude and phase response across the bandwidth of the channel and uses this information to model and generate an Infinite Impulse response, IIR, filter to generate an interference (e.g., interference) cancellation signal which is subtracted from the residual signal after Feed-forward Cancellation to obtain the signal of interest received from sources other than the transmit signal of the base station or wireless transceiver.

These methods may be used in tandem with each other and may be used with different antenna methods to achieve high levels of isolation and enable operation at high power levels over wide bandwidths.

The following objectives are met by the subject matter of this application:

1. Ability to cancel enough TX-RX interference (aka self-interference) to eliminate filters in systems with additional isolation methods such as TX-RX antenna separation, digital cancellation, or receiver cancellation.

2. Ability to cancel enough self-interference to reduce the requirements on filters used in traditional one-antenna systems. Therefore, the filters can be made smaller and cheaper.

3. Utility for existing FDD systems (like 3G and 4G cellular) and unlike existing methods can be applied to other systems for which waveforms are yet to be standardized, potentially with a mere software update.

4. Utility of the method to allow some systems to be designed without filters or other band-specific components, enabling band-independent transceivers or software defined RF front ends.

5. Novel transceivers that operate at many frequencies, or even user-defined frequencies, with an insignificant increase in size even when combined with software defined radios 6. Novel secure radios that operate over a great number of frequencies or bands even when combined with frequency-hopping software defined radios.

7. When combined with LTE-Advanced systems, enables band aggregation and/or frequency hopping in support of the LTE-A standard.

8. For low power systems (picocell, femtocell, cellular handset), the subsystem can be microfabricated and integrated on chip or by system-on-chip methods.

9. For high power systems (microcell, macrocell), the subsystem can be constructed with off-the-shelf components as part of an RF circuit 10. Advantageous leverage to more capable devices.

11. Use one or a combination of methods to enable fully standards-compliant wireless base stations for use in environments where outside interferers are low, e.g., high-altitude wireless base stations.

General Architecture

The power amplifier (PA) generates a high-power transmit (downlink) waveform, but its inherent nonlinearity generates intermodulation of the transmitted energy. For example, when a cellular base station is considered, the transmission is at the downlink frequency. For user equipment, such as for example a mobile phone, the transmitter would be on the uplink frequency. Some of this energy is present within the receive frequency band and, unless filtered using for example a duplexer or other filtering arrangements in present art systems, will interfere with the desired receive signal. Several factors determine the amount of interference present in the receive band, including but not limited to:

Duplex Spacing.

The closer in frequency the RX band is to the TX band, the higher the intermodulation interference.

Amplifier Topology.

A linear (class A or AB) produces the least interference but consumes the most DC power. Higher power consumption increases heat sink size. Doherty PAs are efficient but narrowband and not as linear.

Amplifier Device Technology.

Commercial LDMOS devices produce the least interference but are narrowband. Gallium Nitride (GaN) devices can help make broadband PAs but are less linear, resulting in more interference.

Modulation Bandwidth.

Larger data rates have created the requirement to support larger bandwidths, providing more spectral energy to fall into the receive band. Single-carrier GSM has most of its energy contained within 200 kHz, UMTS a little less than 5 MHz, and LTE has increased channel bandwidth allocation up to 10 MHz, 15 MHz, and 20 MHz, depending on RF band.

Feed Forward Self-Interference Cancellation

In an aspect of the application, a feedforward method for self-interference cancellation may direct signals through multiple paths (e.g., loops) to reduce interference, such as for example, interference as result of a power amplifier. In one example, a first path implements carrier cancellation to eliminate high power transmitter carrier output from a copy of captured power amplifier interference. This first path may be designated as a carrier cancellation path. A second path adjusts phase and amplitude of a waveform before injecting it into a main forward path. This second path may be designated the error cancellation path (also discussed herein as interference cancellation path) that compensates for the phase delay and amplitude of the residual signal in the receive band after the transmit carrier is cancelled. When the first path and the second path are combined the result may be a high-power transmitter that is effectively ultra linear in the receive band, as interference from the transmitter in the receive band is removed. Isolation between transmit and receive bands on the order of 30 dB to 40 dB may be obtained via the use of feedforward RF cancellation.

Figure 1B:
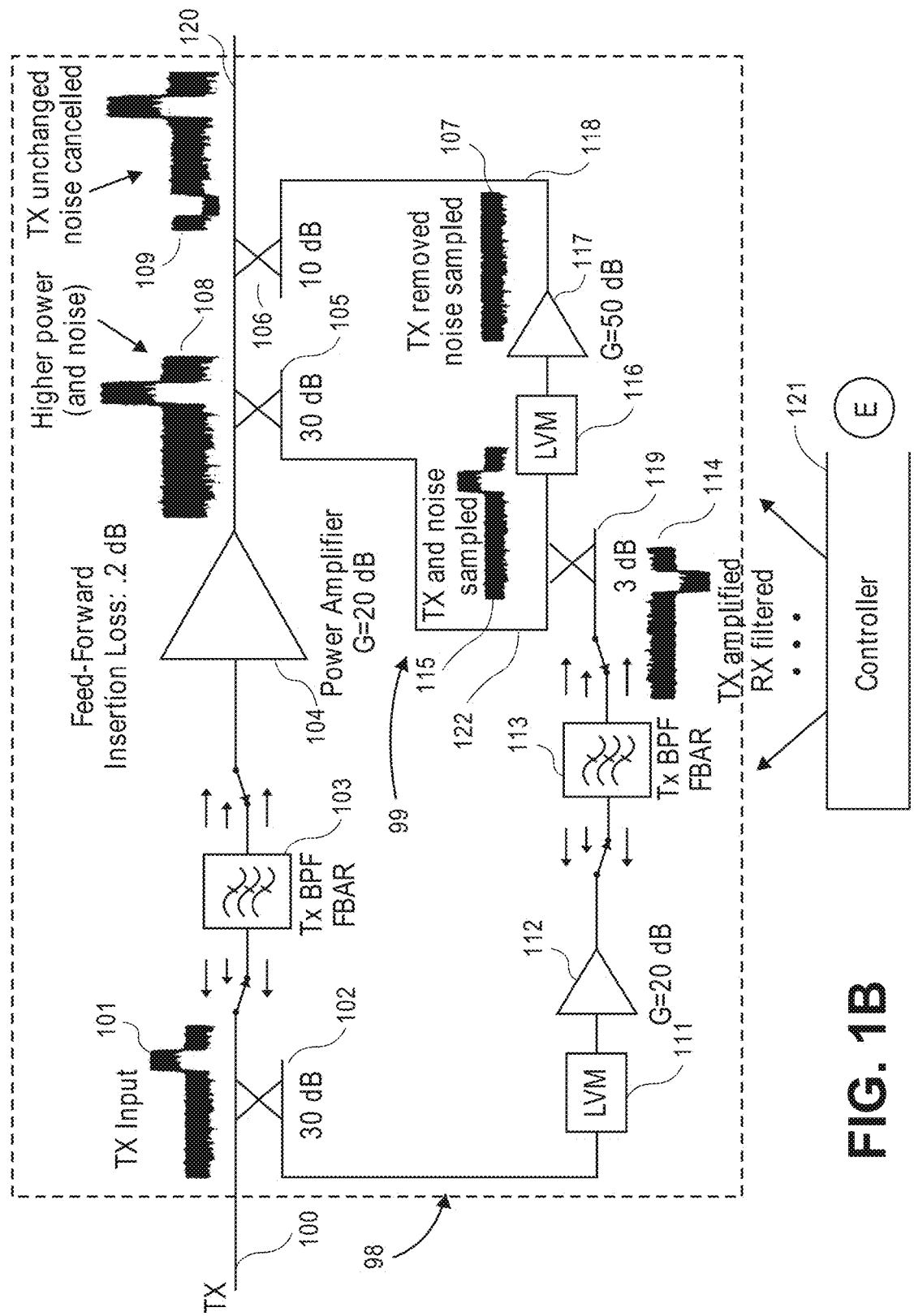
FIG. 1B illustrates the topology according to an aspect of the disclosure.

FIG. 1B illustrates an exemplary topology and elements of feed forward cancellation. Although discussed in more detail herein, below is a summary of the paths for FIG. 1B. In FIG. 1B, the carrier loop is composed of the path that contains the sampled carrier energy, starting at coupler 102, adjusted in amplitude and phase by LVM 111, amplified by power amplifier 112, optionally filtered by filter 113, and subtracted from the sampled carrier+noise power in segment 122. The forward transmission path consists of the main forward path through coupler 102, the bandpass filter 103, the transmit power amplifier 104, and the coupler that samples carrier+interference (noise) (coupler 105). The noise or error cancellation path is the main forward path through coupler 105 and coupler 106 and the path of the sampled interference through 105 (samples carrier plus interference), coupler 119 where the carrier energy is subtracted to leave essentially only the sampled interference, LVM 116 which adjusts magnitude and phase of the sampled interference, amplifier(s) 117, and coupler 106 where sampled and modified interference is subtracted (added in equal magnitude and 180° out of phase) from the energy in the main forward path 120.

At 100, TX signal 101 which corresponds to the waveform applicable for a given air interface, such as WCDMA, HSPA, or LTE, generated upstream of the feed-forward cancellation is input to the feed-forward cancellation electronics of FIG. 1B. Filter 103, which may be a fixed filter in a bank of filters or a tunable filter, or omitted, may filter the transmit band (TX signal 101) before being amplified by power amplifier 104. Power amplifier 104 amplifies the filtered TX signal 101. The output of power amplifier 104 is a higher power signal (e.g., signal 108) which includes interference that may be generated by power amplifier 104. The interference may result from the inherent non-linear nature of power amplification done by power amplifier 104.

In addition, coupler 102 samples TX signal 101. TX signal 101 has its amplitude and phase changed (e.g., using a vector modulator—linear VM 111—as well as power amplifier 12) so that the magnitude of the sampled signal as injected by coupler 119 (e.g., signal 114) is the same magnitude as signal 115 and the phase offset as discussed in more detail herein. Although a vector modulator is discussed, it is also possible that this method may be implemented with multiple devices, such as a device that controls the amplitude of the signal (e.g., variable-gain amplifier or attenuator) and another device that controls the phase of the signal. One purpose for filter 103 is to help provide matching of group delay in the main forward path when compared to the carrier loop, if filter 113 is used. Filter 113, for example, may bandpass-filter using tuned or a bank of filters, or omitted, resulting in signal 114. Signal 114 has the same magnitude as signal 115, but is 180 degrees out of phase after any phase shift from coupler 119. For example, if the coupler is a balanced Wilkinson, then signal 114 and signal 115 have the same magnitude and are 180 degrees out of phase. On the other hand, if coupler 119 is a 90° hybrid, then signal 114 and signal 115 have the same magnitude and are 90 degrees out of phase (the path design would be setup so that the extra 90° for signal 114 causes signal 114 and signal 115 to be 180° out of phase when they combine). Signal 115 is obtained via coupler 105 which samples signal 108 which includes power amplifier generated interference.

Injecting of signal 114 with signal 115 on segment 122 provides for the removal of the transmit energy of signal 115. For additional perspective, loop 98 retrieves a sample of the undistorted transmitter in order to provide a signal that removes the transmit energy from the sample of the noise in loop 99. Without the loop 98, loop 99 may add even more noise via power amplifier 117 associated with the existence of the transmit energy. The sample of the transmit energy in loop 98 is adjusted in amplitude and phase such that the transmitter energy removed at coupler 119. Without the transmit energy as described, loop 99 may take a more faithful sample of the interference, with minimal addition of its own distortion and with acceptable linearity specifications for the components in loop 99.

The signal with the removed transmit energy on segment 122 is input to linear vector modulator (LVM) 116 and amplified by power amplifier 117. The output of power amplifier 117 is signal 107 for which the transmit signal has been removed, but for which the interference in the receive band that was generated by the power amplifier remains. Signal 107 is an appropriately phase-shifted and amplified signal that provides for the cancellation of sample noised in the receive band when injected via coupler 106 into the main path 120. This signal 9 is a high power version of TX signal 101 with interference cancelled in the receive band as the transmit carrier has been cancelled in the receive band.

Moreover, noise that remains in the receive band may be cancelled by digital residual interference cancellation as discussed in more detail herein (e.g., FIGS. 5A-5E discussed below). In summary, an input signal from tone generation functions used for channel characterization, automatic gain control, and I/Q compensation in the digital method may be injected via a coupler onto segment 118. The resultant signal of segment 118 would then be coupled into the signal at the output of the power amplifier on main path 120 via coupler 6 to obtain signal 109, the high power transmit signal which is fed to downstream to transmit antenna functions.

Figure 1C:
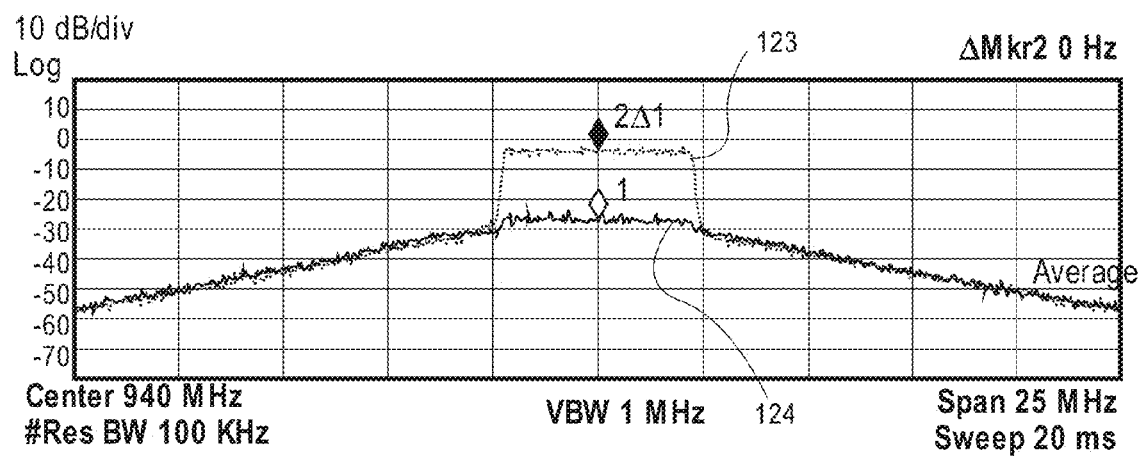
FIG. 1C illustrates signal data associated with removal of carrier power by the carrier cancellation loop.

FIG. 1C illustrates an exemplary measured result of the remaining signal as seen in the receive band after carrier cancellation. The carrier power is removed. Here, for example, trace 123 is the carrier signal in the receive band that occurs in signal 108 and trace 124 is the signal in the receive band that occurs in signal 109.

Figure 1D:
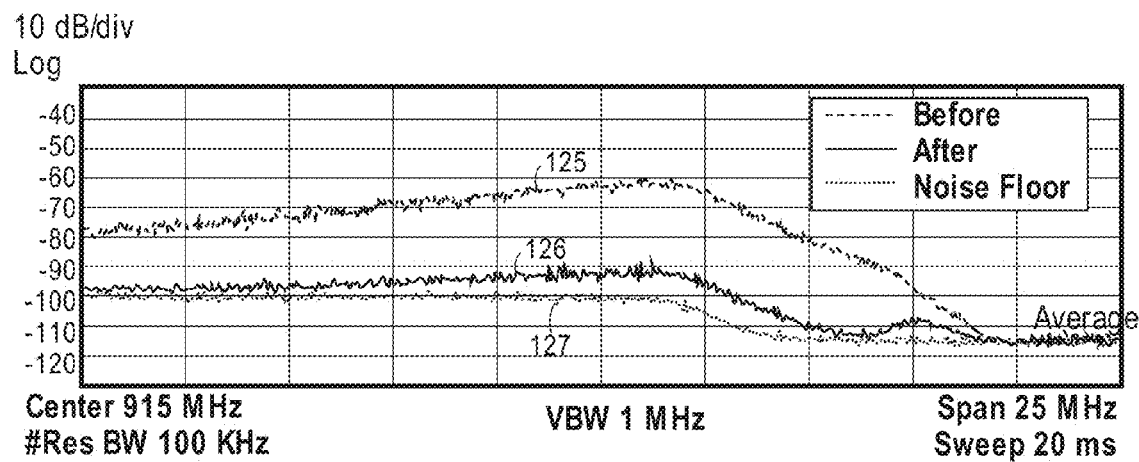
FIG. 1D illustrates signal data associated with the removal of self-interference from the receive band.

FIG. 1D illustrates exemplary results measured across a wide bandwidth after interference cancellation. FIG. 1C illustrates carrier cancellation of over 23 dB, while the FIG. 1D illustrates interference cancellation in the receive band. The noise from the power amplifier (e.g., power amplifier 104) is canceled by 30 dB. Cancellation is achieved over broad bandwidth, suitable for 4G waveforms and other future broadband waveforms. Due in part to group delay matching in all loops, feed-forward self-interference cancellation overcomes limitations of many conventional systems which operate over much narrower bandwidths. In addition, feed-forward self-interference cancellation as discussed herein enables additional downstream processing using digital processing means to deal with elimination of the residual noise after carrier cancellation where the residual noise occurs at low power levels closer to the noise floor of the system.

Variations due to temperature and component tolerances should be accounted for in implementations of feed-forward self-interference cancellation. It may beneficial to use components that have especially high linearity, in order avoid limiting the cancellation achievable, especially for high power systems. The electronics of the feed-forward self-interference cancellation path may drift with time and temperature, so an electronic feedback control circuit, such as controller 121, may be used. Controller 121 may maintain carrier cancellation lock. The result is a sampled output of the interference from the Power Amplifier as seen in the receive band which remains stable throughout the operation of the system. Implementations of the present invention have confirmed the operation of the art taught herein. It is beneficial for group delay to be carefully controlled for both the carrier cancellation and error cancellation loops. The carrier cancellation loop may drift such that the sampled carrier power may be out of exact anti-phase with the sampled carrier+interference signal. Or it may have drifted to no longer be the same amplitude as the sampled carrier+interference signal. In either case, carrier power will be less than optimally removed from the sampled interference output of coupler 119. The controller 121 circuit senses the resulting carrier power (the power after subtraction) and adjusts amplitude and phase (e.g., in LVM 111) to maintain optimal phase and amplitude matching of the carrier loop.

Discussed below is one example for control of the carrier cancellation path of the feed-forward self-interference cancellation path. First, the phase and magnitude of the LVM 111 in the carrier cancellation path are swept over their usable range to find an operating point that is close to the optimal operating point of the system (e.g., the operating point that minimizes the carrier power at the output of the feed-forward self-interference cancellation path). With regard to LVM 111, the power measurement for control is a broadband power measurement of the signal at the output of coupler 119. Once the sweep has completed, controller 121 utilizes a "perturb and observe" algorithm to find the optimal operating point. It changes the magnitude and phase by small steps; if the cancelled carrier power decreases by changing either value in a given direction, then that direction is closer to the optimal operating point. Otherwise, if the power increases, then the operating point is in the other direction, and controller 121 switches directions of magnitude and phase values. This may be done periodically.

Control of the error cancellation path using LVM 116, for example, is similar to the carrier cancellation path, with the exception that power measurement of the error cancellation path is a sample of the output signal 109. This sample may be fed through a super-heterodyne receiver to limit the power measurement to the desired receive channel. Otherwise, control for the two methods is similar.

Controller 121 has control over the tunable, controllable or switchable elements shown in FIG. 1B and include magnitude and phase of LVM 111, LVM 116, filter 103, filter 113 (e.g., tunable or switched), or other controllable elements to be included as determined to be needed on an application-to-application basis. For example, filter 103 and filter 113 shown in FIG. 1B may be used, but filter 103 and filter 113 are not necessary in many applications. In addition, controller 121 may control other elements such as FFTs, IIR filters, and other digital elements which discussed generally herein.

Figure 1E:
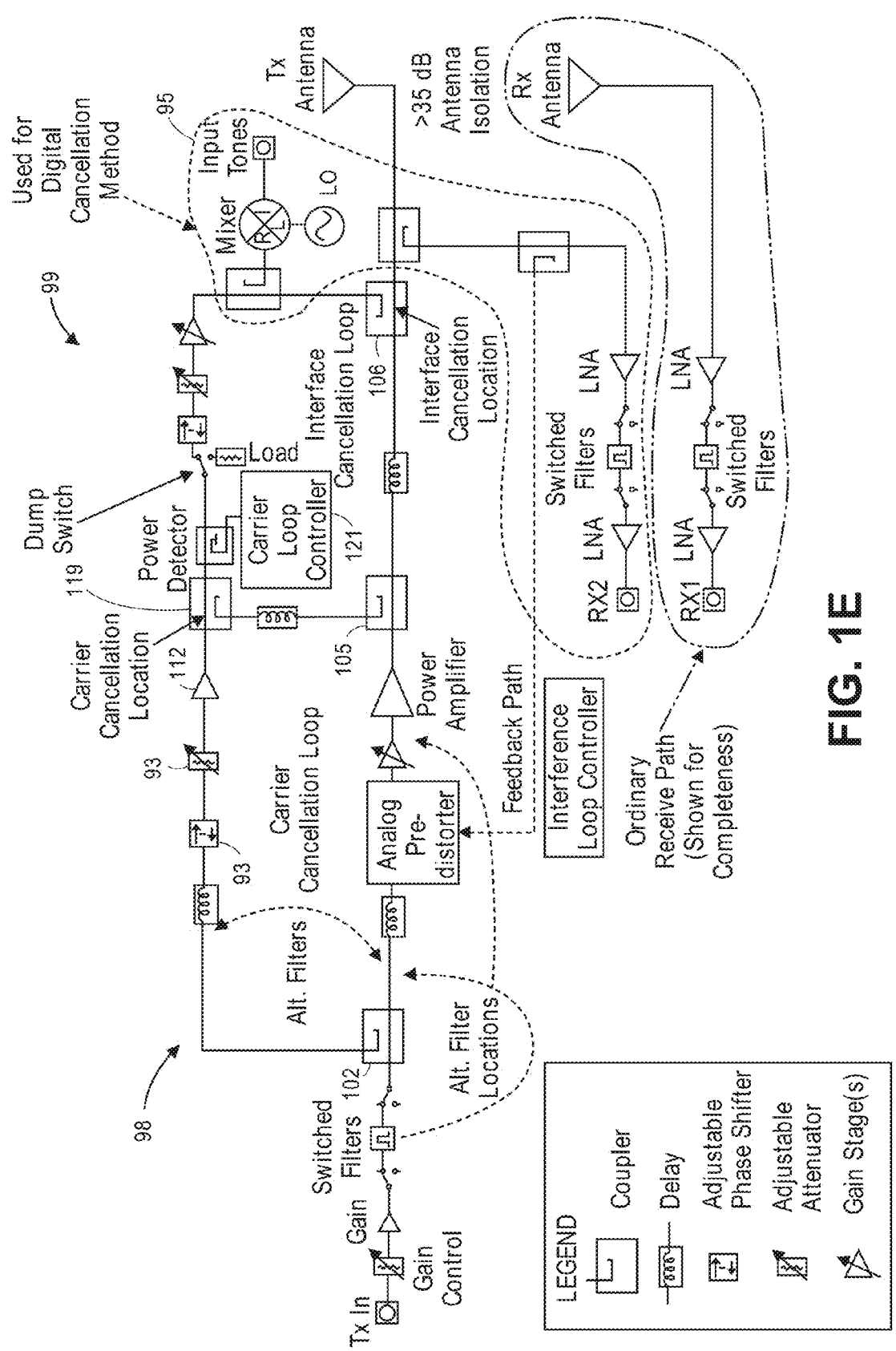
FIG. 1E illustrates another exemplary topology and elements of feed forward cancellation.

FIG. 1E illustrates another exemplary topology and elements of feed forward cancellation that is similar to what is shown in FIG. 1B. Some of the common elements as shown in FIG. 1B have the same numbers as shown in FIG. 1E. Many of the elements shown in FIG. 1E are optional and may be removed. Elements (e.g., gains, delays, or power detectors) shown in FIG. 1E may be removed or repositioned to accommodate different goals of effectiveness of the system.

As shown by the arrows, there are multiple alternative filter locations. Loop 98 (carrier cancellation loop) and loop 99 (interference/error cancellation loop) of FIG. 1E have different elements than what is shown in loop 98 and loop 99 of FIG. 1B. System 95 of FIG. 1E provides an example of the use of the feed forward cancellation method with the digital cancellation method. The connection and configuration of system 95 to the feed forward cancellation method is similar to digital residual interference cancellation loop 1206 as connected with feed-forward self-interference cancellation loop 1204 shown in FIG. 12B.

With continued reference to FIG. 1E, in the interference cancellation loop (loop 99), there may be a component called a power detector that goes to a controller. The controller is sensing the analog power, which is primarily the carrier power that makes it through the carrier cancellation loop (loop 98). Carrier cancellation occurs in the coupler 119. The residual amount that is not successfully canceled may be fed into the optional power detector. The power detector gives an output voltage that responds to the carrier power. Controller 121 may be used to minimize the voltage at that location. Controller 121 makes use of the output of the power detector. Controller 121 may adjust the amount of attenuation (attenuator 94) and the amount of phase shift (phase shifter 93), such that it minimizes the amount of detected carrier power, in order to stabilize the carrier cancellation loop (loop 98). If the controller is digital then there may be one controller. There also may be multiple separate controllers when the carrier cancelation is done in a fully analog way. The use of separate controllers may be faster and could prove advantageous. For example, in secure communications there may be a need to change frequencies quickly and a fast stabilization loop may be preferred with an analog method Those skilled in the art will certainly recognize that elements of the feed-forward self-interference cancellation of FIG. 1B and FIG. 1E may be configured for applications for use with different air interfaces or Radio Access Technologies (RAT) and for operation in different bands as well as at different power levels. And gains, coupling losses and power amplifier and other gain elements as well as feedback control parameters may be applied appropriately to a given application of the art of the present invention. For example, the disclosed components of the systems and methods may be electronically reprogrammable via controller 121 so operation may happen over many bands.

Digital Self-Interference Residual Cancelation

Figure 2:
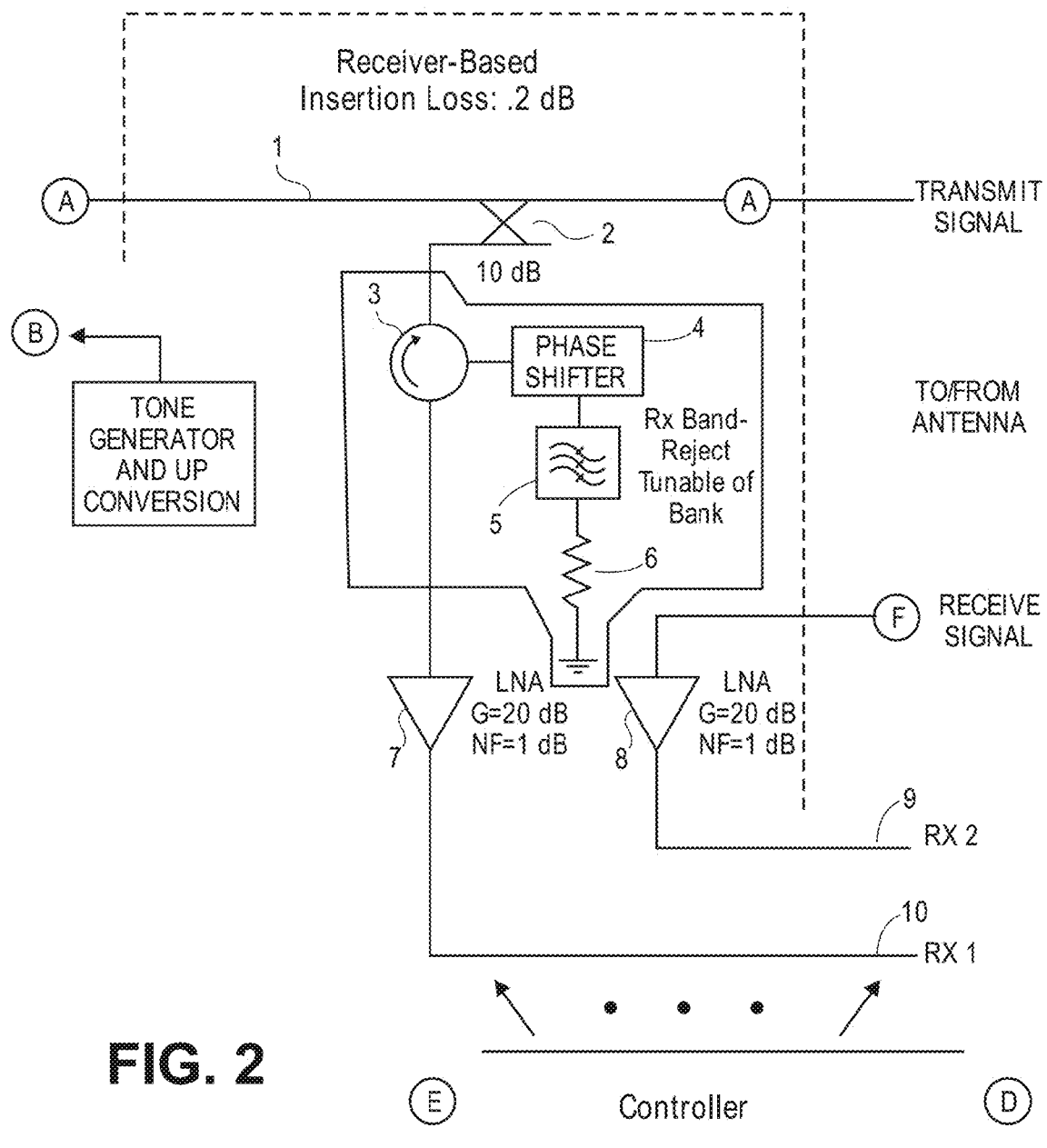
FIG. 2 illustrates receiver based processing, according to an aspect of this disclosure.

FIG. 2 illustrates receiver based processing which enables cancellation of Power Amplifier generated noise which occurs in the receive band across the receive band. Signal A, the transmit signal is input to antenna means for transmission of signals to subscriber units or other transceivers. Tone generator generates two fixed tones which are constant during the operation of the system as well as swept tones which are periodically applied during the operation of the system to enable characterization of the channel between the transmitter and the receiver. Tone generator includes up conversion functions to enable transmitting the tones coincident with the band of operation of the RX signal.

Further to FIG. 2, the Transmit signal is sampled via coupler 2 and input to filter 3, which reduces the power of the Tx carrier. The output of filter 3 feeds into low noise amplifier 7 to generate the RX1 signal 10 which is a composite signal used in further digital process as a reference signal which contains the tones which were injected into the transmit path as well as the residual noise generated by the power amplifier which occurs in the receive band.

As also shown in FIG. 2 a receive signal F which is obtained from receive antenna functions includes the residual noise from the power amplifier which occurs in the receive band after transmit carrier cancellation as well as the tones which were injected into the transmit signal and also includes the desired receive signal from which residual noise is to be further cancelled. The receive signal F is amplified via low noise amplifier 8 to obtain the RX2 signal 9 which is further processed to remove residual transmit noise.

According to another aspect of the disclosure, digital self-interference residual cancellation samples the output of the power amplifier before the antenna and then subtracts this sample from the received signal from the antenna. To do so, the system injects tones into the receive channel to characterize the frequency response of the channel with respect to both amplitude and phase across the channel. With this characterization information, the sampled data can be equalized to be the same as the received signal and subtracted successfully. In summary, injected tones are a reference that goes through the same distortion as the self-interference signal, which allows for the inversion of the distortion of the self-interference and, therefore, broadband cancellation of the interference from the received signal.

Isolation between transmit and receive bands on the order of 20 to 40 dB may be obtained with digital self-interference residual cancellation, depending on the degree of match in both phase and amplitude between the compensating signal and the residual transmit signal across the receive band channel as seen at the input to the receiver.

Figure 5A:
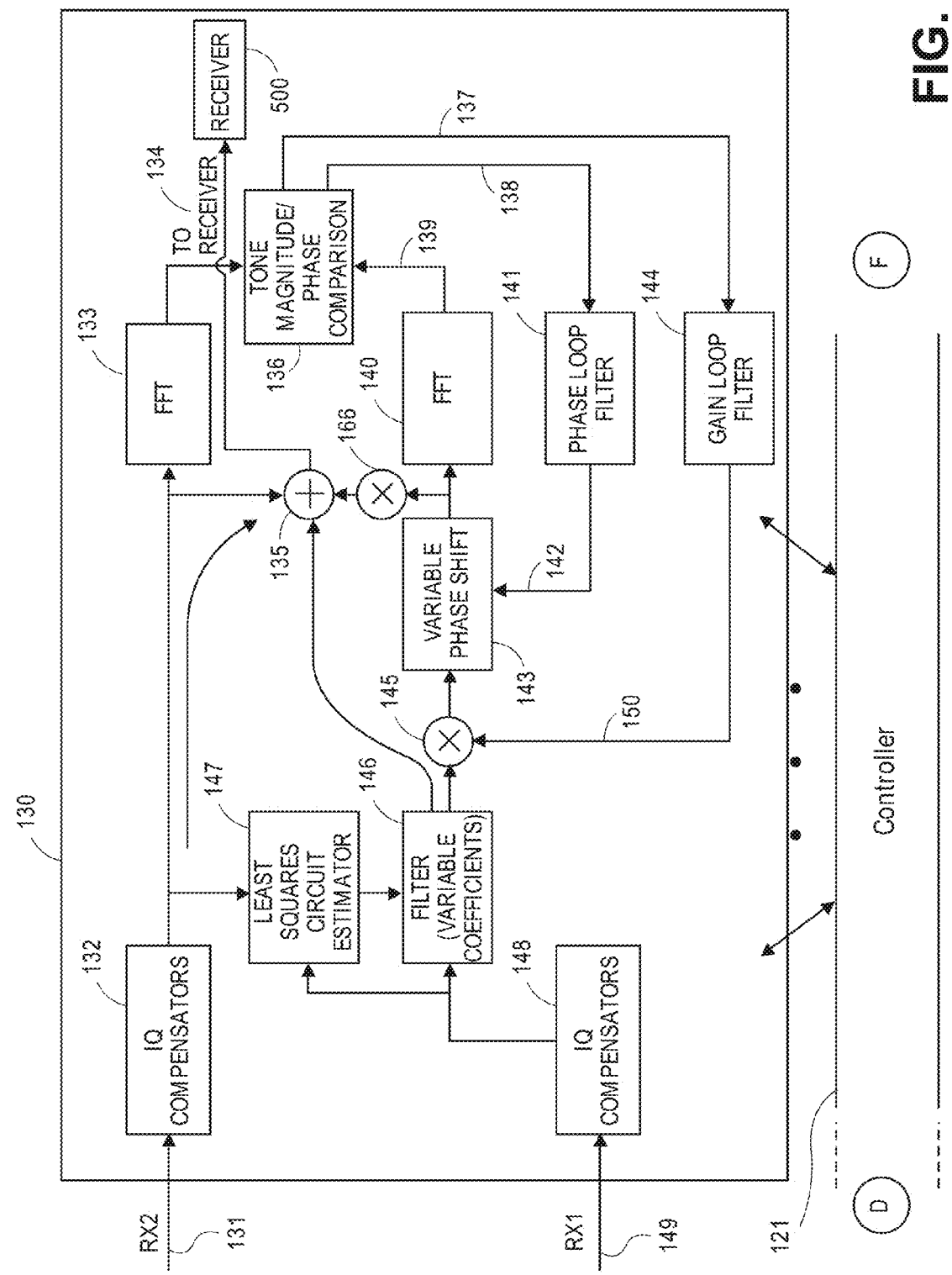
FIG. 5A illustrates a digital interference cancellation system according to aspect of this disclosure.

FIG. 5A illustrates an exemplary digital residual noise cancellation system (or generally, an interference cancellation system) used as a stage of Tx-Rx self-interference cancellation before the received signal is processed by the physical layer of the radio. The digital residual noise cancellation system uses a sample of the transmit signal before the transmit antenna of a device (e.g., signal based on the sample from coupler 2 of FIG. 2). The sample of the transmit signal is referred to as Rx signal 149, which includes the injected tones, and may be used to determine which part of the received signal (Rx signal 131) is transmit interference. Once the transmit interference is determined it may be removed from the Rx signal 131. Rx signal 131 includes the interference plus the tones plus the desired signal. As discussed herein, to determine and remove the transmit interference, the system continuously injects two tones (constant during the operation of the system) just outside the receive channel and periodically sweeps a third tone through the channel.

It has been determined that the injected tones add only a very small degradation to the desired signal. The levels used for the injected tones are controllable and advantageously enables transmission of these tones at levels which are just large enough to allow them to be seen in the receive band, but small enough that they add minor degradation to the operation of the system. The level of the tones may be significant. If the tones are too large then they degrade the performance of a system, because there is limited dynamic range in the receiver. The tones should be loud (i.e., large) enough to meet a signal to noise ratio that give valid results for the IIR filter (e.g., IIR filter 146). The tones should be loud (i.e., large) enough to meet a signal to noise requirements of the rest of the system while respecting the dynamic range limitations of the system For example, there may be a receiver that has a 60 dB dynamic range and a goal may be to try to cancel 30 dB of interference. In this scenario the power of the tones can be adjusted such that they are above the interference level but below the 60 dB limit, giving up to a 30 dB range of valid power levels, depending on the required SNR. Therefore tones should be between 20 dB and 30 dB above the interference level. The tones should be large enough so that they are greater than the interference level, but less than the dynamic range of the receiver. The digital residual noise cancellation system discussed herein may operate at baseband.

With continued reference to FIG. 5A, a first stage in the system 130 may compensate for imbalances in I/Q compensator 132 and I/Q compensator 148 for RX signal 149 and Rx signal 131, respectively, used to compensate for gain and phase imbalances that might have occurred during down conversion using one of the fixed tones mentioned above (e.g., the fixed tone at the lower edge of the reception band). If these imbalances are left uncompensated, they lead to skew and rotation in the received constellations, which reduces the amount of cancellation. The compensation algorithm uses one of the two fixed tones mentioned above (e.g., the fixed tone at the lower edge of the reception band) and minimizes a power of the image tone at the negative of the frequency of the image tone.

Regarding IQ Compensators 132 and 148 ('I' for in-phase and 'Q' for quadrature phase, as known to one of ordinary skill in the art), the distortion from IQ imbalance can be characterized by a matrix $E=[1, 0; -g \sin(\phi), g \cos(\phi)]$, where g is a gain mismatch between the two arms of the IQ compensator 132 and/or the IQ compensator 148 (each having a respective IQ demodulator), and $\phi$ is a phase mismatch between the two arms. In one aspect, a processor (not shown) in a controller 121 is configured to compute the inverse of E (i.e., a matrix $E^{-1}$) and apply the inverse matrix to the received digital data so that the original non-distorted constellation can be processed. The inverse of E is therefore $E^{-1}=1/(g \cos(\phi))*[1, 0; g \sin(\phi), 1]$. Further, a non-transitory or tangible computer-readable medium (not shown) may be connected to the processor. Such computer-readable medium may store computer executable instructions, which when executed by the processor cause the processor to carry out the various features and functionalities of the disclosure. Such non-transitory computer-readable medium may include memory devices such as read-only memory (ROM), random access memory (RAM), and the like, or combinations thereof.

Figure 6:
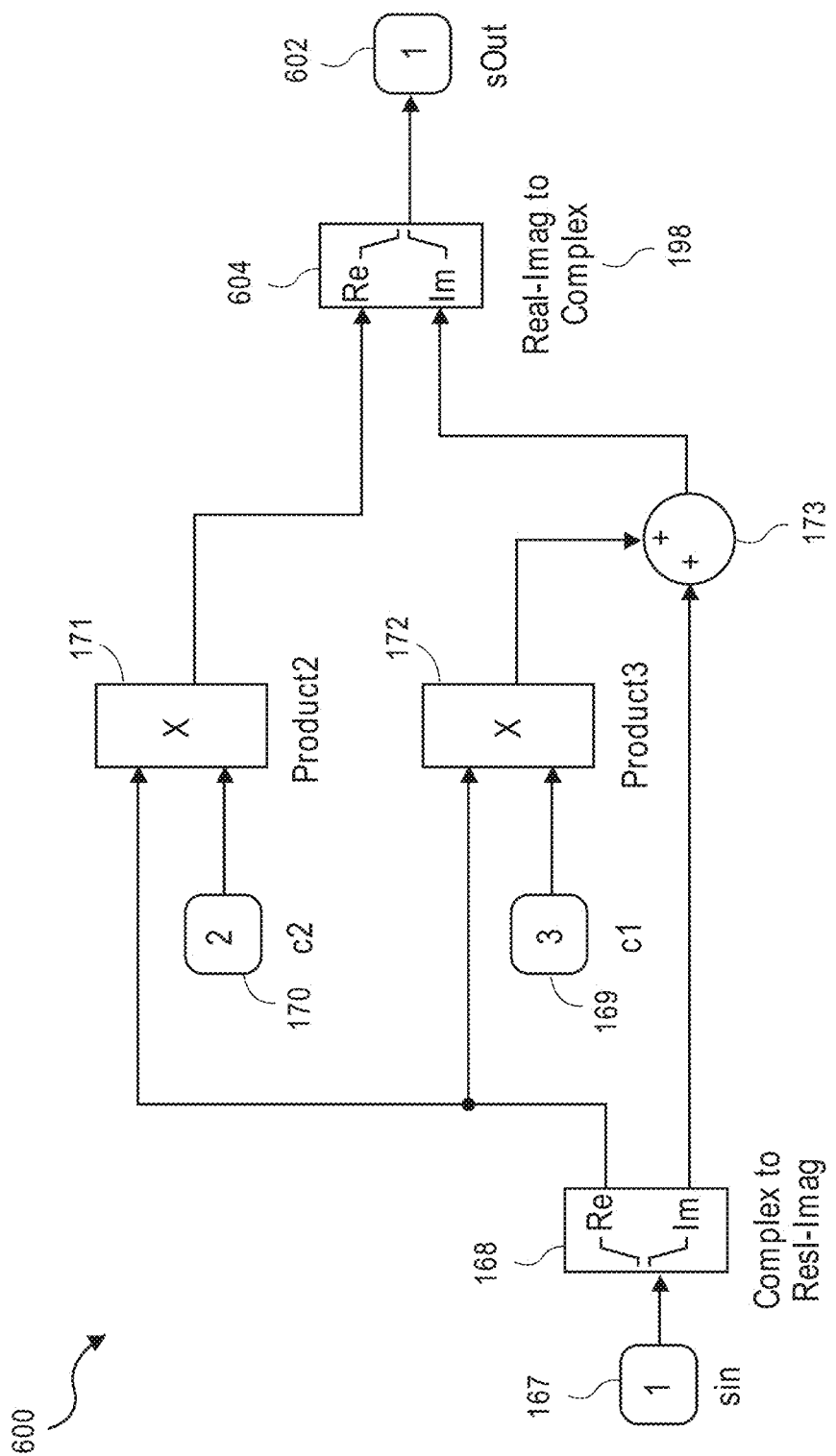
FIG. 6 illustrates architecture to invert distortion, in accordance with an aspect of this disclosure.

In an embodiment, a structure as shown in subsystem 600 in FIG. 6 can be used to invert the distortion in the received signal. The subsystem 600 is included inside each of the IQ compensators 132 and 148. In FIG. 6, a complex input signal $S_{in}$ at an input 167 (representing the received signal at a receiver) is first separated into its real and imaginary parts or components in a module 168, which are respectively multiplied by coefficients c1 stored in a module 169 and c2 stored in a module 170, respectively, by multiplier 171 and adder 172. The imaginary component obtained from the module 168 is combined with the output of the multiplier 172 by adder 173. The signals at the inputs of a combiner 604 are both real signals. Therefore, the output of the adder 173 is real. The signal at the output of the combiner 604 is a corrected signal. In other words, if the input 167 receives $S_{in}$, then an output of block the combiner 604 is $E^{-1}*s$.

Figure 7:
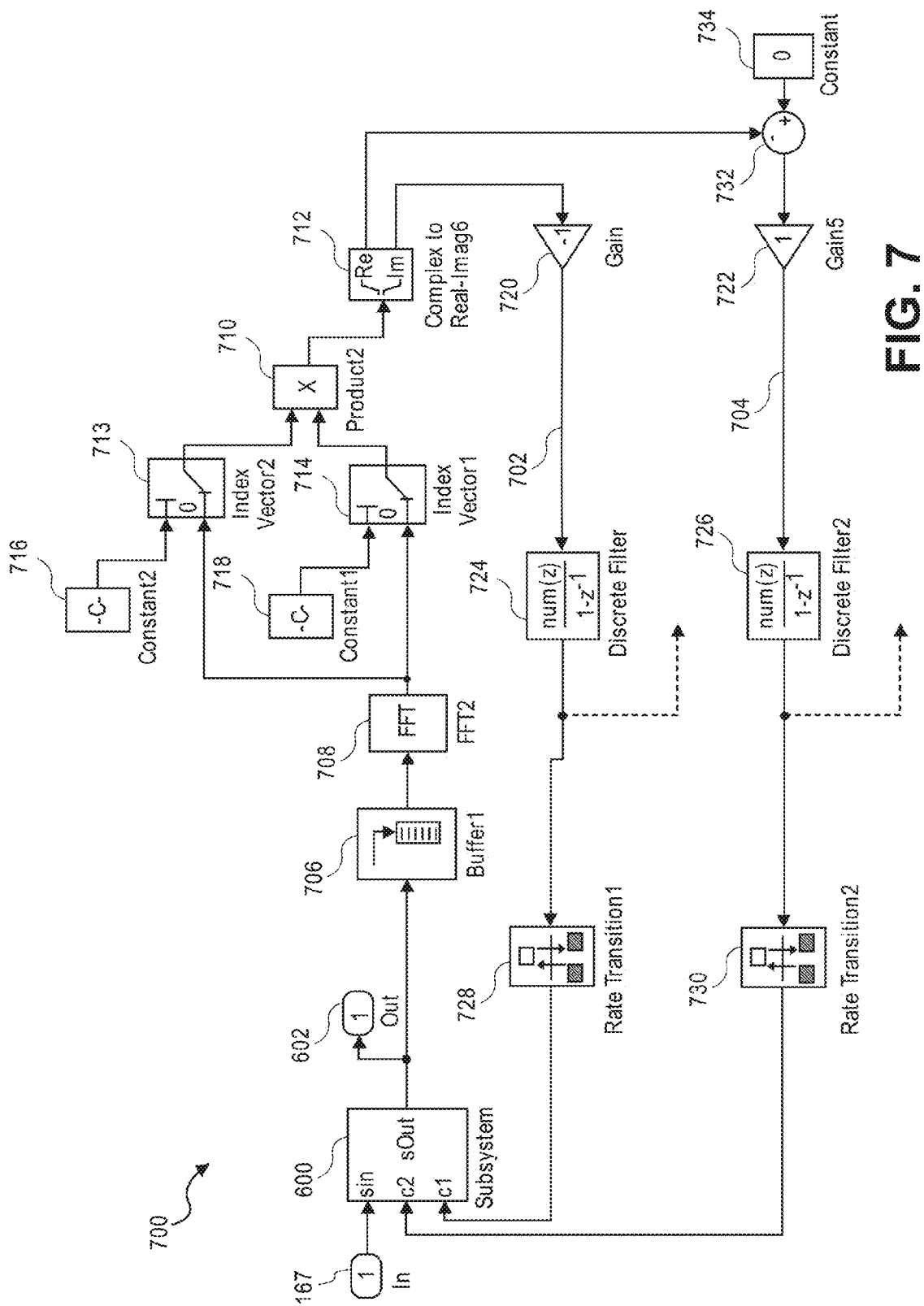
FIG. 7 illustrates architecture reducing an error signal using feedback loops, according to another aspect of this disclosure.

In one aspect of this disclosure, one or more feedback loops 702 and 704 to calculate the coefficients c1 and c2 in FIG. 6 may be deployed. Here the subsystem 600 is described with respect to the feedback loops 702 and 704 in a subsystem 700 in FIG. 7. A fixed tone is injected in a transmission signal and an image of the fixed tone is observed in the received signal. For example, if the fixed tone injected is at a frequency $f_{Tone}$, the image tone is at $-f_{Tone}$, the goal of the feedback loops is to minimize the power of the image tone.

This is accomplished in the subsystem 700 by taking a Fast Fourier Transform (FFT) 708 after buffering the incoming signal 602 at a buffer 706 and multiplying at a multiplier 710, the values of FFT bins 713 and 714 by constants 716 and 718 corresponding to the fixed tone and its image tone. In one aspect, the buffers are optional and alternative functional elements may be used by one of ordinary skill in the art in view of this disclosure. The result is that if the image tone's magnitude is dropped to 0, the product in complex form at a module 712 will also be zero. The imaginary part of the output of the module 712 is fed to a negative unity gain buffer 720 of the feedback loop 702 and the real part of the output of the module 712 is fed to a unity gain buffer 722. The resulting error signal at an output of the multiplier 710 is split into its real and imaginary parts, which are fed through integrators 724 and 726 (which are rate translated by rate translators 728 and 730, respectively, and which are preceded by the buffers 720 and 722, respectively as well as an adder 732 which adds an offset 734) to force the DC error to 0. This is similar in concept to how a Costas Loop locks to an incoming complex signal and separates out the I and Q components. In one aspect, the buffer 722, the offset 734, and the adder may be optional and may be replaced by a single negative unity gain block.

In one aspect of this disclosure, the next stage of the system 130 is configured to equalize the differences in magnitude and phase variation seen between the Rx signal 131 and the Rx signal 149. Because the interference from the transmitter 100 must be removed over the entire bandwidth of the receive channel shown in the subsystem 130, it is not good enough to simply match the magnitude and phase at a single frequency and then subtract the two signals. To accomplish this characterization, a tone is periodically swept through the receive channel at a discrete number of frequencies, and the power of that tone at each port is measured and processed. This tone is referred to as a swept tone, and the discrete frequencies may be equally spaced in the receive band.

Measurements of magnitude and phase of the down converted swept tone at each of the discrete frequencies are made via an FFT 133. Further, measurements are made at each of k discrete frequencies of the swept tone to determine a measured $H_k$ where:

$H_0$ is the measurement of $H(e^{jw}_0)$, ..., and $H_k$ is the measurement of $H(e^{jw}_k)$, where H denotes a transfer function such that $H(e^{jw})$ is the frequency-domain representation of the difference between the path from the output of the transmitter 100 to Rx ports RX1 and RX2 in FIG. 5A receiving the signals 131 and 149. If $X(e^{jw})$ as the frequency-domain representation of the transmitted signal. Then $R1(e^{jw})$ is the portion of the transmitted signal that is received at Rx port RX1 and $R2(e^{jw})$ is the portion of the transmitted signal that is received at Rx2. It will be appreciated that RX1 is the port that receives a sample of the transmitted signal and RX2 is the normal receive port for the system. Then H is (R2/X)/(R1/X)=R2/R1 where $e^{jw}$ has been dropped for clarity of this equation defining H.

Advantageously, the value of k is controllable by the controller 121 for a given instance of the system 130. The higher the value of k, the number of measurement points across the receive band, the more likely it is that the IIR filter 146 will be able to match the frequency response well. By way of example only and not by way of limitation, implementations of the system 130 have shown that values of k as small as 47 yield cancellation results which can meet applications requirements in many applications.

Within software in the controller 121, tables of values of $H_k$ for both magnitude and phase are determined for a given measurement cycle (e.g., a swept tone measurement cycle for that of the swept tone) normalized to an angular frequency $\omega_k$. Here, $\omega_k = 2\pi f_k/Fs$ where $f_k$ is the frequency of a given discrete tone and Fs is the sampling frequency.

Figure 8A:
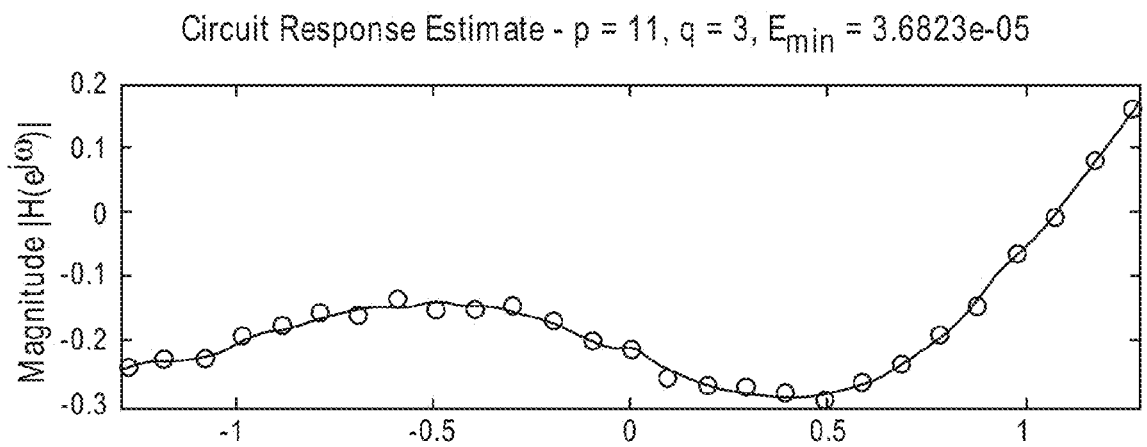
FIGS. 8A and 8B illustrate measured data with respect to both magnitude and phase across the receive band, in accordance with an aspect of this disclosure.
Figure 8B:
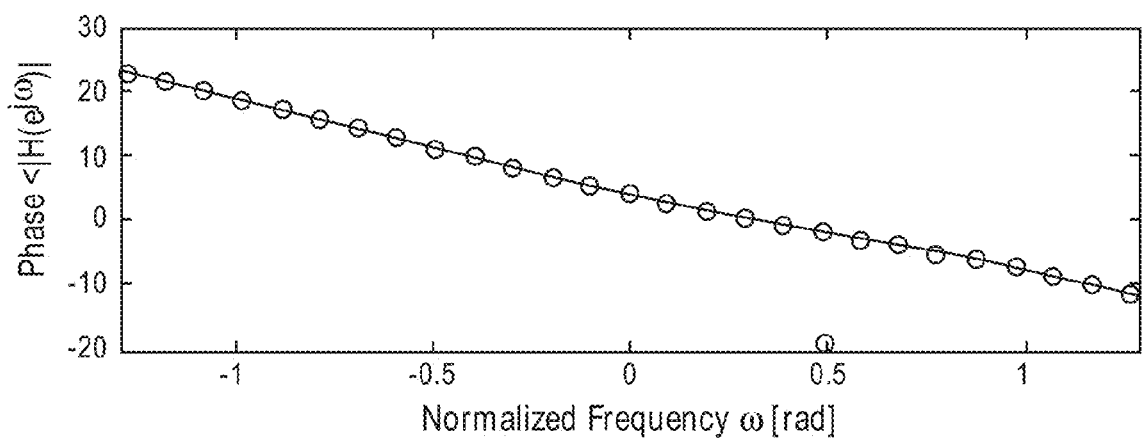
Figure 9A:
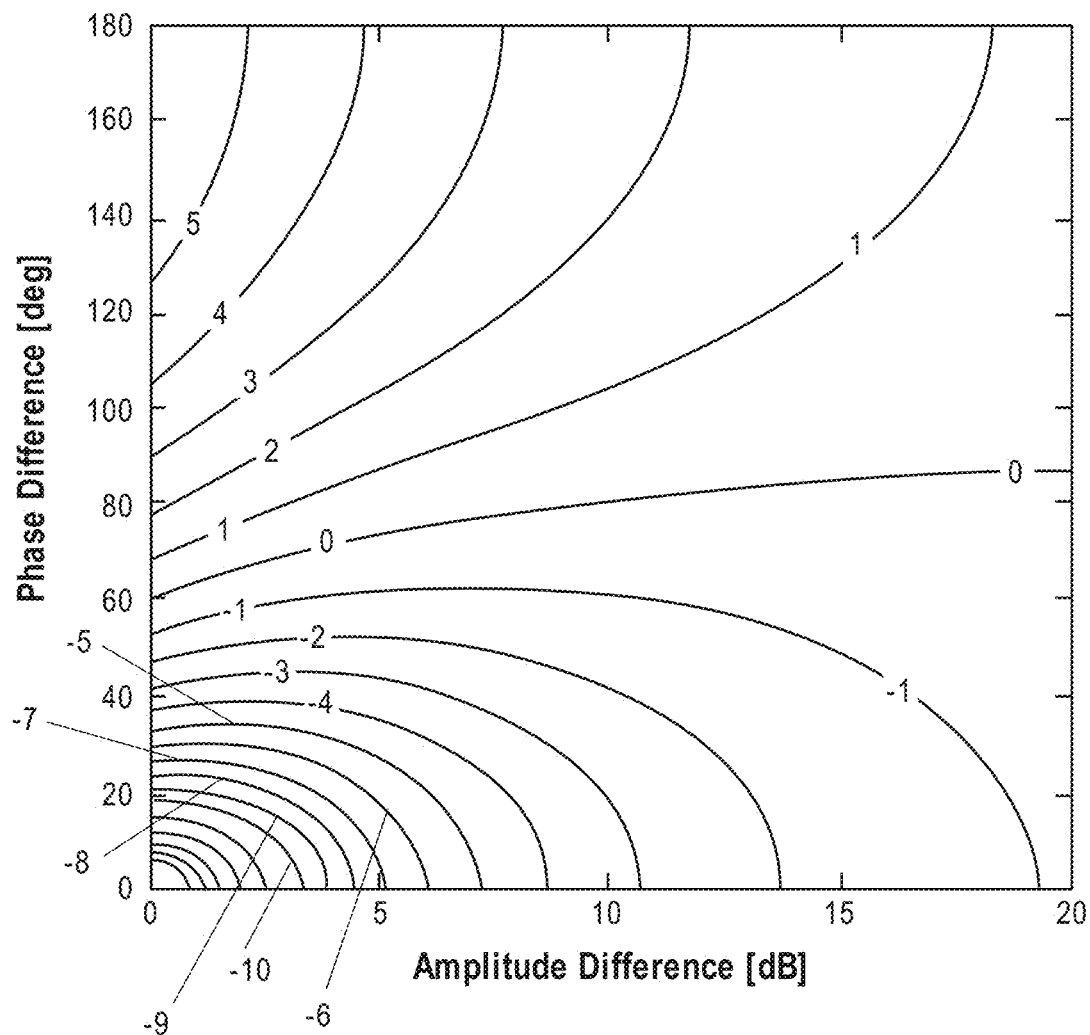
FIGS. 9A-D illustrate the degree of improvement in isolation obtainable for different combinations of amplitude error and/or phase error, in accordance with an aspect of this disclosure.
Figure 9B:
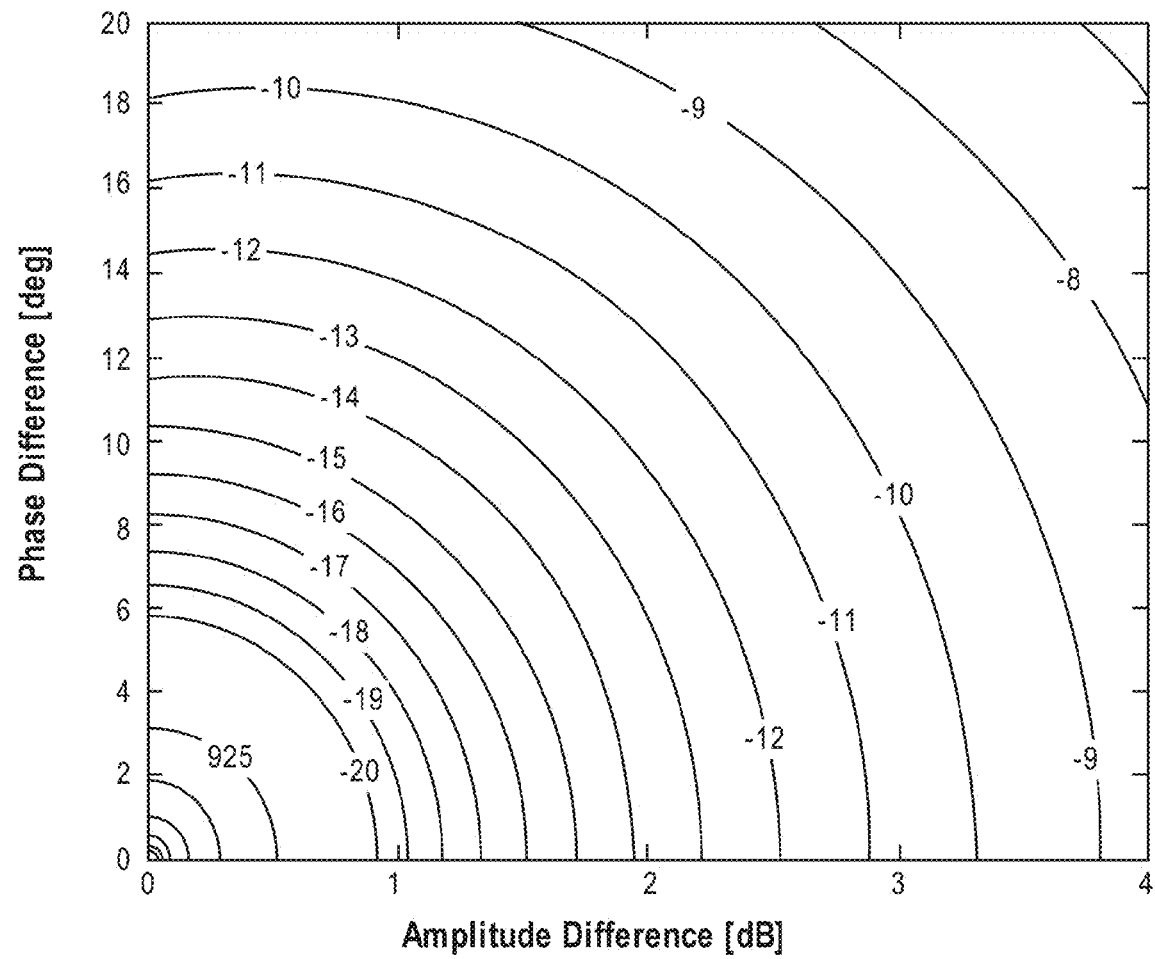
Figure 9C:
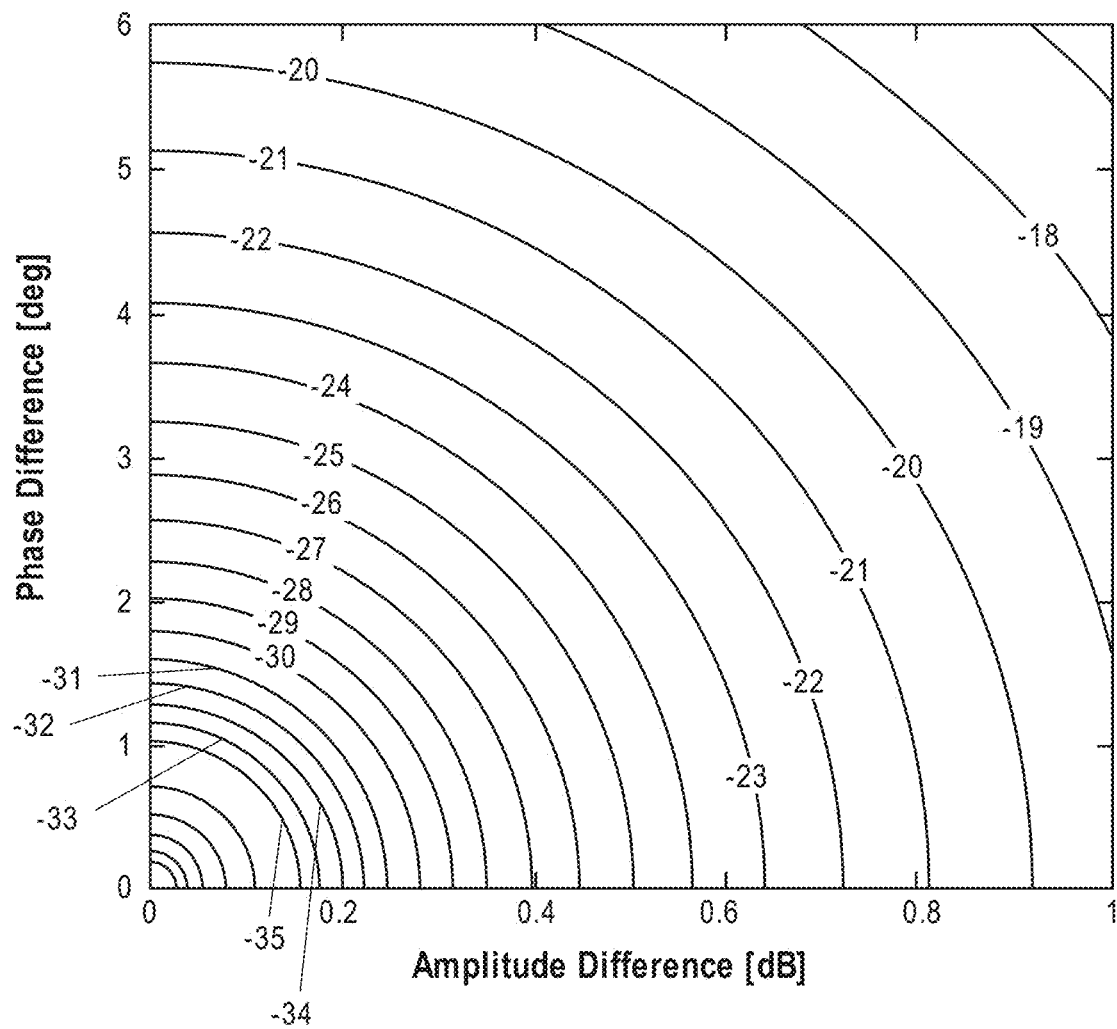
Figure 9D:
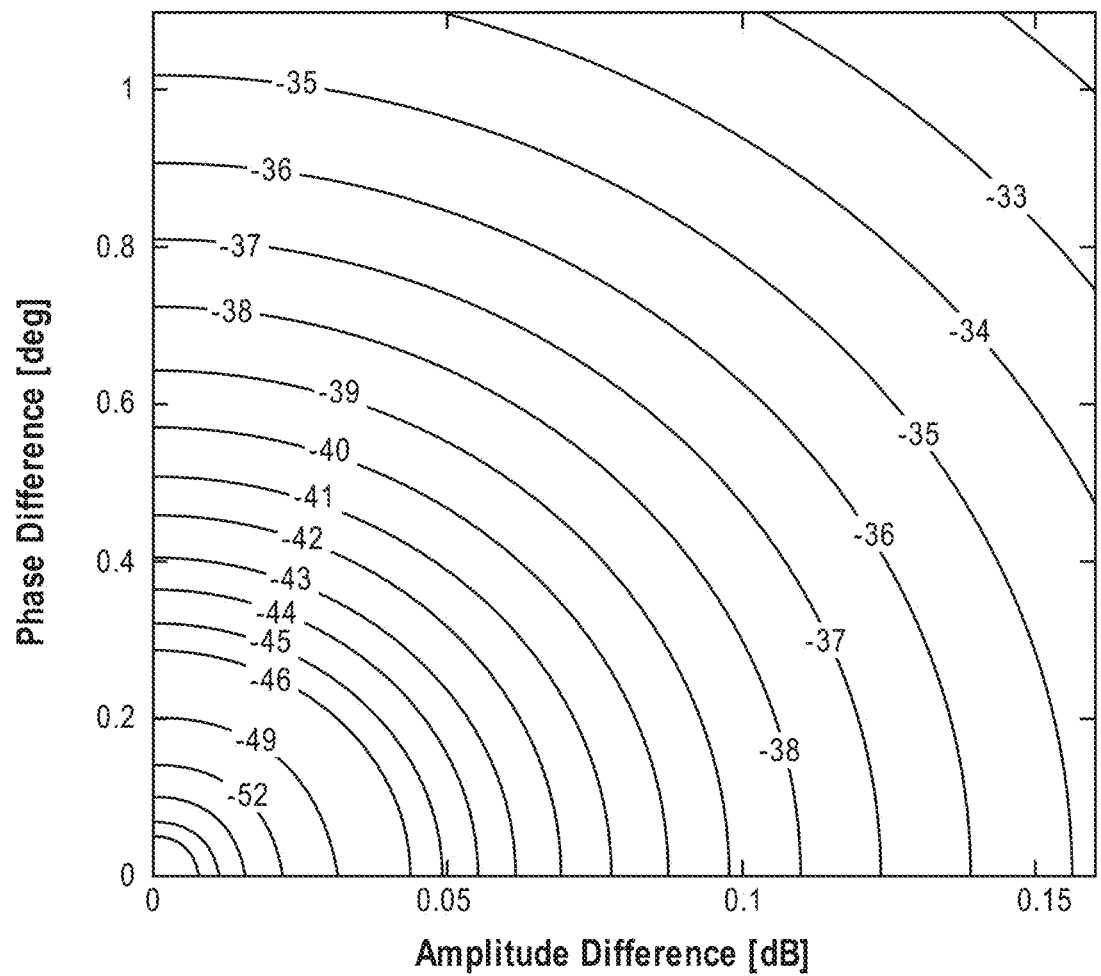

FIGS. 8A and 8B illustrate the measured data with respect to both magnitude and phase across the receive band. The plots define the channel response estimate for the channel between the transmitter and the receiver. In FIG. 8A, a best-fit curve shown as the continuous line curve for the magnitude of the samples of the received signal (e.g., the Rx signal 149). The samples are illustrated as circles in the curve in FIG. 8A. Likewise, in FIG. 8B, a best-fit curve shown as the continuous line curve for the phase of the samples of the received signal (e.g., the Rx signal 149). The samples are illustrated as circles in the curve in FIG. 8B.

Further elements shown in FIG. 5A enable the generation of a cancellation signal which is inverted and added at an adder 135 to the Rx signal 131 to cancel the residual transmitter noise to obtain a desired signal 134 which is then provided to further components of the receiver for demodulation and further baseband processing. An Infinite Impulse Response (IIR) filter 146 generates an IIR response for each of the Rx signal 131 and the Rx signal 149 and periodically updates this response during the operation of the system 130 in order to properly filter the interference seen in the Rx signal 149 with respect to magnitude and phase across the reception band. Generation of the coefficients of the IIR filter 146, which has p zeroes and q poles, p and q being integers, is done in conjunction with a least-squares estimator 147 which attempts to provide the best fit of the IIR response to the measured response of the system 130 over the receive band.

The Infinite Impulse Response Filter transfer function in the z-domain is represented by:

$$G(z)=(a_0+a_1z^{-1}+ \ldots +a_pz^{-p})/(1+b_1z^{-1}+ \ldots +b_qz^{-q}) \qquad (1)$$

The Equivalent IIR filter transfer function in the frequency domain is represented by:

$$G(e^{jw})=(a_0+a_1(\cos \omega - j \sin \omega)+ \ldots +a_p(\cos p\omega - j \sin p\omega))/(1+b_1(\cos \omega - j \sin \omega)+ \ldots +b_q(\cos q\omega - j \sin q\omega)) \qquad (2)$$

The IIR transfer filter can also be represented by:

$$G(e^{jw})=N(\omega)/D(\omega)=(\alpha(\omega)+j\beta(\omega))/(\sigma(\omega)+j\tau(\omega)) \qquad (3)$$

If we set $a_k = a_k^r + j a_k^i$ and $b_k = b_k^r + j b_k^j$ and we represent the desired Transfer Function of the IIR filter 146 to be $F(e^{j\omega})$ then, $$F(e^{j\omega})=R(e^{j\omega})+jI(e^{j\omega}) \qquad (4)$$

If the Error between the desired transfer function and the actual transfer function is represented by $\xi(\omega)$ Then, $$\xi(\omega)=F(\omega)-G(\omega)=F(\omega)-N(\omega)/D(\omega) \qquad (5)$$

and $$\xi(\omega)D(\omega)=F(\omega)D(\omega)-N(\omega) \qquad (6)$$

Further, $$\alpha(\omega)=a_0^r+(a_1^r \cos \omega + a_1^j \sin \omega)+ \ldots +(a_p^r \cos p\omega + a_p^j \sin p\omega) \qquad (6)$$

$$\beta(\omega)=a_0^j+(a_1^j \cos \omega - a_1^r \sin \omega)+ \ldots +(a_p^r \cos p\omega - a_p^r \sin p\omega) \qquad (7)$$

$$\sigma(\omega)=1+(b_1^r \cos \omega + b_1^j \sin \omega)+ \ldots +(b_q^r \cos q\omega + b_q^j \sin q\omega) \qquad (8)$$

$$\tau(\omega)=(b_1^j \cos \omega - b_1^r \sin \omega)+ \ldots +(b_q^j \cos q\omega - b_q^r \sin q\omega) \qquad (9)$$

It further follows that $D\xi=(R+jI)(\sigma+j\tau)-(\alpha+j\beta) \qquad (10)$ or, $$D\xi=R\sigma-I\tau+j(I\sigma+R\tau)-\alpha-j\beta \qquad (11)$$

or $$k \qquad (13)$$

$$D\xi = (R\sigma - I\tau - \alpha) + j(I\sigma + R\tau - \beta) = A(\omega) + jB(\omega)$$

At discrete angular frequencies the magnitude squared of $D\xi$ is then $$|D(\omega_k)\xi(\omega_k)|^2 = A^2(\omega_k)+B^2(\omega_k) \qquad (14)$$

The total error E is the error obtained from summing the errors at a set of m discrete frequencies.

$$E = \sum_{k=0}^{m} |D(\omega_k)\xi(\omega_k)|^2 = \sum_{k=0}^{m} [A^2(\omega_k)+B^2(\omega_k)] \qquad (15)$$

Thus, $$E = \sum_{k=0}^{m} [(R_k\sigma_k - I_k\tau_k - \alpha_k)^2 + (I_k\sigma_k + R_k\tau_k - \beta_k)^2] \qquad (16)$$

If the partial derivative of E with respect to $a_i^r$ is taken, the error is minimized if this derivative is set to 0.

$$\frac{\partial E}{\partial a_i^r} = \sum_{k=0}^{m} \left[ -2(r_k\sigma_k - I_k\tau_k - \alpha_k)\frac{\partial \alpha_k}{\partial a_i^r} - 2(I_k\sigma_k + R_k\tau_k - \beta_k)\frac{\partial \beta_k}{\partial a_i^r} \right] \quad (17)$$

resulting in Equation (18) below:

$$\frac{\partial E}{\partial a_i^r} = \quad (18)$$

$$0 = \sum_{k=0}^{m} [R_k\sigma_k - I_k\tau_k - \alpha_k)\cos(i\omega_k) - (I_k\sigma_k + R_k\tau_k - \beta_k)\sin(i\omega_k)]$$

Similarly, if the partial derivative of the Error with respect to $\alpha_i^j$, $b_i^r$, and $b_i^j$ are taken the following equations (19), (20), and (21) respectively result.

$$\frac{\partial E}{\partial a_i^j} = \quad (19)$$

$$0 = \sum^{m} [-(R_k\sigma_k - I_k\tau_k - \alpha_k)\sin(i\omega_k) - (I_k\sigma_k + R_k\tau_k - \beta_k)\cos(i\omega_k)]$$

$$\frac{\partial E}{\partial b_i^r} = 0 = \sum_{k=0}^{m} [(R_k\sigma_k - I_k\tau_k - \alpha_k)(R_k\cos(i\omega_k)) + I_k\sin(i\omega_k)) + \quad (20)$$

$$(I_k\sigma_k + R_k\tau_k - \beta_k)(I_k\cos(i\omega_k) - R_k\sin(i\omega_k))] \text{ and}$$

$$\frac{\partial E}{\partial b_i^j} = 0 = \sum_{k=0}^{m} [(R_k\sigma_k - I_k\tau_k - \alpha_k)(R_k\sin(i\omega_k) - I_k\cos(i\omega_k)) + \quad (21)$$

$$(I_k\sigma_k + R_k\tau_k - \beta_k)(I_k\sin(i\omega_k) + R_k\cos(i\omega_k))]$$

Using known matrix techniques for solving simultaneous equations the values of $a_i$ and $b_j$ for the IIR filter 146 are obtained which minimize the error between an output of the IIR filter 146 and the measured self-interference channel characterization. Advantageously, these calculations are done periodically, dependent on the operational state of the system 130, in order to update the IIR filter 146 parameters as the self-interference channel changes.

A least mean squares curve fitting algorithm is applied by the least squares estimator 147 in order to find $a_n$ and $b_n$ such that E, the sum of the absolute values of the squares of the difference between the response of the IIR filter 146 and the measured self-interference channel estimate, is minimized.

$$E = \Sigma \|H(e^{j\omega}_k) - H_k\|^2, \text{ for all values of } k(0-k) \quad (22)$$

Best fit of the IIR filter 146 values for $a_i$ and $b_i$ when equations (19), (20), (21) and (22) above are minimized by the processor in the controller 121. In an exemplary operational case, where p=q=12, fifty simultaneous equations result, 26 for zeroes and 24 for poles. These multiple equations can be expressed in terms of a matrix which can be solved using known techniques. This same procedure can then be followed for other possible combinations of numbers of poles and zeros in order to find the number of poles and zeros that minimize the error.

As real world channels between transmitter and receiver in the system 98 and the system 130 within a frequency division duplex transceiver are subject to constant change during the operation of the system 130 and the system 98 and in certain self-interference channel scenarios the actual channel response can exhibit scenarios where there are large losses at one or more points across the receive band and/or one or more large gains across the receive band, the actual number of poles and/or zeroes of the IIR filter 146 can be changed during the operation to provide the best fit between the actual self-interference channel and the characterized self-interference channel. As discussed, dependent on the state of the self-interference channel during an instance of the operation of the system 130, some value(s) or one or more ai and/or bi may be zero which may be optimal and represent the best fit for the given parameters of the IIR filter 146 for the given state of the self-interference channel. The frequency division duplex transceiver can be located in a base station (e.g., a communications substation), a handset (e.g., a mobile handset), a satellite, etc.

Least-Squares Algorithm.

As described in the equations above for solving coefficients for a given filter structure of the IIR filter 146. The equations around how the best number of poles and zeros is algorithmically determined by the following steps:

1. Start with the maximum number of poles and zeros.
2. Compute the filter coefficients of the filter 146 that give the least-squares approximation to the measured filter coefficients (using the equations above).
3. Compute a residual error for this number of poles and zeros. (E from above).
4. Check that the poles are all within a radius of less than 0.99. This ensures that the filter is stable and can be realized easily (i.e., not marginally stable or unstable).
5. Repeat steps 2-4 with one less number of zeros each time until the number of zeros is 0 (i.e., only poles). Out of all of these filters, pick the one with the lowest residual error.
6. Set the number of zeros to maximum again. Repeat steps 2-5 with one less number of poles each time until the number of poles is 0 (i.e., an FIR filter). Out of all of these filters, pick the one with the lowest residual error.

Further to the stability of the IIR filter 146, the IIR filter 146 is stable if all of its poles lie within the unit circle (i.e., their magnitude is less than 1). This can be understood by looking at the time-domain representation of a pole zp. In the time domain, a pole at zp of the IIR filter 146 has the form h[n]=sum(zp$^n$). If |zp|<1, then |zp$^n$|–>0 for large n, and the series converges. If |zp|>=1, then the series diverges. The placement of zeros does not affect stability (i.e., when the IIR filter 146 has zeros outside the unit circle, the IIR filter 146 is stable), but it does affect the response of the IIR filter 146.

For a given number of poles (q) and zeros (p) of the IIR filter 146, there are $2^{(p+1+q)}$ equations. This is because the numerator has one more coefficient than the denominator and all of the coefficients are complex.

Implementations of the disclosure yielded good results for values of p=q=12. It is recognized by those skilled in the art the higher the values of p and q, the more dynamic features can be matched correctly by the IIR filter 146. Thus, the system 130 may be algorithmically adapted or tuned for a given application of the disclosure.

The output of IIR filter 146 may be fed directly to position 135 along with Rx signal 131, which results in removing interference for Rx signal 131, to create output 134 to receiver. The output of filter 146 is an equalized version of the interference present on Rx signal 131 input. The direct use of the IIR filter 146 output with no tone comparison and associated components is preferably done when there is minimal concern with regard to drift or gain control updates of Rx signal 131.

With continued reference to FIG. 5A, it should be understood that at times automatic gain control and temperature may cause variations between the two paths (between Rx signal 131 path and Rx signal 149 path) that occur on a faster timescale than the measurement of the channel and calculation of new IIR coefficients. Therefore, Fast Fourier transform (FFT) block 133 and FFT block 140 may be used to measure the magnitude and phase of a fixed tone, such as the second fixed tone, on each path. The magnitude and phase are then compared at comparison block 136, and the results are fed into integrators in order to make adjustments so that there is no DC offset between the two paths in both magnitude and phase. The outputs of these integrators (e.g., phase loop filter 141 and gain loop filter 144) are then used to adjust the IIR filter 146 output so that the output of phase shifter 143 has the same magnitude and phase as the receive signal input (Rx signal 131). The resulting signals are then subtracted at 135, which removes interference from Rx signal 131 (the received signal). As shown in FIG. 5A, the output of the Variable Phase Shift element 143 is input to a complex multiplier 166 which multiplies the output of the variable phase shift element 143 by a complex multiplication factor, as is further described below, to shift the output of the Variable Phase Shift element 143 with respect to both amplitude and phase. This is done before a comparison is made at comparator 135 in order to scale the signal output by the Variable Phase Shift element 143 to optimize the effect of the scaled compensation signal output by the complex multiplier 166. Here, the scaling is done with respect to both amplitude and phase using a complex scaling factor. The resulting signals are then subtracted at the adder 135, which removes interference from Rx signal 131 (the received signal). Various aspects of this disclosure may include a system where just the fixed tone is used and not the swept tones or the IIR filter. Vice versa, just the IIR filter 146 and the swept tone may be used and the fixed tone may not be used. Finally, both may be combined where the IIR filter 146, the fixed tone, and the swept tone are all used.

Figure 5B:
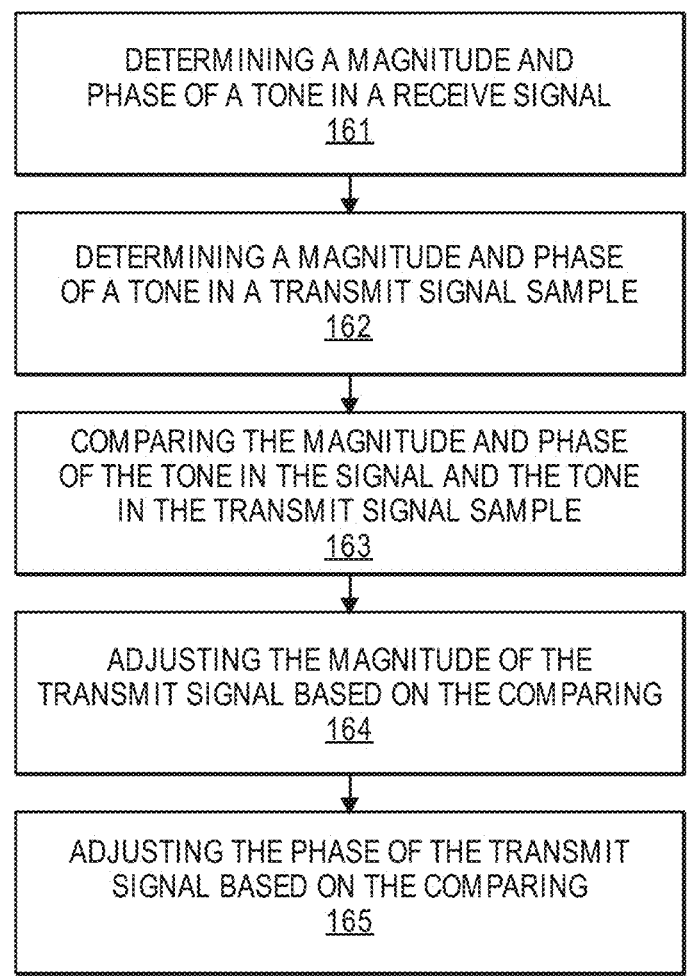
FIG. 5B illustrates an exemplary method that accounts for variations in the received signal according to an aspect of the disclosure.
Figure 5C:
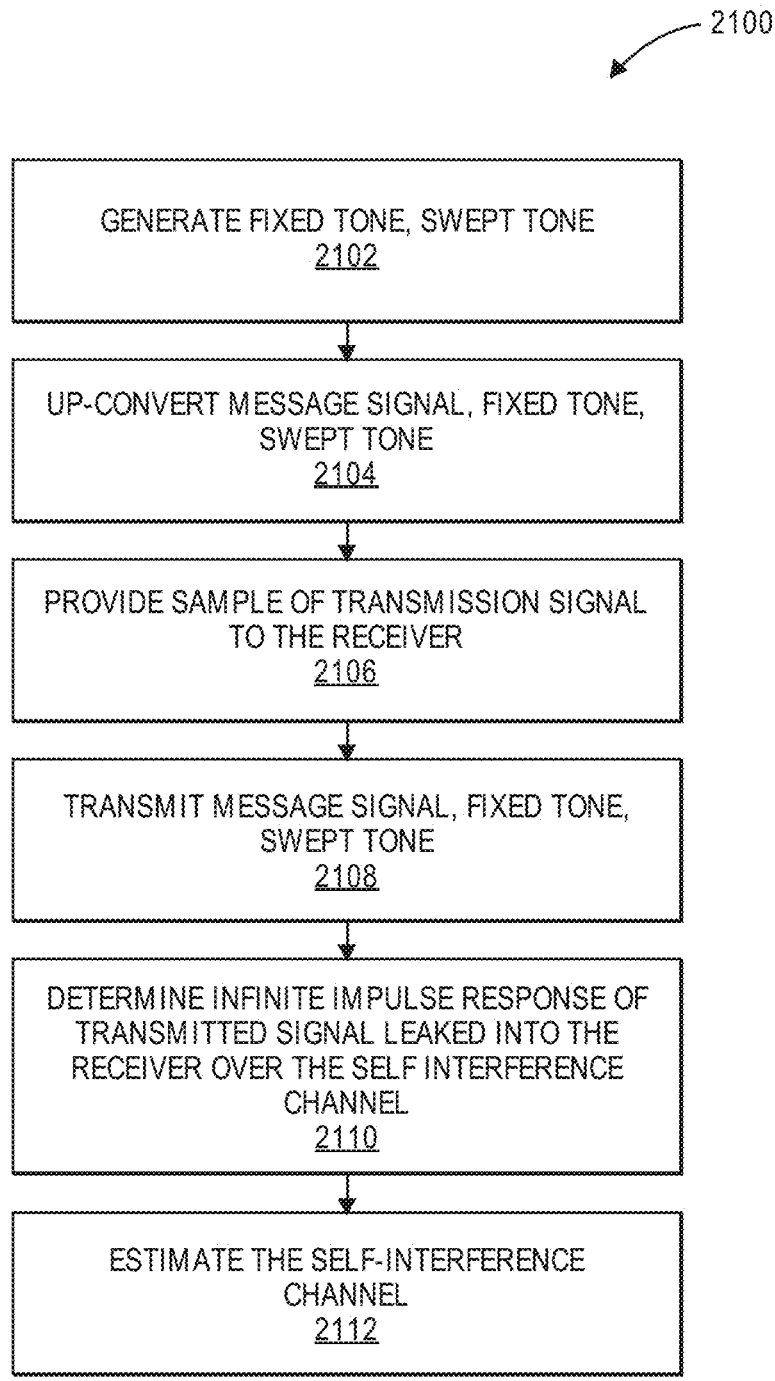
FIG. 5C illustrates a self-interference channel estimation method in accordance with an aspect of this disclosure.
Figure 5D:
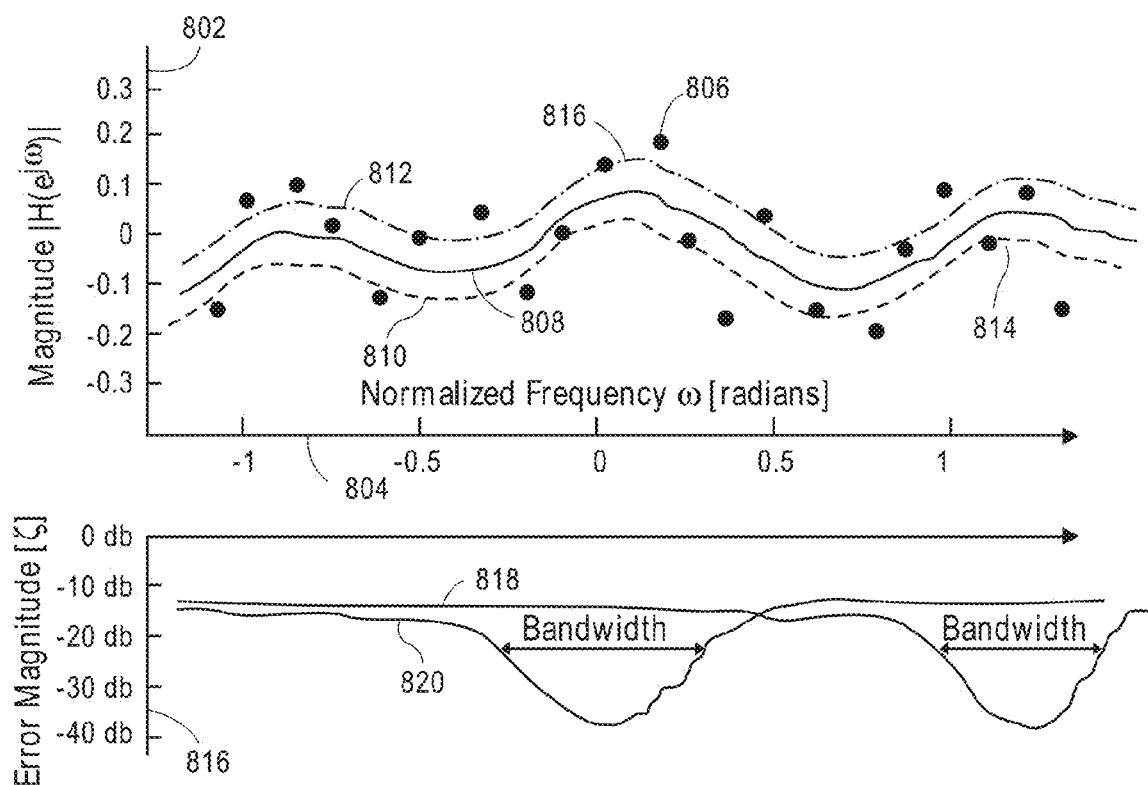
FIG. 5D illustrates the operation of the complex multiplier in accordance with an aspect of this disclosure.

FIG. 5D further illustrates the operation of the complex multiplier 166. Here, a representation of a magnitude on an axis 802 of $H(e^{j\omega})$ is shown for illustrative purposes. This shows another example of measured amplitude circuit response as previously illustrated in FIGS. 8A and 8B. The magnitude scale on the axis 802 is in dB and a frequency scale on an axis 804 is in normalized angular frequency $2\pi f$. A similar representation as previously also shown in FIGS. 8A and 8B would apply for the phase of $H(e^{j\omega})$ but is not shown as the processes described below for both magnitude and phase are similar.

A best fit curve is generated using Least Square functions in the least-squares estimator 147 of FIG. 5A. The best fit curve is as a curve 808. Two other representations of the best fit curve are shown as curves 810 and 812. The curves 810 and 812 have exactly the same shape as the best fit curve 808 with the exception that for the curve 812, the entirety of the curve 812 is translated to pass directly through a measurement point 816, which has been made at the normalized frequency of zero, i.e., at a middle of the band of interest. The curve 810 has been translated down to pass directly through a point 814, which occurs at the frequency of the fixed tone used for automatic gain control. Here, as further illustrated in FIG. 5D, if the curve 808 anchored at the measurement point 816 measured at the center of the band of interest for a given application of the disclosure, the error magnitude is illustratively shown by an error magnitude curve 820.

Illustratively, outside the region in the center of a curve 820 indicating an error magnitude, the error magnitude is on the order of −15 db, while at the center of the curve 820, the error magnitude is on the order of −35 db. Thus, for example, if the system 98 and the system 130 were deployed in a narrowband air interface, error performance is illustratively better in the center of the band as is favored by the spectral shape of the signal. The bandwidth of the improved region as well as the actual shape of the error magnitude curve is dependent on how well the infinite impulse response of the IIR filter 146 of FIG. 5A matches the actual circuit response of the self-interference channel formed between the transmitter 100 and the receiver 500 of a frequency division duplex transceiver.

Alternatively, if the curve 808 is anchored on a fixed tone 814, the error magnitude 818 is as is illustratively also shown in FIG. 5D. Here, the error magnitude 818 shows improved error performance around the fixed tone 814 frequency. Again, outside the improved error performance region, the error magnitude is on the order of −15 db while the error performance can be improved to be on the order of −35 db. Further, the bandwidth of the improved region as well as the actual shape of the error magnitude curve is dependent on how well the IIR filter 146 generated matches the actual circuit response of the self-interference channel. Thus, as can be seen, the actual anchor point which may be optimal for a given application may not be either point, and may be optimal if the curve 808 is anchored at another point. A complex correction multiplier is generated according to the relationship $$H_0/H(e^{j\omega_0}) \times H(e^{j\omega_f})/H_f \quad (23)$$

Here, $H_0$ is actual measured value at the center of the band of interest at a normalized angular frequency of $\omega_0$; $H_f$ is the actual measured value at a given angular frequency $\omega_f$; $H(e^{j\omega_0})$ is the IIR filter 146 response at the center of the band of interest and $H(e^{j\omega_f})$ is the IIR filter 146 response at a given frequency.

This correction multiplier is a complex multiplier (similar to the complex multiplier 125) accounts for both amplitude and phase. Not shown in FIG. 5A, the correction multiplier is computed in the controller 121 or in the alternative, in another computing element (not shown in FIG. 5A).

The scaling factor was chosen in this manner to offset the effects of the feedback loop formed by the FFT 140, the comparison block 136, the phase loop filter 141, and the gain loop filter 144 that uses the fixed tone 814. The feedback loop ensures that after the multiplier 145 and the phase shifter 143 (also referred to as the phase shift element 143), the magnitude of the fixed tone 814 is the same on both paths at the frequency of the tone. This complex scaling factor introduced by the complex multiplier 166 shifts that result from being true around the fixed tone 814 to instead be focused on the center of the band of interest.

Computation of the scaling factor is periodically done during the operation of the system 130 and the system 98 as the circuit response is re-determined using self-interference channel characterization swept tone sweeps, re-computation of the channel characterization and re-computation of the least square circuit response at the least squares estimator 147.

FIG. 5B illustrates an exemplary method that accounts for variations in the received signal (Rx signal 131) and the output of the IIR filter 146, which is based on the sample of the transmit signal (Rx signal 149). At block 161, a magnitude and a phase of a tone in a receive signal (e.g., Rx signal 131) is determined. The magnitude and phase may be determined based on the use of a Fast Fourier Transform (FFT) or the like. As illustrated in FIG. 5A, FFT 133 may be used to determine the magnitude and phase of a fixed tone in Rx signal 131. At block 162, a magnitude and a phase of a tone of a sampled transmit signal (e.g., Rx signal 149) is determined. The sampled transmit signal may have been through an IIR filter, such as IIR filter 146. For example, FFT 140 of FIG. 5A may be used to determine the magnitude and phase of the fixed tone of the sampled transmit signal. At block 163, the magnitude and phase of the tone of the receive signal and the tone of the sampled transmit signal may be compared. For example, comparison block 136 of FIG. 5A may compare the magnitude and phase of the tones.

With continued reference to FIG. 5B, at block 164, the magnitude of the sampled transmit signal is adjusted based on the comparison of block 163. For example, with reference to FIG. 5A, gain loop filter 144 may be fed results of the comparison block 136 along segment 137. The output of gain loop filter 144 is used to adjust IIR filter 146 output (which is based on the sampled transmit signal) so that the output of the phase shifter 143 has the appropriate magnitude to cancel interference in Rx signal 131 (the receive signal). At block 165, the phase of the sampled transmit signal is adjusted based on the comparison of block 163. For example, with reference to FIG. 5A, phase loop filter 141 may be fed results of the comparison block 136 along segment 138. The output of phase loop filter 141 is used to adjust IIR filter 146 output (which is based on the sampled transmit signal) so that the output of the phase shifter 143 has the appropriate phase to cancel interference in Rx signal 131 (the receive signal).

In some situations digital filters, such as FIR or IIR operating at baseband on the digital samples, may be used to remove noise before the "clean" sample of output 134. In other situations RF filters may be removed as may be useful in some software-defined operational modes.

The final stage of the digital self-interference residual cancellation is a set of feedback loops that keep the system stable between the equalizations mentioned above. The loops, such as the loop with phase loop filter 141 and the loop with gain loop filter 144, regulate the magnitude and phase of the sampled signal so that when the Rx signal 131 and Rx signal 149 are subtracted, the power in the fixed tone (e.g., the second fixed tone) used for automatic gain control (AGC) is minimized.

For additional perspective, a discussion of automatic gain control (AGC) as associated with digital self-interference residual cancellation is provided below. Since the two receivers have independent AGC loops, there are conceivable situations where the AGC on one receiver will change suddenly. The feedback loops, such as the loop with phase loop filter 141 and the loop with gain loop filter 144, in the system that try to match the magnitude and phase of a second fixed tone between the two paths are designed to be fast enough that they can compensate for the sudden change in gain that would result from an AGC update. Note that in this case, each receiver is assumed to have independent AGC control, so no coordination is assumed between them. This allows each receiver to compensate for sudden power changes at its input. It is expected that Rx signal 149 AGC will remain relatively stable since it is measuring a known signal sampled from a power amplifier output (e.g., power amplifier 104 of FIG. 1B).

As discussed herein, the compensated signal based on the output of block 132 and block 143 of FIG. 5A of the two feedback loops is subtracted from the receive signal (Rx signal 131). The result of this subtraction is the output of the noise canceller and contains output 134 to receiver in which transmit residual noise interference is greatly reduced in power. Here, with regard to the output 134, the transmit interference in the receive band has been cancelled or attenuated by some amount.

Controller 121 may exert control over the elements of system 130. Illustratively, in implementations of system 130, coefficients and other data that apply in a given mode of operation of system 130 can be calibrated and stored for invocation as needed throughout the operation of system 130 for given modes of operation during given instants of operation of system 130. Thus, multi-band, multi-radio access technology operational modes can be changed by controller 121 as needed. This enables, for example, high security operation where the mode of operation of the system including bands can be changed on the fly.

Self-Interference Channel Estimation Example

FIG. 5C illustrates a flowchart illustrating operations of a method 2100 for characterizing a self-interference channel of a frequency division duplex transceiver including the transmitter 100 and a receiver 500. The method 2100 may begin in an operation 2102 in which the fixed tone and the swept tone are generated at the transmitter 100 of the frequency division duplex transceiver. The fixed tone and the swept tone may be digitally generated by the controller 121 and then converted into corresponding analog signals by a digital to analog converter at the transmitter 100. The fixed tone may be generated to have an analog frequency above an upper edge of the reception band of the receiver 500. The swept tone may be generated to have a frequency ranging from a lower edge of the reception band to an upper edge of the reception band. The swept tone may be generated periodically at discretely spaced frequencies within the reception band. The fixed tone and the swept tone may be injected to a message signal to be transmitted by the transmitter 100.

In an operation 2104, the controller 121 of the transmitter 100 up-converts the fixed tone, the swept tone and the message signal to radio-frequency corresponding to the transmission band of the transmitter 100. The up-converted signal is the transmission signal.

In an operation 2106, a sample of the transmission signal is provided to the receiver 500, collocated with the transmitter 100. The sample provided to the receiver 500 is free of external noise and degradation due to the self-interference channel formed between the transmitter 100 and the receiver 500.

In an operation 2108, the transmission signal including the message signal, the fixed tone, and the swept tone that changes frequency from below an upper edge to above a lower edge of the reception band of the receiver 500 is transmitted. The fixed tone is used for the fast feedback loop used for AGC and temperature compensation.

In an operation 2110, at the IIR filter 146 of the receiver 500, an infinite impulse response of the self-interference channel based upon a reception of the swept tone swept at each frequency in the reception band is determined using the equations 1-22 above.

In an operation 2112, the self-interference channel between the transmitter 100 and the receiver 500 is estimated based upon the coefficients of the IIR filter 146, as also discussed in the equations 1-22 above. The self-interference is known from the transmit sample that is fed into the system as the signal 149. The purpose of the IIR filter 146 is to equalize the frequency response that has been applied to signal 131 and signal 149 so that they can be subtracted with an equivalent frequency response, leading to broadband cancellation.

Tone Based IQ Compensation Example

Figure 5E:
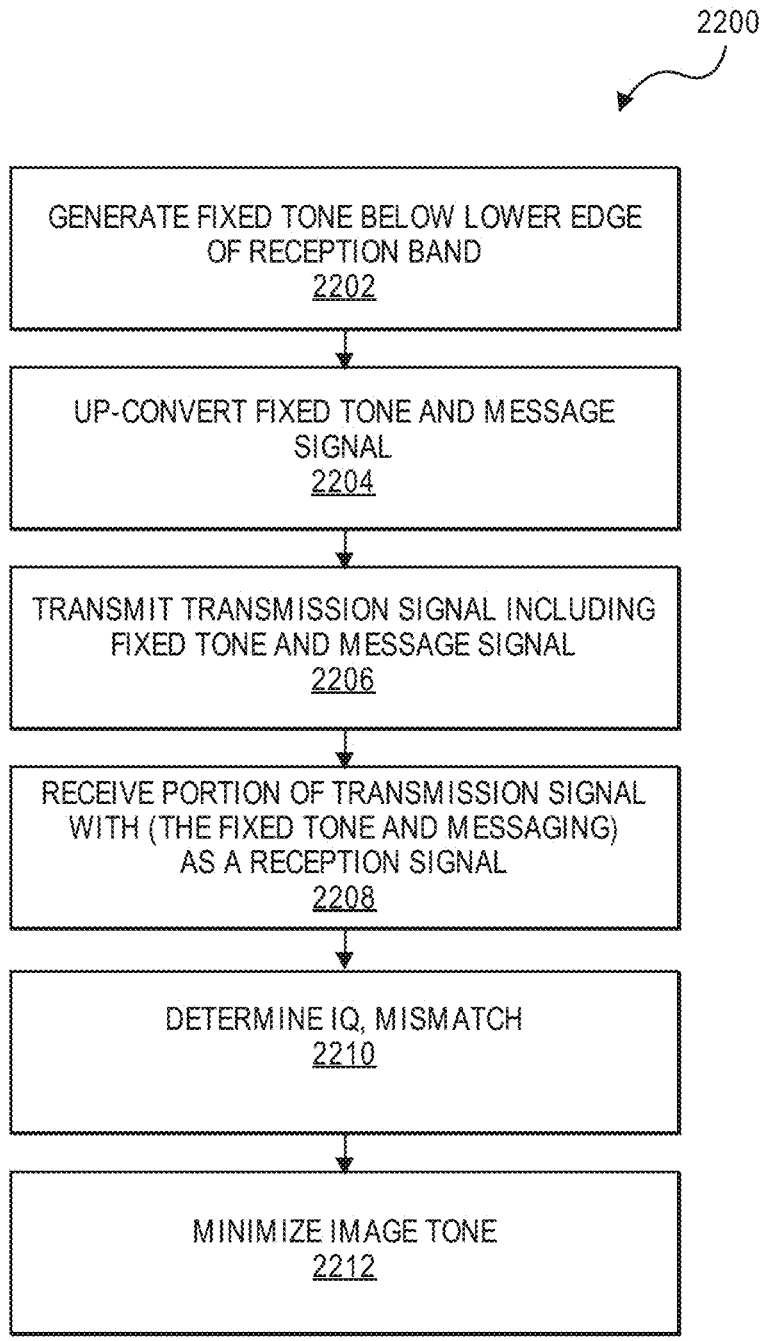
FIG. 5E illustrates a method for in-phase and quadrature phase (IQ) compensation in a frequency division duplex transceiver in accordance with an aspect of this disclosure.

Referring to FIG. 5E, a method 2200 for in-phase and quadrature phase (IQ) compensation in a frequency division duplex transceiver including the transmitter 100 and the receiver 500 are illustrated. The method 2200 may begin in an operation 2202 in which a fixed tone at a frequency lower than a lower edge of the reception band may be generated. The generation of the lower edge fixed tone may be carried out digitally by the controller 121 in the transmitter 100 prior to any transmission of a message signal by the transmitter 100.

In an operation 2204, the fixed tone and the message signal may be up-converted for transmission as a transmission signal in the radio frequency domain. The up-conversion may be to a frequency of transmission in the transmission band of the transmitter 100.

In an operation 2206, the transmission signal including the fixed tone and the message signal may be transmitted by the transmitter 100.

In an operation 2208, the receiver 500 may receive a portion of the transmission signal including the fixed tone and the message signal as a reception signal. In one aspect, the reception signal may be down-converted to a lower or intermediate frequency before a processor in the controller 121 may process the reception signal. It will be appreciated that such down-conversion is part of a normal operation of the receiver as other received signals may be down-converted by the receiver 500, in addition to the leaked transmission signal received as the reception signal in the operation 2208.

In an operation 2210, the processor of the receiver 500 may determine a gain mismatch (g) and a phase mismatch ($\phi$) between an in-phase (I) component and a quadrature (Q) phase component of the reception signal by detecting an image tone of the fixed tone in the reception signal.

In an operation 2212, the image tone is minimized to compensate the gain mismatch and the phase mismatch between the I and Q components of the received signal by the processor. The minimization may include computing, at the processor, the FFT 140 of the reception signal (also referred to as the received signal) or forcing to zero a product of a bin corresponding to the fixed tone and a bin corresponding to the image of the fixed tone, outputting, at the processor, to index into the FFT result to obtain the result in a particular bin (corresponding to the frequency of the fixed tone and its image), the FFT 140 by a first constant corresponding to the fixed tone to result in a first product and by a second constant corresponding to the image tone corresponding to a second product, combining, at the processor, the first product and the second product to form an error signal, splitting, at the processor, the error signal into a real error component and an imaginary error component, integrating, at the processor, the real error component and the imaginary error component to force a DC error in the error signal to zero, splitting the reception signal into a real component and an imaginary component, multiplying the real component by a first coefficient and the imaginary component into a second coefficient, adding the imaginary component after the multiplying by the second coefficient to the reception signal, and combining the imaginary component in the reception signal after the adding to the real component after the multiplying by the first coefficient as an input to the FFT 140.

In one aspect, the minimizing may be performed using a feedback loop in the receiver, the feedback loop including the gain loop filter 144 for minimizing the gain mismatch and the phase loop filter 141 for minimizing the phase mismatch. Throughout this disclosure the term "minimizing" or "minimize" may include a scenario where the quantity to be minimized is forced to zero using binning. In another aspect, the minimizing may include determining, at the processor, a matrix E as E=[1 0; $-g \sin \phi$, $g \cos \phi$], determining, at the processor, an inverse E–1 of the matrix E, and applying the inverse E–1 to the received signal for the compensating.

Simulations of system 130 have shown the degree of isolation improvement or interference cancellation that can be obtained with system 130. These results have been verified against actual implementation of the system. The results of these simulations are based on the accuracy of phase and/or amplitude error between the residual error compensation signal and the actual received signal. FIGS. 9A-D illustrate the degree of improvement in isolation which are obtainable for different combinations of amplitude error or phase error. Thus, as is seen, implementations of the system may be optimized for given applications according to isolation needs.

Figure 3:
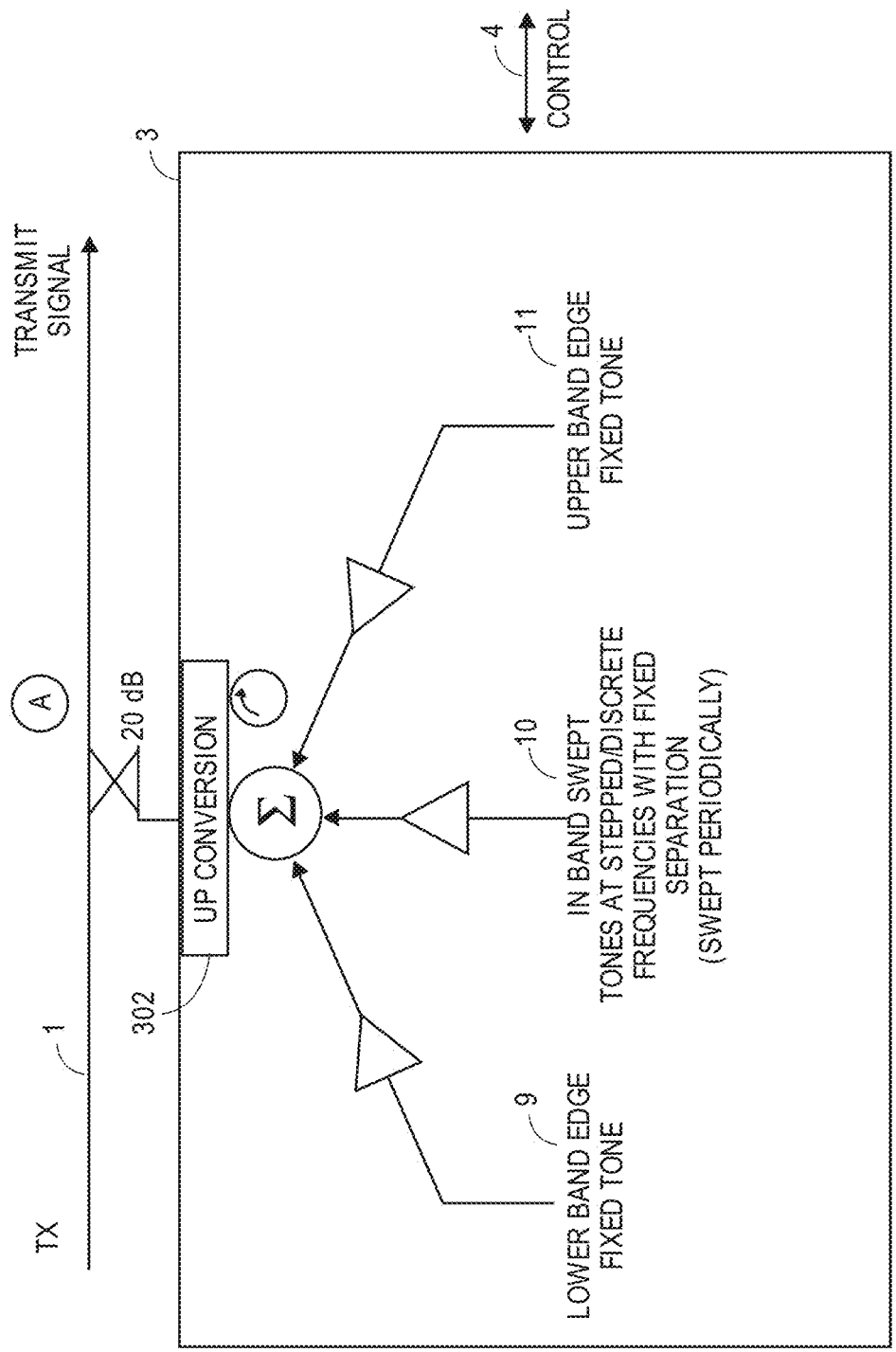
FIG. 3 illustrates a tone generation function used as part of the digital residual interference cancellation loop according to an aspect of this disclosure.

FIG. 3 illustrates a tone generation function used as part of the digital residual interference cancellation loop according to an aspect of this disclosure. Prior to transmission, a lower band edge fixed tone 9, an in band swept tone 10 swept at discrete frequencies, and an upper band edge tone 11 may be combined and up-converted at an up-converter 302.

Figure 4:
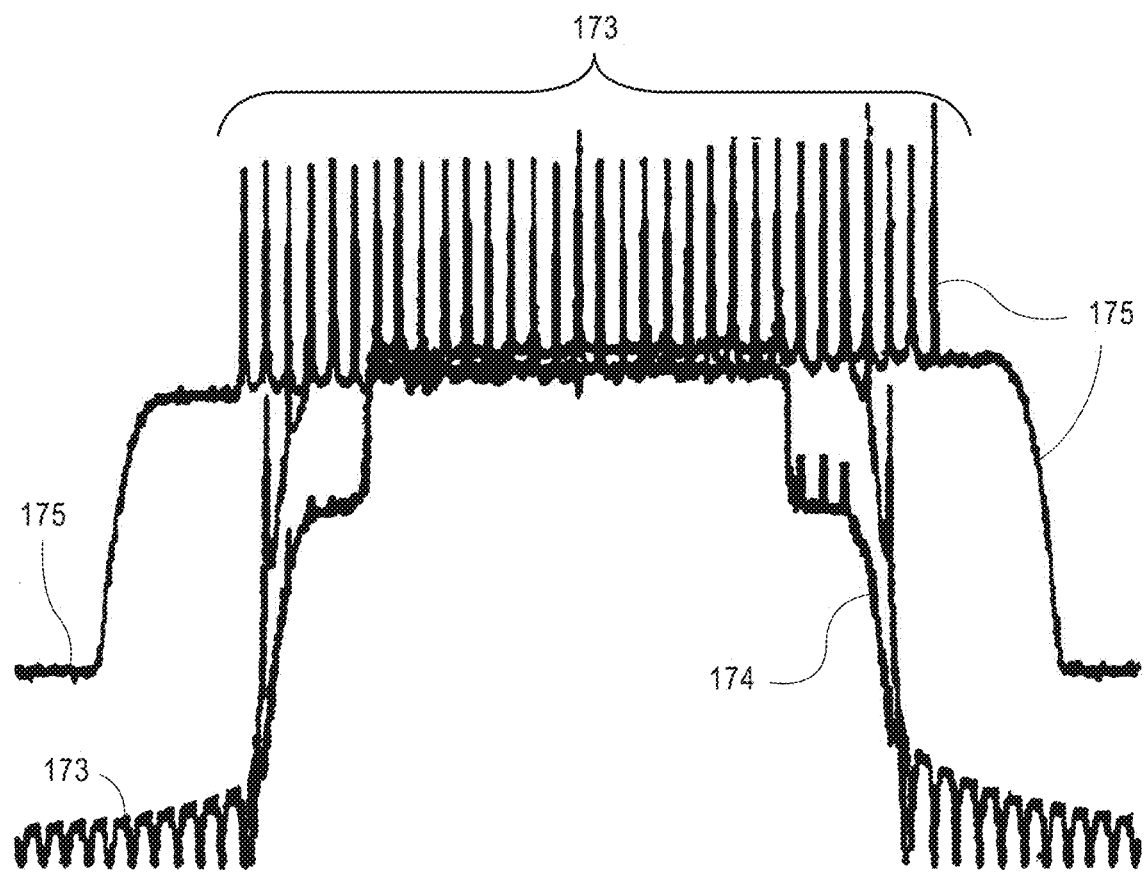
FIG. 4 illustrates positioning of tones overlaid on the receiver signal according to an aspect of this disclosure.
Figure 10:
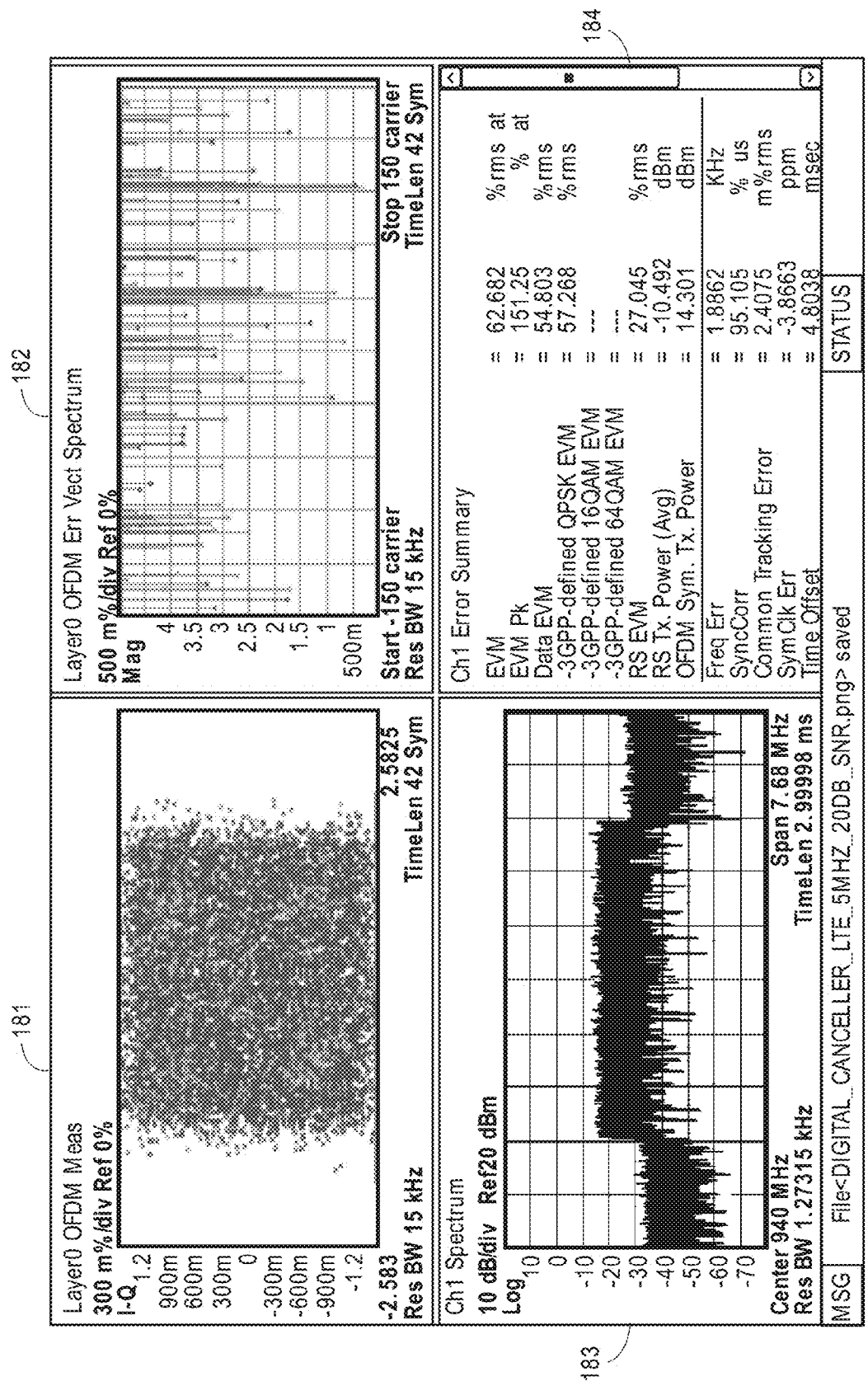
FIG. 10 illustrates data where carrier cancellation has occurred using feed-forward self-interference cancellation but without application of the digital residual interference cancellation, in accordance with an aspect of this disclosure.
Figure 11:
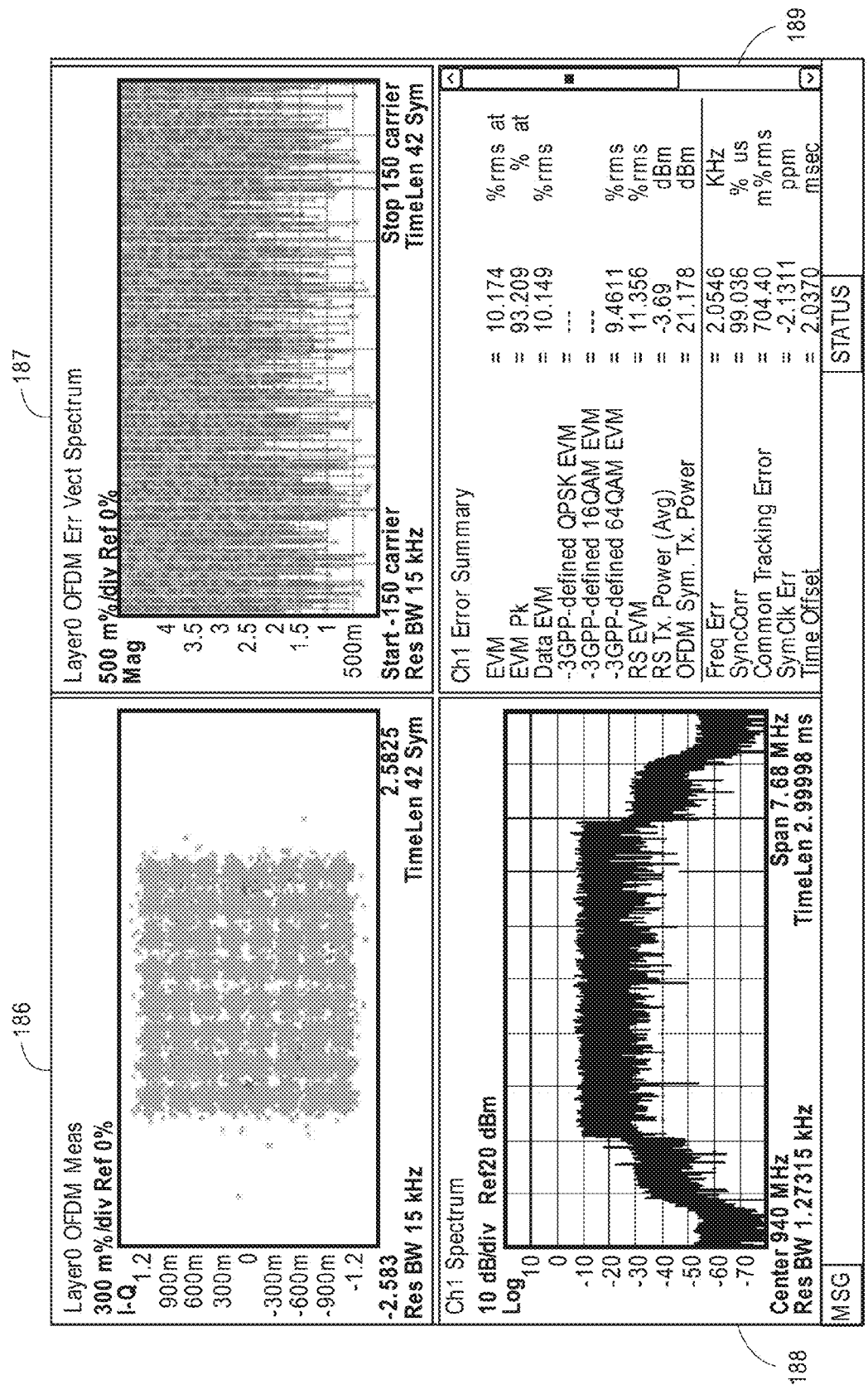
FIG. 11 illustrates operation with both the carrier cancellation and digital interference cancellation loops applied, in accordance with an aspect of this disclosure.

Exemplary results of operation of the canceller are shown in FIGS. 4, 10 and 11. FIG. 4 illustrates Rx signal 149 and Rx signal 131 for an exemplary 5 MHz LTE case. Signal 175 is the received signal (e.g., Rx signal 131) containing a 5 MHz LTE signal, a Tx interference signal that is roughly 20 dB above the thermal noise floor, and the tones used for cancellation. Signal 173 is a low-pass filtered version of the compensated sampled signal (e.g., Rx signal 149 path after the variable phase shift 143 in FIG. 5A). During normal operation, the tones in the Rx channel will not be present unless an equalization operation is occurring. Signal 174 of FIG. 4 shows the output a digital self-interference residual cancellation system (e.g., output 134 of system 130), which illustrates the previously buried LTE signal and the expected 20 dB of interference cancellation to the noise floor of the receiver. The ability to cancel all the way to the thermal floor of the receive means that this digital self-interference residual cancellation system can be used with no degradation of the radio's noise figure. The radio's noise figure is the degradation of the signal to noise ratio of the system. If there is an inability to cancel to the thermal noise floor, the sensitivity would be less than optimal, so that could be described as either lower sensitivity within the radio or a higher system noise figure for the radio.

FIG. 10 shows an operation where some interference cancellation has occurred using feed-forward self-interference cancellation, but without application of the digital self-interference residual cancellation as disclosed herein. Multiple representations of the de-modulated 5 MHz LTE waveform before digital interference cancellation are shown in FIG. 10. In block 181, the signal constellation is shown, while in block 182, OFDM Error Vector Spectrum is shown. At block 183, the spectrum is shown and at block 184 a summary of error elements is shown. Since residual noise has not been cancelled, the constellation is collapsed and the data are unrecoverable.

FIG. 11 shows operation with both the interference cancellation using feed-forward self-interference cancellation and digital self-interference residual cancellation is applied. Here, multiple representations of the de-modulated waveform after digital interference cancellation are shown as in FIG. 10 when digital interference cancellation is not applied. Block 186 of FIG. 11 shows the signal constellation, block 187 shows the OFDM Error Vector Spectrum, block 188 shows the spectrum, and block 189 shows a summary of error elements. The signal is recovered from far beneath the interference. Error vector magnitude is marginally affected due to the presence of the tones, however, this is a temporary condition as channel characterization tones are only swept across the band periodically. As shown, however, even in the presence of channel characterization tones the Error Vector performance is good.

Self-Interference Cancellation Antenna Systems and Methods

Figure 12A:
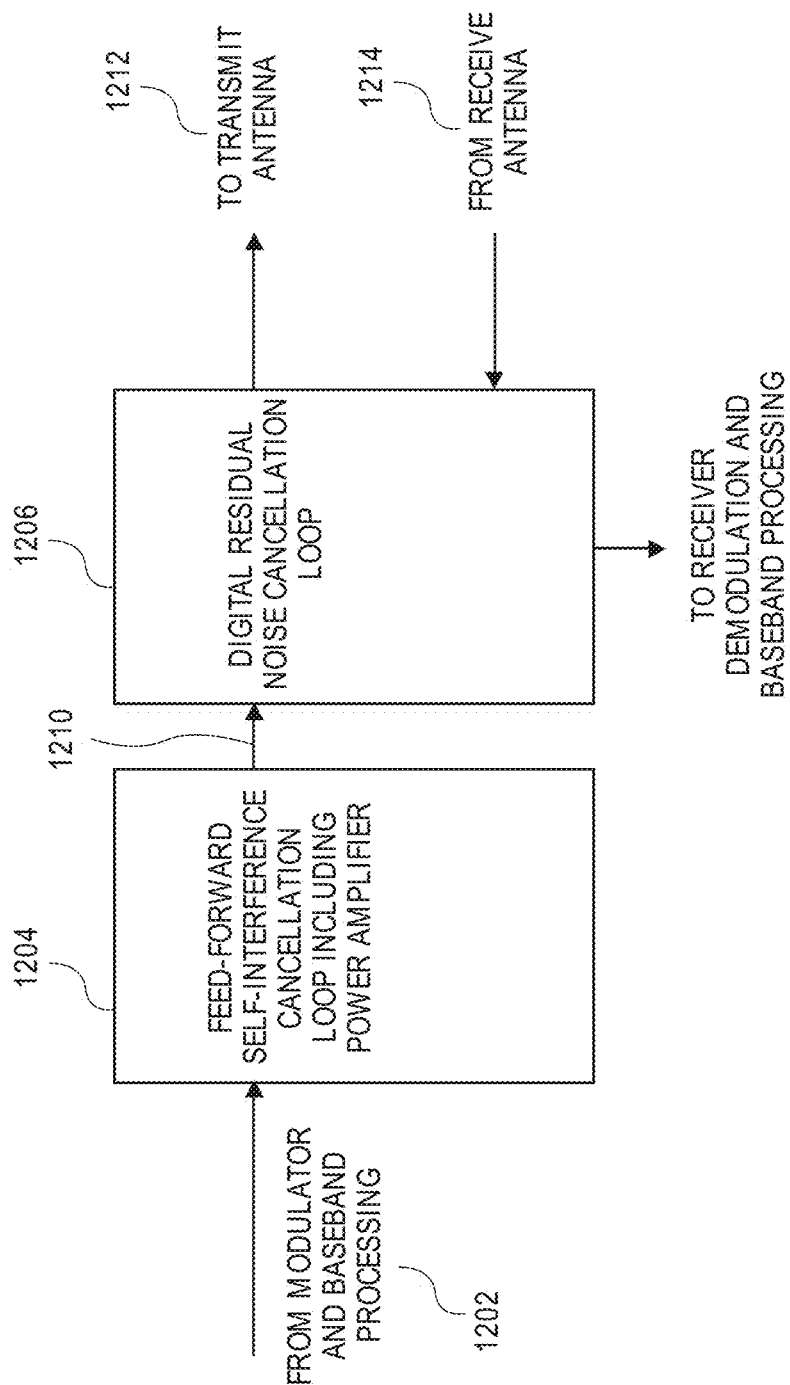
FIG. 12A illustrates a self-interference cancellation system according to an aspect of the disclosure.

FIG. 12A illustrates a self-interference cancellation system according to an aspect of the disclosure. In FIG. 12A, a feed-forward self-interference cancellation loop (FIG. 1A) and a digital residual interference cancellation loop (FIG. 2) are connected in tandem. In an embodiment, the transmit signal 1202 sourced by modulation and baseband processing functions may be input to the feed-forward self-interference cancellation loop 1204. The feed-forward self-interference cancellation loop 1204 may include a power amplifier. In certain embodiments, the high power signal 1210 may include residual noise after carrier cancellation the feed-forward self-interference cancellation loop 1204 and input to the digital residual interference cancellation loop 1206. The high power transmit antenna signal 1212 may either be fed to a transmit antenna or to further isolation mechanisms (as seen in FIGS. 13-16). In some embodiments, the receive signal 1214 may be either sourced by a receive antenna or further isolation mechanisms (e.g., FIGS. 13-16). In the present disclosure, the isolation obtainable using the two cancellation loops, the feed-forward self-interference cancellation loop 1204 and input to the digital residual interference cancellation loop 1206, may be further improved by application of antenna isolation methods.

Figure 12B:
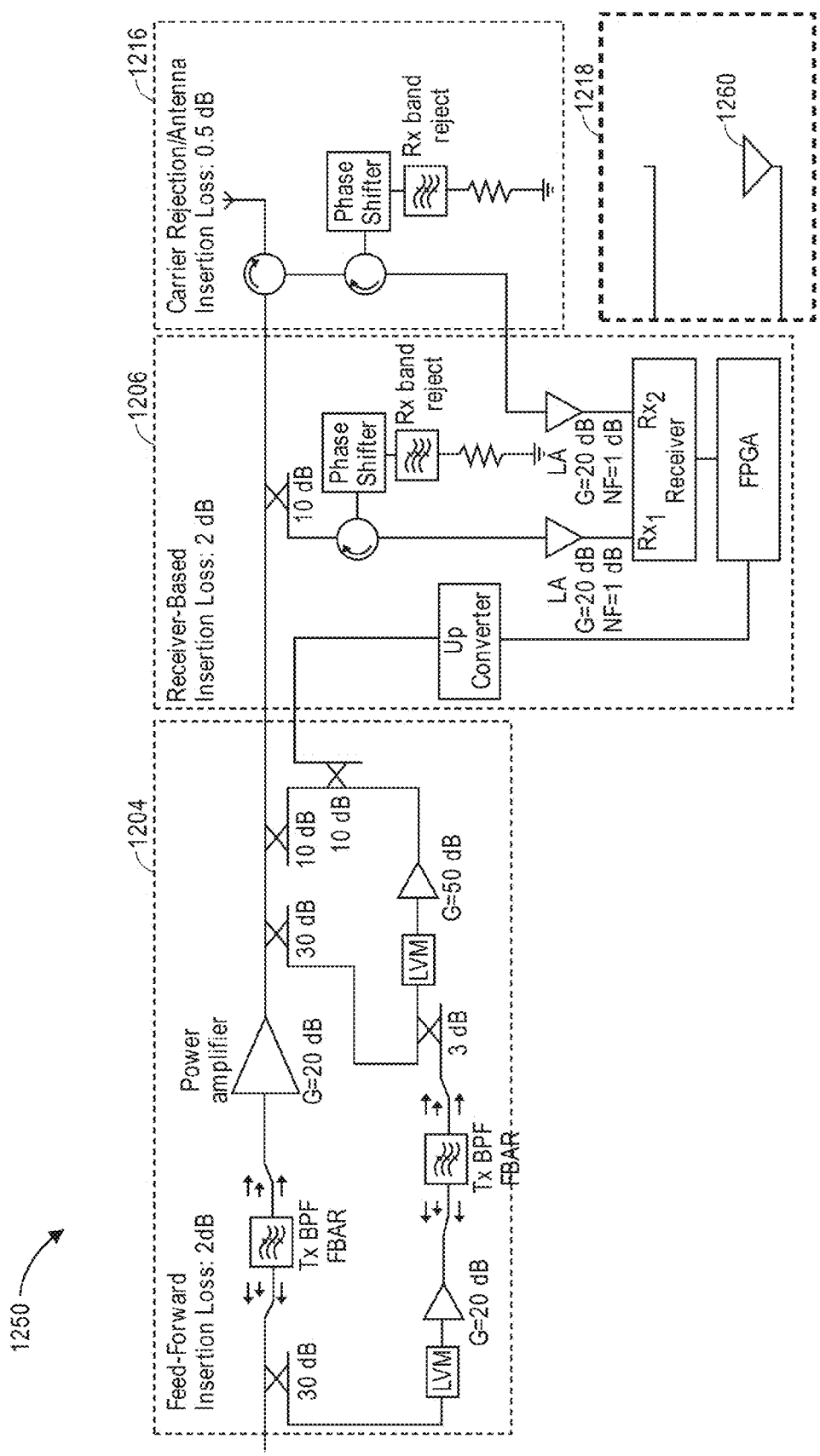
FIG. 12B illustrates a self-interference cancellation system according to another aspect of the disclosure.

FIG. 12B illustrates a self-interference cancellation system according to another aspect of the disclosure. The embodiment in FIG. 12B includes the subsystems of the feed-forward self-interference cancellation loop 1204 (from FIG. 1), the digital residual interference cancellation loop 1206 (from FIG. 2), and a self-interference cancellation circuit 1216. In other embodiments, the system 1250 may include an additional circuit 1218. The additional circuit 1218 may include other antenna isolation methods, such as using a separate antenna 1260 to receive a signal, or transmitting the transmitted signal at a different polarization from the received signal, for example.

The system 1250 may operate on any wireless communication standard such as Global Systems for Mobile communications (GSM), Universal Mobile Telecommunications System (UMTS), or Long Term Evolution (LTE), and may be configured to handle as many frequency bands as needed. In an embodiment, for example, the system 1250 may handle 4 different frequency bands. The system 1250 may be sized as needed, such as, in an example embodiment where the system 1250 can handle 4 bands, the feed-forward self-interference cancellation loop 1204 may be about 2.25 in$^2$, the digital residual interference cancellation loop 1206 may be about 5.75 in$^2$, and the self-interference cancellation circuit 1216 may be about 4.75 in$^2$. Of course, in other embodiments, other dimensions may be used.

The system 1250 may be configured to provide any amount of attenuation of the self-interference necessary, typically on the order of about 30-110 dB. In certain embodiments, different configurations of the system 1250 may be used or the components in the individual subsystems may be varied to arrive at different amounts of attenuation. For example, in an embodiment the feed-forward self-interference cancellation loop 1204 and the digital residual interference cancellation loop 1206 may be used to provide a desired amount of attenuation without additional attenuation circuitry. In such an example, the feed-forward self-interference cancellation loop 1204 may provide about 40 dB of attenuation, while the digital residual interference cancellation loop 1206 may provide about 30 dB of attenuation, resulting in about a 70 dB of attenuation in the system 1250. In other embodiments, other combinations of the subsystems, or components or methods in each subsystem may be used to provide the desired attenuation. The subsystems may also each have an insertion loss associated with them, for example, the feed-forward self-interference cancellation loop 1204 and the digital residual interference cancellation loop 1206 may each have an insertion loss of about 0.2 dB, and the self-interference cancellation circuit 1216 may have an insertion loss of about 0.5 dB.

Figure 13A:
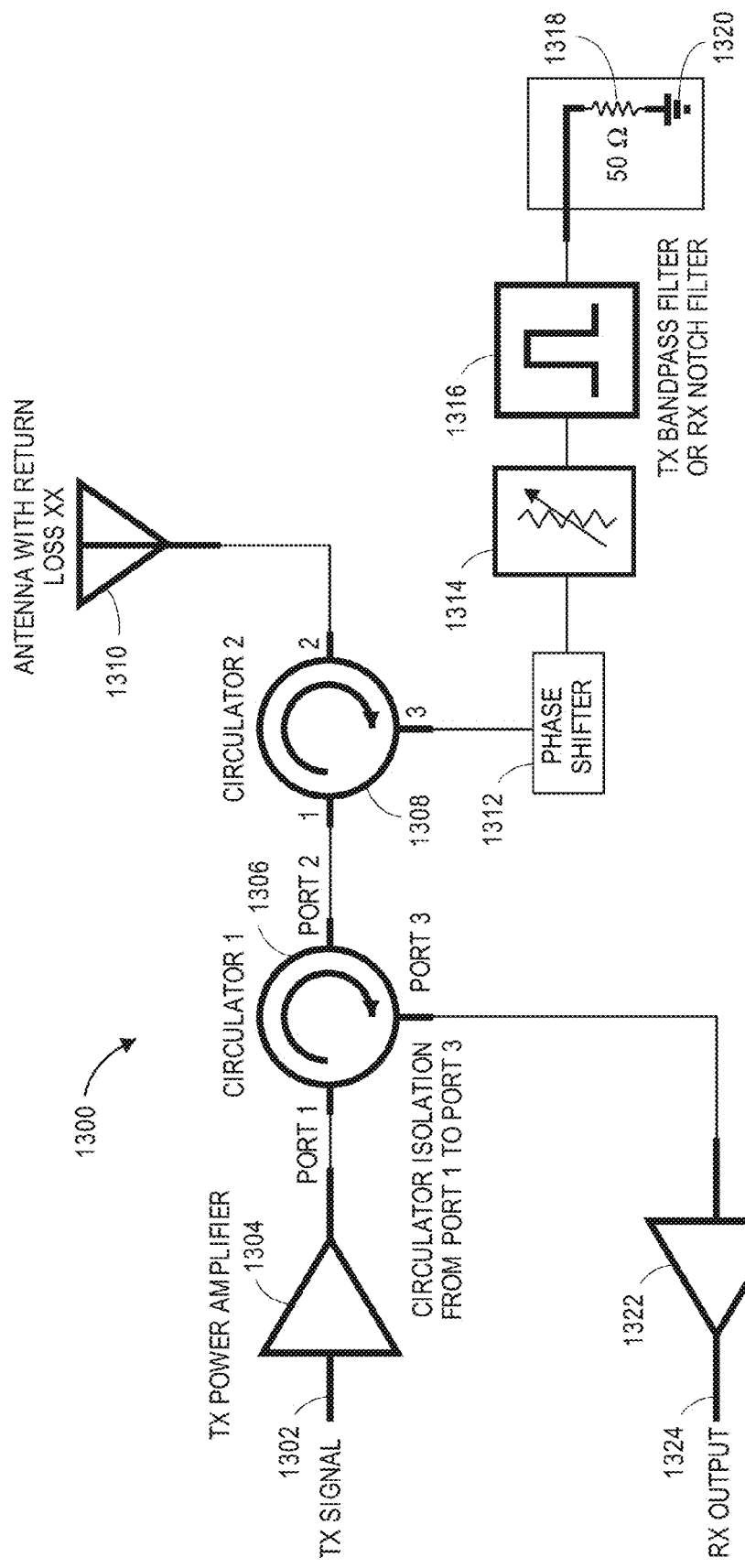
FIG. 13A illustrates diagram of a self-interference cancellation circuit with two circulators, a phase shifter, and a filter according to an aspect of the disclosure.

FIG. 13A illustrates diagram of a self-interference cancellation circuit with two circulators, a phase shifter, and a filter according to an aspect of the disclosure. The use of such a self-interference cancellation circuit may remove a high power carrier from a receive chain while cancelling noise in the receive band due to the transmitter. The system may use circulators in filtering applications in several ways to allow cheaper and less complex filters to be used, and aid in the cancellation of reflected transmit noise from an antenna.

In the circuit 1300 of FIG. 13A, a high power carrier may be removed from the receive path while cancelling noise in the receive band due to the transmitter. In an embodiment, a transmitter power amplifier 1304 may be configured to amplify a transmit signal 1302. The amplified transmit signal 1302 may then be sent to a first circulator 1306, where the first circulator 1306 may be coupled to the transmitter power amplifier 1304 through a port 1. In an embodiment, circulator 1306 may have an insertion loss of about 0.1-0.2 dB between port 1 and port 2. A second circulator 1308 may be coupled through a port 1 of the second circulator 1308 to the port 2 of first circulator 1306. In some embodiments, an antenna 1310 may be coupled to a port 2 of the second circulator 1308. The antenna 1310 may be located at an end of the transmission-reception path, where the antenna 1310 may transmit the transmit signal 1302 and receive a receive signal 1324. The transmit power of the antenna 1310 may be any power suitable to the application, for example, the transmit power may be about 40 dBm. In an example embodiment, the return loss of the antenna 1310 may be about 10-15 dB.

In certain embodiments, the first circulator 1306 and second circulator 1308 may be aligned along a transmission-reception path of the self-interference cancellation circuit 1300. A receiver amplifier 1322 may be coupled to a reception path of the self-interference cancellation system, where receive signal 1324 may be output to digital residual interference cancellation loop 1206 (FIG. 12A) or a receiver. It is contemplated that in some embodiments, the receiver amplifier 1322 may be coupled to a port 3 of first circulator 1306. The typical power from port 1 to port 3 of circulator 1306 may be about 15-25 dB less than that of the incident transmit power. In an embodiment, there may be about 20 dB of isolation between port 1 and port 3 of circulator 1306.

A phase shifter 1312 may be located on the reception path and coupled to a port 3 of the second circulator 1308. In certain embodiments, the phase shifter 1312 may be adjusted to shift the phase of a signal passing through it a desired number of degrees such that the signal can be combined with the signal after port 3 of circulator 1306 to cancel the transmit noise in the receive band. In a circuit such as in FIG. 13A, where the signal passes through the phase shifter 1312 twice, once on its path from the transmitter, and once as it is reflected off the filter 1316, the phase shifter 1312 may shift the phase of the signal by half of the total amount desired for cancellation each time the signal passes through the phase shifter 1312. For example, if 30 degrees of phase shift is needed for cancellation, the phase shifter 1312 may shift the signal 15 degrees each time the signal passes through, resulting in a total of 30 degrees of phase shift.

In an embodiment shown in FIG. 13A, a variable attenuator 1314 may be coupled to filter 1316 and the phase shifter 1312. The variable attenuator 1314 may adjust the amplitude of the signal passing through it as needed, for example, to match the power of reflected noise from the antenna 1310 with the power of the transmit noise in the receive band from the transmitter in order to cancel the noise before it reaches the receiver. In a circuit such as in FIG. 13A, where the signal passes through the variable attenuator 1314 twice, once on it path from the transmitter, and once as it is reflected off the filter 1316, the variable attenuator 1314 may attenuate the signal by half of the total amount desired each time the signal passes through the variable attenuator 1314. For example, if 10 dB of attenuation is needed, the variable attenuator 1314 may attenuate the signal 5 dB each time the signal passes through, resulting in a total of 10 dB of attenuation. In other embodiments, the variable attenuator 1314 may be a fixed attenuator. The filter 1316 may be located between the variable attenuator 1314 and a load 1318, where load 1318 may be coupled to electrical ground 1320. In embodiments, the filter 1316 may be any filter suitable to the application, such as a transmitter bandpass filter or a receiver notch filter, for example. In other embodiments, the attenuator 1314, phase shifter 1312, and filter 1316 can be in any order.

The circuit 1300 of FIG. 13A may provide for the cancellation of the transmit carrier in the receive path and the cancellation of transmit noise in the receive band. A transmit carrier, along with intermodulation products may be injected at port 1 of circulator 1306. The signal may travel through both circulators 1306 and 1308 to the antenna 1310, where although most of the energy may be radiated, some of the energy may be reflected back towards circulator 1308. In an embodiment, the carrier may be directed into a load 1318, so that very little energy of the carrier can be reflected back to the circulator 1308 and consequently, into the receive amplifier 1322. Energy in the receive band can be reflected off of the filter 1316 and travel back through second circulator 1308, through first circulator 1306, and then to the receive amplifier 1322.

In some embodiments, the signal going into port 1 of circulator 1306 can take alternate paths through the isolation of the circulators 1306 and 1308, which can cause signal addition or cancellation. For example, when the transmit signal approaches circulator 1306, some of the signal may leak from port 1 to port 3, allowing some of the transmit noise in the receive band to enter the sensitive receiver. However, if the filtering is adjusted appropriately, then the noise reflected off of the antenna can be shifted so that when it reflects off of the filter 1316, and travels from port 3 to port 1 of circulator 1308, and then from port 2 to port 3 on circulator 1306, it can cancel with the transmit noise in the receive band from the transmitter.

The system in FIG. 13A may provide several advantages over other systems. For example, a high power filter may not be required in the transmit path, thus reducing losses and increases overall efficiency. The filter 1316 after the second circulator 1308 can be a much lower power, because the reflected signal from the antenna 1310 may be significantly less than the incident power to the antenna 1310. In addition, the transmit noise in the receive band can be canceled. The rejection of the noise in the receive path may be limited though, to the isolation of the circulators 1306 and 1308 against the return loss of the antenna 1310, and the tuning of the filter 1316. It is contemplated that the bandwidth of cancelation may also be dependent on the equivalent line length (e.g., phase delay) between each of the devices along the path from circulator 1306 to antenna 1310 and from circulator 1306 to ground 1320. The rejection of the transmit carrier may be limited to the return loss of circulator 1306, since the carrier power reflected from the antenna 1310 may be terminated with the filter 1316. In some embodiments, a low loss, low power filter (not shown) can be inserted in the receive path to remove the rest of the transmit carrier since the typical power from port 1 to port 3 of circulator 1306 may be about 15-25 dB less than that of the incident transmit power. The circuit 1300 may be included in a wireless communication device such as a base station or a mobile phone.

Figure 13B:
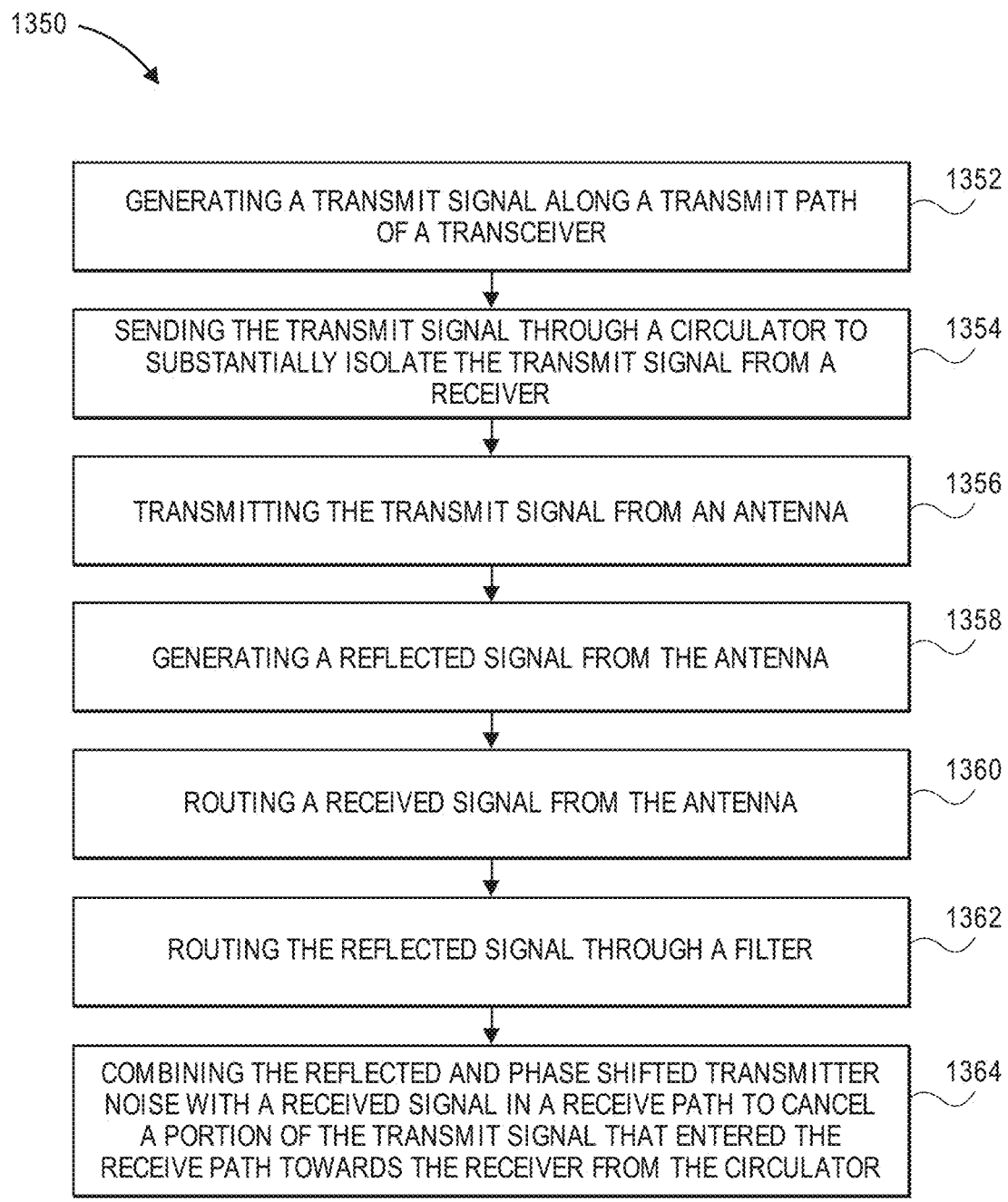
FIG. 13B illustrates a method of self-interference cancellation according to an aspect of the disclosure.

FIG. 13B illustrates a method 1350 of self-interference cancellation according to an aspect of the disclosure. In step 1352, a transmit signal may be generated along a transmit path of a transceiver. The transmit signal 1302 may then be sent through a circulator 1306 (see FIG. 13A) to substantially isolate the transmit signal 1302 from a receiver, wherein at least a portion of the transmit signal 1302 enters a receive path towards the receiver in step 1354. At step 1356, the transmit signal 1302 may be transmitted from an antenna 1310. In an embodiment, a signal 1324 may be reflected from the antenna 1310, wherein the reflected signal 1324 may be at substantially less power than an incident power to the antenna 1310 in step 1358. The reflected signal 1324 can include a transmitter carrier signal and a transmitter noise. In step 1360, a received signal 1324 may be routed from the antenna 1310. The reflected signal 1324 may be routed through a filter 1316 in step 1362. In an exemplary embodiment in step 1364, the reflected and phase shifted transmitter noise may be combined with the received signal 1324 in the receive path to cancel the portion of the transmit signal 1302 that entered the receive path towards the receiver from the circulator 1306.

Figure 14:
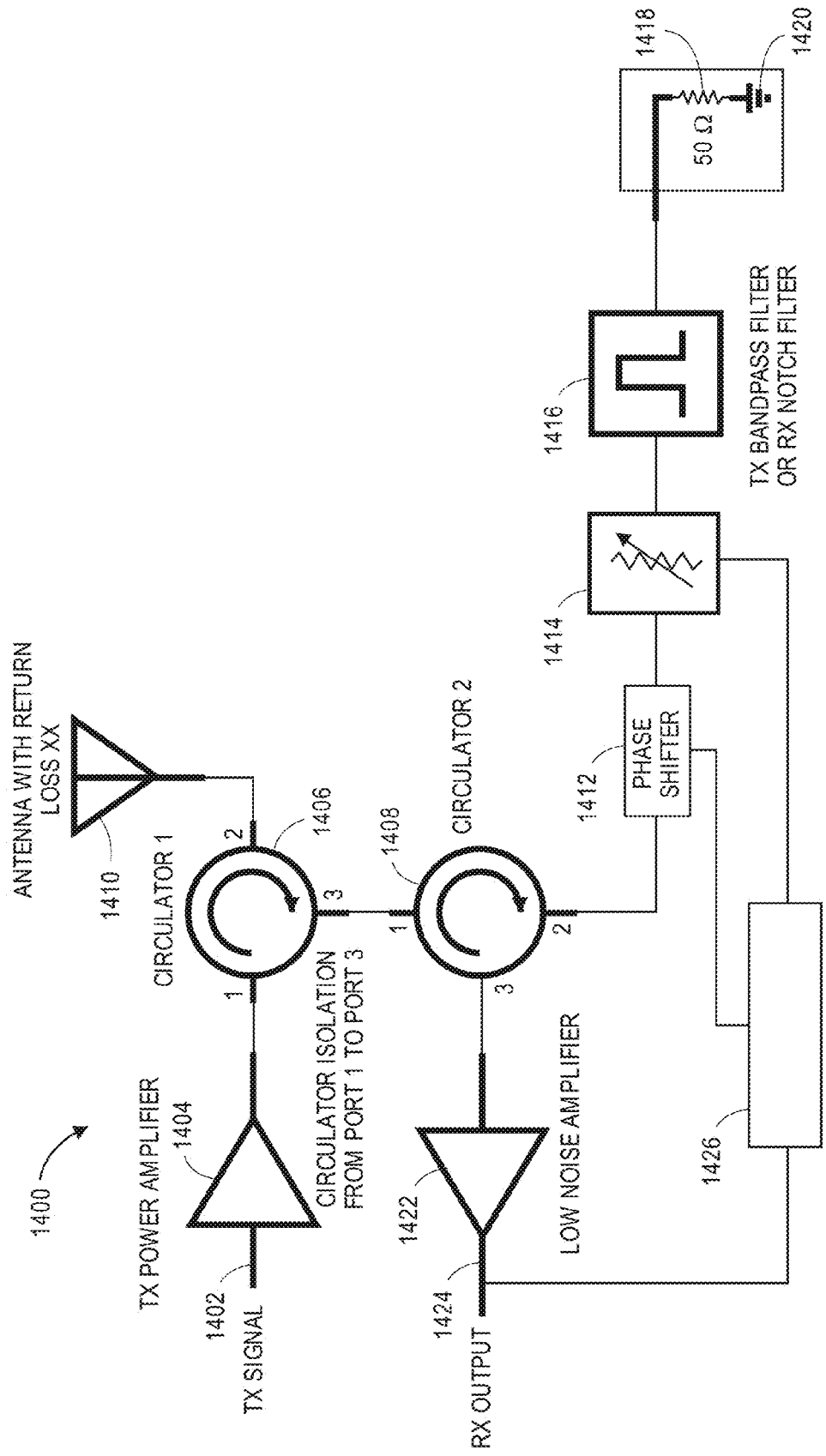
FIG. 14 illustrates diagram of a self-interference cancellation circuit with two circulators, a phase shifter, and a filter according to another aspect of the disclosure.

FIG. 14 illustrates a diagram of a self-interference cancellation circuit with two circulators, a phase shifter, and a filter according to another aspect of the disclosure. In the circuit 1400 of FIG. 14, a high power carrier may be removed from the receive path while cancelling noise in the receive band due to the transmitter. The circuit 1400 may have a reduced line length in the signal path as compared to other embodiments (e.g. FIG. 15), which may enhance the cancellation possible, and may provide a lower insertion loss in the transmit path.

In the circuit shown in FIG. 14, a transmit signal 1402 may be sent to a transmitter power amplifier 1404 configured to amplify the transmit signal 1402, and send the transmit signal 1402 to a first circulator 1406 through a port 1. A second circulator 1408 may be coupled through a port 1 of the second circulator 1408 to a port 3 of first circulator 1406. In an embodiment, an antenna 1410 may be coupled to a port 2 of the first circulator 1406. The antenna 1410 may be located at an end of the transmission-reception path, where the antenna 1410 may transmit the transmit signal 1402 and receive a receive signal 1424.

In certain embodiments, a receiver amplifier 1422 may be coupled to a reception path of the self-interference cancellation circuit, where receive signal 1424 may be output to digital residual interference cancellation loop 1206 (FIG. 12A) or a receiver. It is contemplated that in some embodiments, the receiver amplifier 1422 may be coupled to a port 3 of second circulator 1406. This configuration may allow for additional isolation of the transmit signal 1402 that may leak from port 1 to port 3 of circulator 1406, since the leaked portions of the transmit signal 1402 then have to pass through circulator 1408 before it can enter the receiver. In an embodiment, the leaked portions of the transmit signal 1402 may pass through filter 1416 to load 1418 thus further reducing noise that may be sent to the receiver.

A phase shifter 1412 may be located on the reception path and coupled to a port 2 of the second circulator 1408. In an embodiment shown in FIG. 14, a variable attenuator 1414 may be coupled to filter 1416 and the phase shifter 1412. The filter 1416 may be located between the variable attenuator 1414 and a load 1418, where load 1418 is coupled to electrical ground 1420. The filter 1416 may be any filter suitable to the application, such as, for example, a transmitter bandpass filter or a receiver notch filter. In other embodiments, the attenuator 1414, phase shifter 1412, and filter 1416 can be in any order.

In certain embodiments, a controller 1426 may be coupled to the self-interference cancellation circuit 1400 to control the circuit. The controller 1426 may be coupled to the circuit in any suitable manner to control desired components of the circuit. For example, in FIG. 14, the controller 1426 may be coupled to the phase shifter 1412 and the variable attenuator 1414, such that these components may be controlled. The controller 1426 may also be coupled to the circuit after the receive amplifier 1422 to receive feedback information on the properties of the signal to determine if adjustments to the other components such as the phase shifter 1412 and the variable attenuator 1414 may be needed. A feedback and control algorithm may be applied by the controller 1426 to adjust the phase shifter 1412 and the attenuator 1414.

Figure 15:
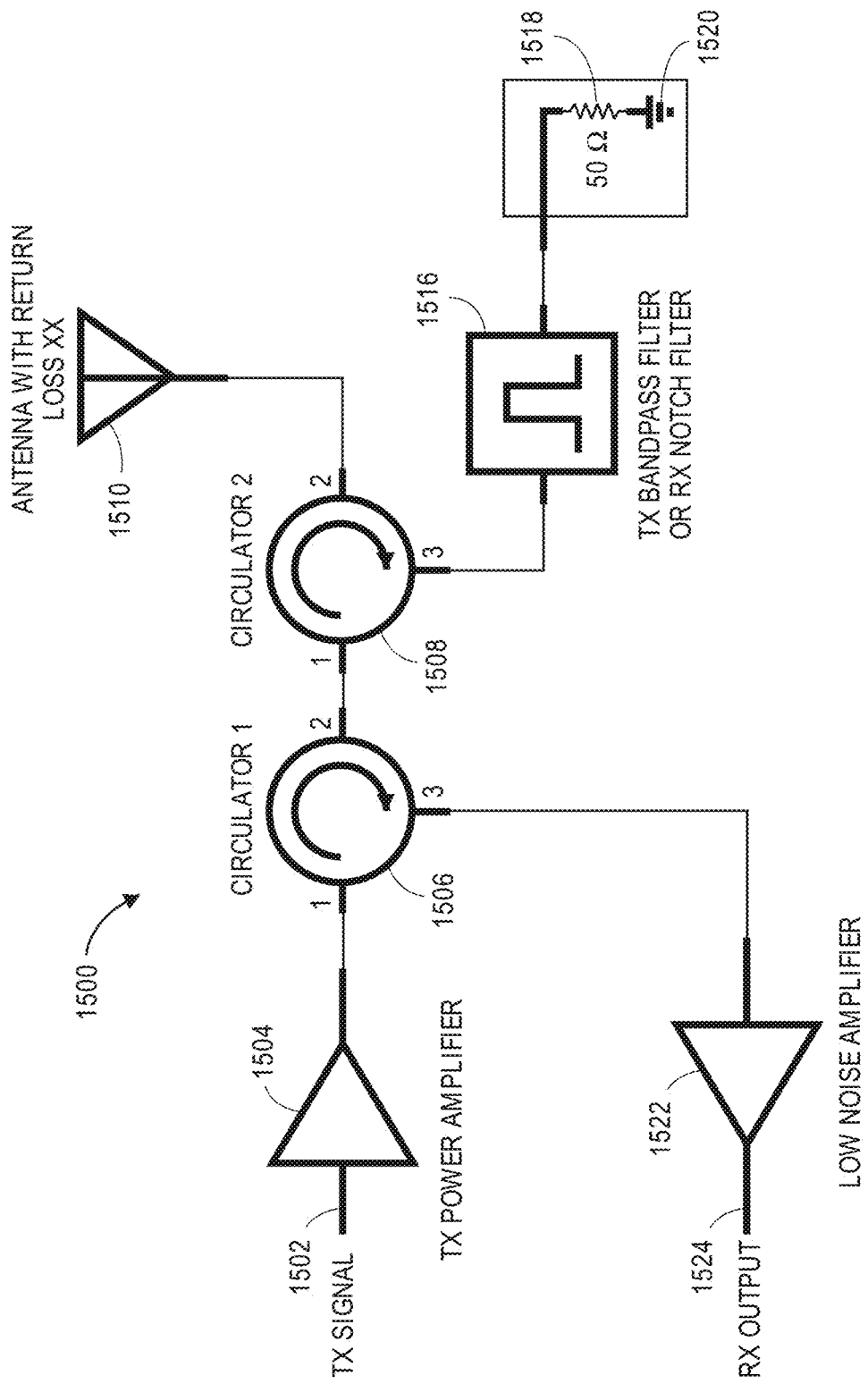
FIG. 15 illustrates diagram of a self-interference cancellation circuit with two circulators and a filter according to an aspect of the disclosure.

FIG. 15 illustrates diagram of a circuit with two circulators and a filter according to an aspect of the disclosure. In the circuit 1500 of FIG. 15, a high power carrier may be removed from the receive path.

In an embodiment, a transmitter power amplifier 1504 may be configured to amplify a transmit signal 1502. The amplified transmit signal 1502 may then be sent to a first circulator 1506, where the first circulator 1506 may be coupled to the transmitter power amplifier 1504 through a port 1 of the first circulator 1506. A second circulator 1508 may be coupled through a port 1 of the second circulator 1508 to a port 2 of first circulator 1506. In an embodiment, an antenna 1510 may be coupled to a port 2 of the second circulator 1308. The antenna 1510 may be located at an end of the transmission-reception path, where the antenna 1510 may transmit the transmit signal 1502 and receive a receive signal 1524.

In certain embodiments, the first circulator 1506 and second circulator 1508 may be aligned along a transmission-reception path of the circuit 1500. A receiver amplifier 1522 may be coupled to a reception path of the circuit, where receive signal 1524 may be output to the digital residual interference cancellation loop 1206 (FIG. 12A) or a receiver. It is contemplated that in some embodiments, the receiver amplifier 1522 may be coupled to a port 3 of first circulator 1506.

A filter 1516 may be located on the reception path and coupled to a port 3 of the second circulator 1508. In other embodiments, a variable attenuator may be coupled to filter 1516. The filter 1516 may be located between the second circulator 1508 and a load 1518, where load 1518 is coupled to electrical ground 1520. In certain embodiments, the filter 1516 may be any filter suitable to the application, such as a transmitter bandpass filter or a receiver notch filter, for example.

In an embodiment, the user can take advantage of the qualities of the antenna to reduce the power handling requirement of the filter. In FIG. 15, a high power transmit signal 1502 may be present at the output of the transmit power amplifier 1504. This signal 1502 may pass through first circulator 1506 and second circulator 1508 towards the antenna 1510. The antenna 1510 may reflect some of the high power transmit signal 1502 back due to the return loss of the antenna 1510, as well as send the receive signal 1524. Both signals 1502 and 1524 may then travel through the second circulator 1508 towards the filter 1516 and the load 1518. In an embodiment where the filter 1516 is a transmit bandpass filter, the filter 1526 can allow the reflected signal in the transmit band to go through to the load 1518 and be absorbed, while the received signal may be reflected and return towards the second circulator 1508. The received signal can then proceed back to the first circulator 1506 and then into the receiver amplifier 1522 where the signal may be amplified and sent to the receiver. In such an embodiment, the filter 1526 may have a lower power handling requirement as a result of the return loss of the antenna 1510. In another embodiment, the filter 1526 may be a receive notch filter.

An advantage of the circuit 1500 is that a notch filter or bandpass can be easier to design for high power handling than a diplexer or other filtering methods. The system noise figure in the circuit 1500 may also be reasonably low, and can depend on the return loss of the antenna, the return loss of the circulators 1506 and 1508, the return loss of the filter 1516 in the receive band, and the noise figure of the receiver amplifier 1522. In some embodiments, advantages in power handling of the filter 1516 can be up to about 20 dB, but can be dependent on the return loss of the antenna 1510. Circuit 1500 may also greatly attenuate the reflected transmit signal. The amount of attenuation can depend on the return loss of the filter 1516 used and the quality of the load 1518, and of course the quality of the matching of the components in the rest of the circuit.

Figure 16:
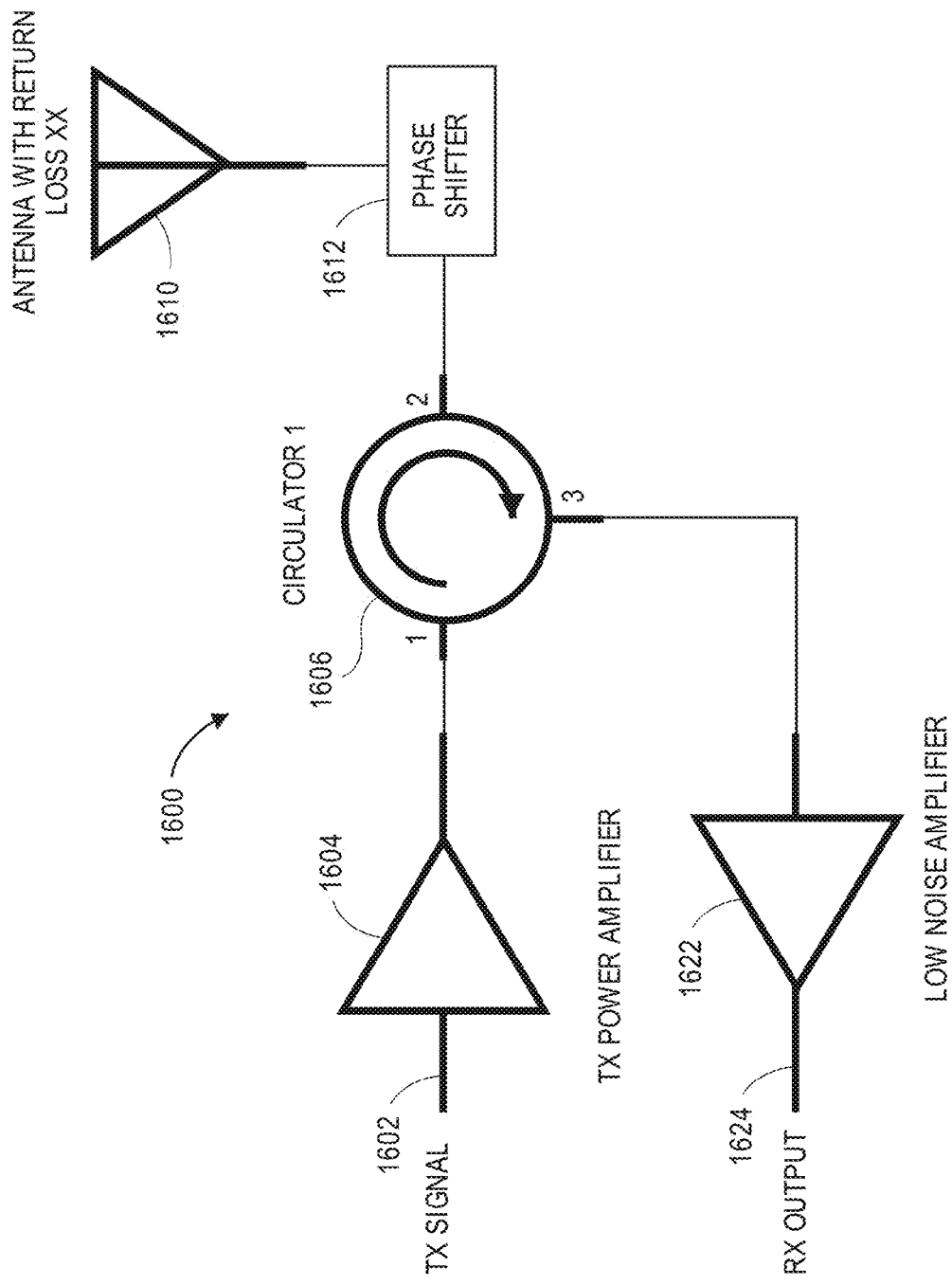
FIG. 16 illustrates diagram of a self-interference cancellation circuit with one circulators and a phase shifter according to an aspect of the disclosure.

FIG. 16 illustrates diagram of a circuit with one circulators and a phase shifter according to an aspect of the disclosure. In the circuit 1600 of FIG. 16, transmit noise present in the receive path may be canceled via phase shifter 1612. In an embodiment, a transmitter power amplifier 1604 may be configured to amplify a transmit signal 1602. The amplified transmit signal 1602 may then be sent to a first circulator 1606, where the first circulator 1606 may be coupled to the transmitter power amplifier 1604 through a port 1 of the first circulator 1606. In the embodiment shown in FIG. 16, the phase shifter 1612 may be located on the transmission-reception path and coupled to a port 2 of the first circulator 1606. Antenna 1610 may be located at an end of the transmission-reception path and coupled to the phase shifter 1612. In an embodiment, the antenna 1610 may transmit the transmit signal 1602 and receive a receive signal 1624.

A receiver amplifier 1622 may be coupled to a reception path of the self-interference cancellation system, where receive signal 1624 may be output to digital residual interference cancellation loop 1206 (FIG. 12A) or a receiver. It is contemplated that in some embodiments, the receiver amplifier 1622 may be coupled to a port 3 of first circulator 1306.

In an embodiment where the power reflected from the antenna 1610 is similar to the power leaked from port 1 to port 3 on the circulator 1606, it may be possible to use a phase shifter 1612 in the path of the antenna 1610 to set the phase of the noise signal so that it cancels at port 3 of the circulator 1606. This may allow the cancellation of either the transmit carrier power or the power amplifier noise in the receive band depending on the phase setting.

Software Defined Radio Front End and Secure Radio Methods

According to another aspect of the disclosure, the adaptability of the art taught herein can be applied for the realization of high security systems. For example, one such application of the art of this disclosure is a more secure and robust frequency hopping method. Frequency hopping is understood to increase security for communications. In frequency hopping, the transmitter and receiver change the frequency at which they are operating in a manner that is known to both the transmitter and the receiver. FDD systems utilize multiple, non-programmable band pass filters. The band pass filters limited the usefulness of frequency hopping because, due to, for example, space and cost constraints, transmitters and receivers could have a limited number of band pass filters. Thus, the number of frequency bands, and radio access technologies, the transmitter and receiver could hop through was limited.

Figure 17:
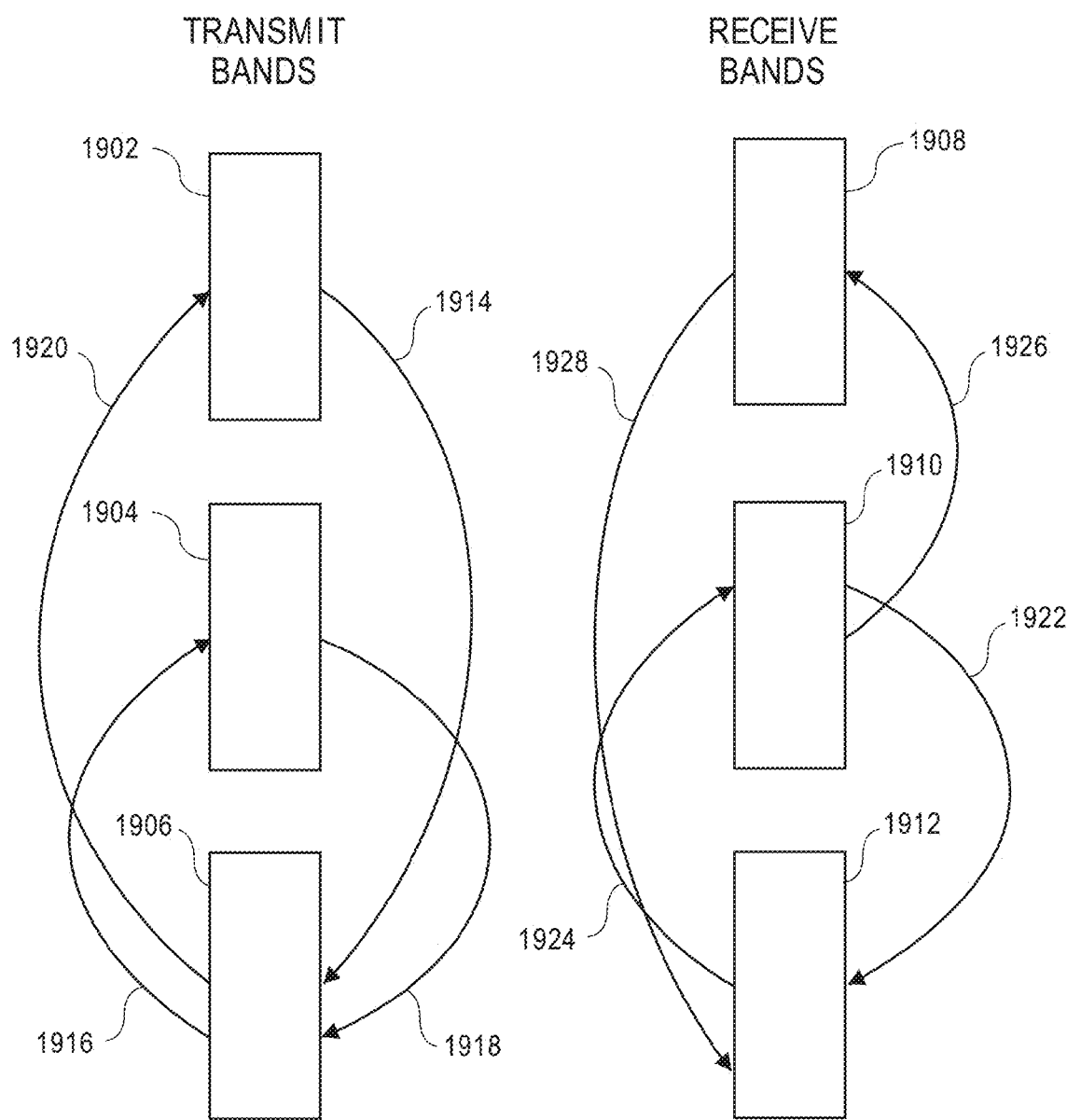
FIG. 17 is a diagram illustrating a frequency hopping method, according to one aspect of this disclosure.

As shown in FIG. 17, during the operation of the system, transmit and receive operations of the system may be changed during the operation of the system to increase security to very high levels. For example, this may be accomplished by removing the multiple, non-programmable band pass filters of the prior art. Instead, the system may use a software-implemented filter to process the transmit and receive signals. This disclosure may use a software-implemented filter rather than multiple, non-programmable band pass filters because of the feed-forward and digital interference cancellation methods described above. The system of this disclosure may use software-implemented filters because the feed-forward and digital cancellation methods remove transmit energy that would otherwise be present in the receive frequency band. For example, the band pass filters 3 and 13 may be implemented in software. As a result, the center frequency of the band being passed by the band pass filters 3 and 13 may be changed to virtually any frequency suitable for communications. Therefore, the feed-forward loop may be operable on any suitable Radio Access Technology as well. Additionally, or alternatively, the linear vector modulators 11 and 16 may also be software-controlled. For example, the amount the magnitude and phase variation of the signals processed by the linear vector modulators 11 and 16 may be software-controlled.

In the digital cancellation method, the fixed tones and swept tones may be upconverted before being injected. The fixed and swept tones may be upconverted to the operating transmission and reception frequency of the transceiver. If the operating transmission and reception frequency of the transceiver changes, as it would during frequency hopping, the frequencies to which the fixed and swept tones may be converted may correspondingly change. Moreover, the magnitude of the fixed and swept tones may be software-controllable. Additionally, the coefficients for the IIR filter 146 may be software-controlled as well.

As shown in FIG. 17, the transmitter may operate in, for example, three transmit frequency bands 1902, 1904, 1906. During transmission, the transmitter may transmit data on frequency band 1902. To increase security of the transmissions, the transmitter may begin to transmit data on a different frequency from frequency band 1902. For example, the transmitter may switch from transmitting data on frequency band 1902 to transmitting data on frequency band 1906, as indicated by 1914. The transmitter may change which frequency band it is transmitting on based on, for example, a programmed frequency hopping algorithm. After transmitting data on frequency band 1906, the transmitter may again change the frequency band on which it operates. For example, the transmitter may switch from operating on frequency band 1906 to operating on frequency band 1904, as indicated by 1916. Thereafter, the transmitter may again switch the frequency band on which it is transmitting. For example, as indicated by 1918, the transmitter may switch from operating on frequency band 1904 and return to operating on frequency band 1906. The transmitter, after transmitting on frequency band 1906 again, may switch the frequency band on which it operates. For example, the transmitter may start transmitting on frequency band 1902, as indicated by 1920. The transmitter may periodically change the frequency band on which it operates, as described above. The number of frequency bands the transmitter on may be any number and the length of time the transmitter transmits on any single frequency band may be the same for all frequency bands or variable.

Also shown in FIG. 17 is an operation of the receiver during frequency hopping. Similar to the transmitter as described above, the receiver may operate in three receive bands 1908, 1910, 1912. Operation of the frequency hopping algorithm at the receiver is similar to the operation of the frequency band at the transmitter. For example, the receiver may be receiving data on frequency band 1910. The receiver may change receiving frequency band to frequency band 1912, as shown by 1922. The receiver may change which frequency band it is receiving on based on, for example, a programmed frequency hopping algorithm. After receiving data on frequency band 1912, the receiver may again change the frequency band on which it operates. For example, the receiver may switch from operating on frequency band 1912 to operating on frequency band 1910, as indicated by 1924. Thereafter, the receiver may again switch the frequency band on which it is operating. For example, as indicated by 1926, the receiver may switch from operating on frequency band 1910 to frequency band 1908, as indicated by 1926. Thereafter, the frequency band the receiver is operating on may change from 1908 to 1912, as indicated by 1928. The receiver may periodically change the frequency band on which it operates, as described above. The number of frequency bands the receiver on may be any number and the length of time the receiver receives on any single frequency band may be the same for all frequency bands or variable.

What is material to the operations shown is that the relationship between the transmit band/frequency and the receive band/frequency be known and have been calibrated for a given pairing so that the system can be controllably adapted as needed during the operation of the system. Calibration for predetermination of parameters which can be controlled can be done in a known automated way at the time of manufacture of the system. Since the system of this disclosure uses a software-implemented filter, the number of frequency bands and the types of Radio Access Technologies the system may operate on is greater than prior art systems.

Advantageously, a relationship between transmitter and receiver where both operate on the same frequency band can be supported within the scope of the art taught herein. Here the offset between transmit and receive bands can be zero for either normal operation of the system or in high security or other applications. Material is that the operation for a given transmit and receive band relationship be calibrated for the system including calibration for a given full duplex single frequency operational case.

Figure 18:
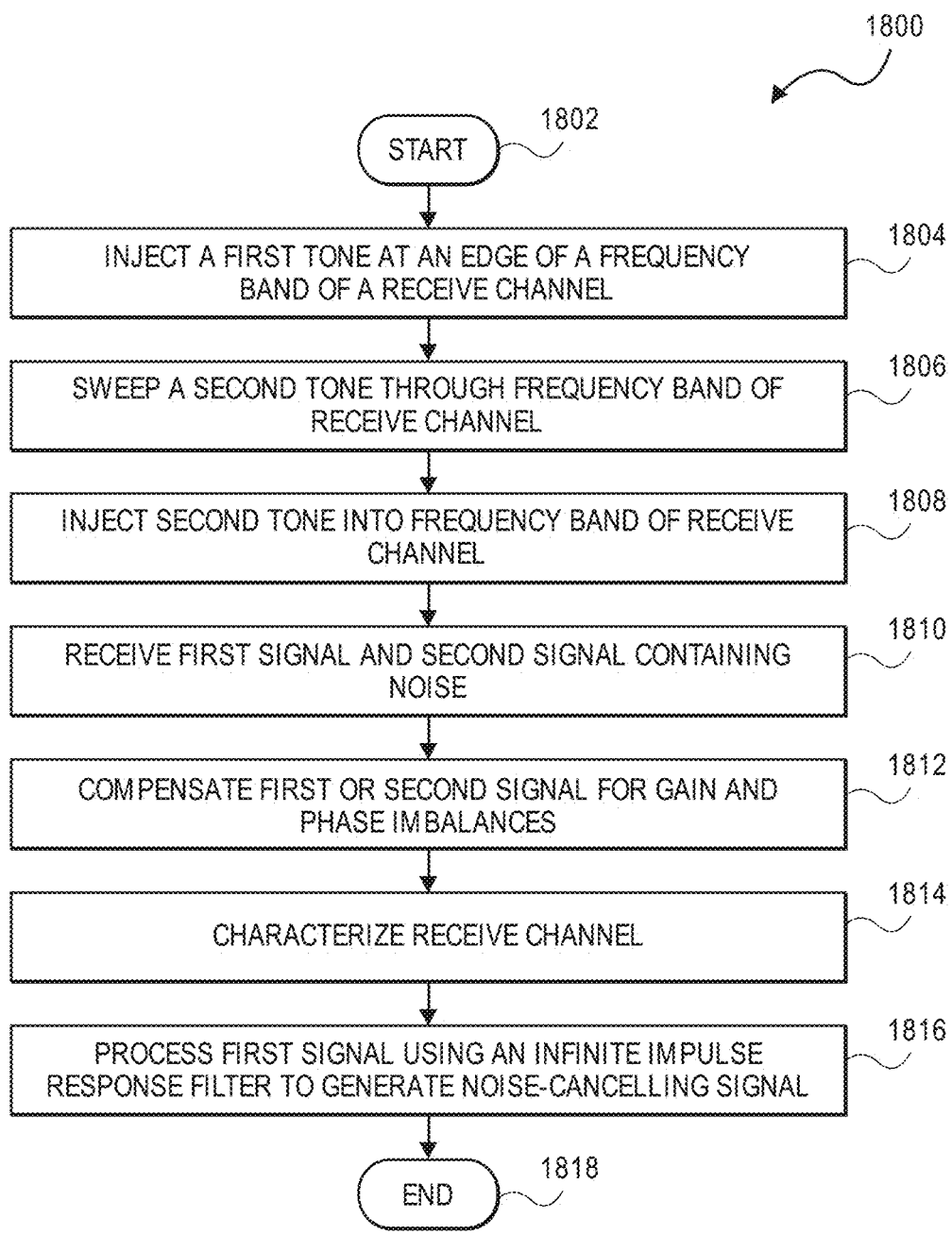
FIG. 18 is a flowchart illustrating a method of operation of the apparatus of this disclosure, according to one aspect of this disclosure.

FIG. 18 is a flowchart illustrating a method 1800 of operation of the apparatus of this disclosure, according to one aspect of this disclosure. The flowchart 1800 begins at steps 1802 and proceeds to 1804. At step 1804, a first tone generated by, for example, a tone generator, is injected at the edge of the frequency band of the receive channel. The first tone may be upconverted so that it is at whichever frequency band the apparatus is operating at. After completing 1804, the method may proceed to step 1806.

At step 1806, a second tone is swept through the frequency band of the receive channel. Like the first tone injected at 1804, the second tone 1806 may be upconverted so that it is operating at the frequency band the apparatus is operating at. After completing 1806, the method may proceed to 1808.

At step 1808, the apparatus may receive a first signal containing interference. There may also be a second signal, which may be a sample of the PA output signal. After completing 1808, the method may proceed to step 1810.

At step 1810, the apparatus may compensate the first or the second signal for gain and phase imbalances. For example, the apparatus may use the I/Q compensators as described above to compensate the first or the second signals. In one aspect, both the first and the second signals may be compensated using the I/Q compensators. After completing 1810, the method may proceed to 1812.

At step 1812, the channel as seen at the receiver may be characterized. For example, the apparatus may use the swept tones at 1806 to characterize the channel as seen by the receiver. After completing 1812, the method may proceed to 1814.

At step 1814, the apparatus may process the first signal using an infinite impulse response filter. The output of the infinite impulse response filter may be an interference-cancelling signal. After completing 1814, the method may end at 1816.

Figure 19:
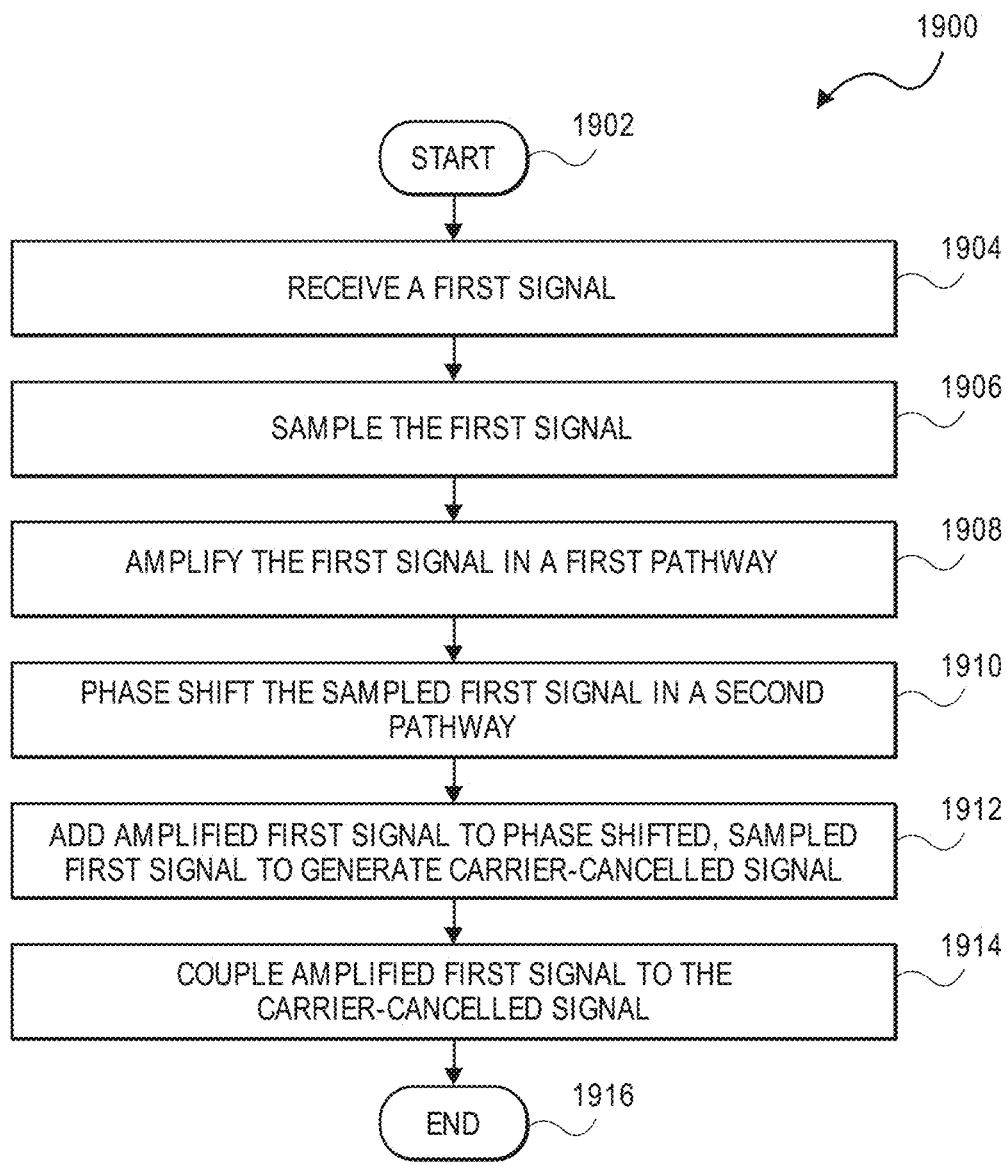
FIG. 19 is a flowchart illustrating a method of operation of the apparatus of this disclosure, according to one aspect of this disclosure.

FIG. 19 is a flowchart illustrating a method 1900 of operation of the feed-forward loop of this disclosure, according to one aspect. The flowchart 1900 begins at step 1902 and proceeds to step 1904. At step 1904, the apparatus may receive a first signal on a first path. This first signal may, for example, be a signal to be transmitted. After completing step 1904, the method may continue to step 1906.

At step 1906, the first signal may be sampled into a second path. For example, the first signal may be sampled using a coupler. After completing step 1906, the method may proceed to step 1908.

At step 1908, the first signal on the first path may be amplified. The amplification, for example, may be accomplished using a power amplifier. The first signal on the first path may also be filtered using any suitable filter, such as a band pass filter, a low pass filter, a high pass filter, or any desired combination of filters. After completing 1908, the method may proceed to 1910.

At step 1910, the sampled first signal on the second path is phase shifted in a second pathway. For example, this may be accomplished using a linear vector modulator. The sampled first signal on the second path may also be filtered using any suitable filter, such as a band pass filter, a low pass filter, a high pass filter, or any desired combination of filters. After completing step 1910, the method may proceed to step 1912.

At step 1912, the amplified first signal on the first path may be added to the phase shifted, sampled first signal on the second path. The two signals may be added, for example, using a coupler or an adder. Adding the two signals may result in a carrier-cancelled signal on a third path. The carrier-cancelled signal on the third path may have its phase adjusted using, for example, a linear vector modulator, or its amplitude adjusted. After completing step 1912, the method may proceed to step 1914.

At step 1914, the amplified first signal on the first path may be coupled to the carrier-cancelled signal on the third path. This may be accomplished using a coupler or an adder. After completing 1914, the method may proceed to 1916 and end.

Figure 20:
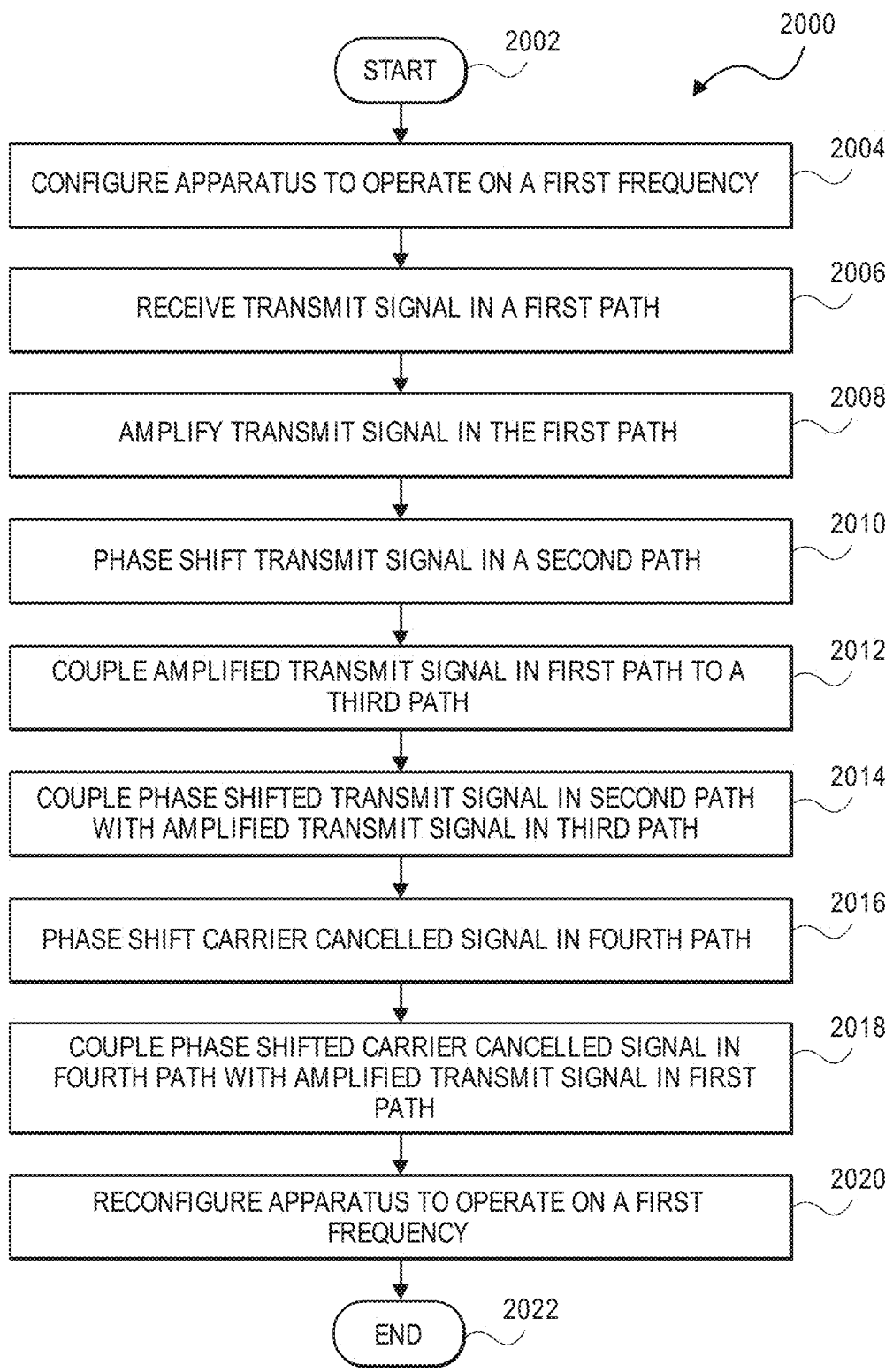
FIG. 20 is a flowchart illustrating a method of operation of the apparatus, according to one aspect of this disclosure.

FIG. 20 is a flowchart illustrating a method 2000 of operation of the apparatus, according to one aspect of this disclosure. The method 2000 begins at step 2002 and may continue to step 2004.

At step 2004, the apparatus may be configured to operate on a first frequency. After the apparatus, such as a software defined radio front end, is configured to operate on a first frequency, the method may continue to step 2006.

At step 2006, the apparatus may receive a transmit signal in a first path. When the apparatus has received the transmit signal in the first path, the method may continue to step 2008.

At step 2008, the transmit signal may be amplified in the first path. The amplification may happen using, for example, a low noise amplifier. Once the transmit signal has been amplified, the method may continue to step 2010.

At step 2010, the transmit signal may be coupled to a second path. In the second path, the coupled transmit signal may be phase shifted using, for example, a Linear Vector Modulator. Once the coupled transmit signal has been phase shifted, the method may continue to step 2012.

At step 2012, the amplified transmit signal in the first path may be coupled to a third path. After the amplified transmit signal is coupled, the method may proceed to step 2014.

At step 2014, the apparatus may couple the phase-shifted transmit signal in the second path to the amplified transmit signal in the third path. This coupling may result in a carrier-cancelled signal in a fourth path in the apparatus. After the signals in the second and third path have been coupled, the method may continue to step 2016.

At step 2016, the apparatus may phase shift the carrier-cancelled signal in the fourth path using, for example, a Linear Vector Modulator. Once the carrier-cancelled signal in the fourth path is phase shifted, the method may continue to step 2018.

At step 2018, the apparatus may couple the phase shifted, carrier-cancelled signal in the fourth path with the amplified transmit signal in the first path. After the phase shifted, carrier-cancelled signal in the fourth path and the amplified transmit signal in the first path are coupled, the method may continue to step 2020.

At step 2020, the apparatus may be reconfigured to operate on a second frequency. After the apparatus has been reconfigured to operate on the second frequency, the method may continue to step 2022 and end.

Figure 21:
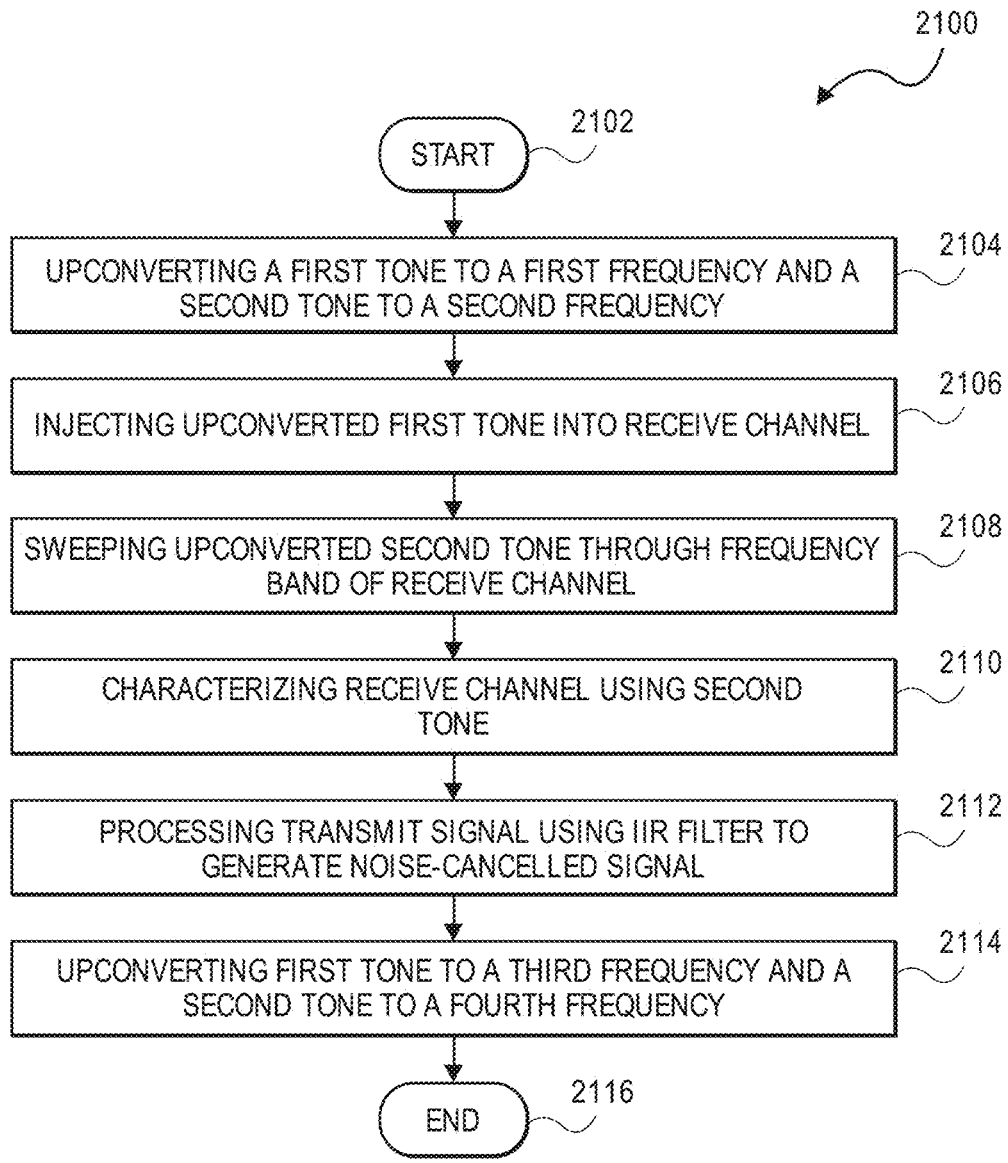
FIG. 21 is a flowchart illustrating a method of operation of the apparatus, according to one aspect of this disclosure.

FIG. 21 is a flowchart illustrating a method 2100 of operation of the apparatus, according to one aspect of this disclosure. The method 2100 begins at step 2102 and may proceed to step 2104.

At step 2104, the apparatus may upconvert a first tone a first frequency and a second tone to a second frequency. The first and second frequencies may be pre-calibrated to operate in a plurality of frequency bands. The first frequency may overlay the frequency band of the receive channel. Additionally, the apparatus may upconvert a third tone to a fifth frequency. After completing step 2104, the method may proceed to step 2106.

At step 2106, the apparatus injected the upconverted first tone into a receive channel. After completing step 2106, the method may proceed to step 2108.

At step 2108, the apparatus may sweep the upconverted second tone through the frequency band of the receive channel. The number of steps within the sweep may be configurable by the controller. Also, the frequency band of each step may be configurable by the controller. After completing step 2108, the method may proceed to step 2110.

At step 2110, the apparatus may use the swept upconverted second tone to characterize the receive channel. After completing step 2110, the method may proceed to step 2112.

At step 2112, the apparatus may process the transmit signal using an IIR filter. The coefficients of the IIR filter may be generated using the characterized receive channel. Additionally, the IIR filter coefficients may be generated in conjunction with a least-squares estimator circuit. The IIR filter may output an interference-cancelling signal. Additionally, the apparatus may couple the interference-cancelling signal to a received signal containing interference. After completing step 2112, the method may proceed to step 2114.

At step 2114, the apparatus may upconvert the first tone to a third frequency and a second tone a fourth frequency. The third and fourth frequencies may be in a different frequency band from the first and second frequencies. The first, second, third, fourth, and fifth frequencies may be determined based on the radio access technology the apparatus may be operating on. After completing step 2114, the method may end at step 2116.

The present description is for illustrative purposes only, and should not be construed to narrow the breadth of the present disclosure in any way. Thus, those skilled in the art will appreciate that various modifications might be made to the presently disclosed embodiments without departing from the full and fair scope and spirit of the present disclosure. Other aspects, features and advantages will be apparent upon an examination of the attached drawings and appended claims.

What is claimed is:

1. A method for characterizing a self-interference channel of a frequency division duplex transceiver including a transmitter and a receiver, the method comprising:
   transmitting, from a transmitter of a frequency division duplex transceiver in a transmission band, a transmission signal including a message signal and a swept tone that changes frequency from below an upper edge to above a lower edge of a reception band of a receiver, the self-interference channel being defined between the transmitter and the receiver of the frequency division duplex transceiver, such that at least a portion of the message signal leaks into a signal received by the receiver;
   determining, at an infinite impulse response (IIR) filter of the receiver, an infinite impulse response of the self-interference channel based upon a reception of the swept tone swept at each frequency in the reception band; and
   estimating the self-interference channel between the transmitter and the receiver, based upon the infinite impulse response.

2. The method of claim 1, wherein the transmitting comprises:
   injecting, at the transmitter, a fixed tone outside the reception band in addition to the message signal and the swept tone; and
   determining, at the receiver, a coefficient for automatic gain control and temperature variation based upon a change in a gain and a phase of the fixed tone.

3. The method of claim 2, further comprising:
   up-converting, at the transmitter, the fixed tone and the swept tone centered around a central frequency of the reception band.

4. The method of claim 1, wherein the determining includes:
   determining one or more coefficients of the IIR filter at the receiver, and
   determining, a best-fitting curve indicating a gain response and a best-fitting curve indicating a phase response of the self-interference channel based upon the one or more coefficients.

5. The method of claim 1, further comprising:
   providing, to the receiver, a sample of the transmission signal including the message signal and the swept tone prior to the transmitting,
   wherein the estimating the self-interference channel includes comparing the sample with the swept tone and the portion of the message signal received at the receiver after the transmitting.

6. The method of claim 1, wherein the swept tone is transmitted periodically during the transmitting at discrete stepped frequencies.

7. The method of claim 1, wherein the transmitter and the receiver are collocated.

8. A self-interference channel estimation system, comprising: a frequency division duplex transceiver including a transmitter and a receiver, the transmitter and the receiver forming a self-interference channel, the transmitter including:
   a signal generator for generating a swept tone having a frequency ranging from an upper edge of the reception band to a lower edge of the reception band, and to generate a message signal, and
   a combiner for up converting the swept tone and the message signal to a radio frequency signal centered about a center frequency of the reception band; and
   the receiver including: an infinite impulse response (IIR) filter for equalizing an infinite impulse response of the self-interference channel based upon a reception of the swept tone swept at each frequency in the reception band by the receiver over two receive paths, and a processor configured to estimate the self-interference channel between the transmitter and the receiver, based upon the equalized infinite impulse response.

9. The self-interference channel estimation system of claim 8, wherein the frequency division duplex receiver is located in a base station or a handset.

10. The self-interference channel estimation system of claim 8, wherein the transmitter and the receiver are collocated to form the self-interference channel.

11. The self-interference channel estimation system of claim 8, wherein the processor is configured to:
   inject, at the transmitter, a fixed tone outside the reception band in addition to the message signal and the swept tone; and
   determine, from the receiver, a coefficient for automatic gain control and temperature variation based upon a change in a gain and a phase of the fixed tone.

12. The self-interference channel estimation system of claim 11, wherein the processor is configured to:

up-convert, at the transmitter, the fixed tone and the swept tone centered around a central frequency of the reception band.

13. The self-interference channel estimation system of claim 11, wherein the processor is configured to:
   determine one or more coefficients of the IIR filter at the receiver, and
   determine, a best-fitting curve indicating a gain response and a best-fitting curve indicating a phase response of the self-interference channel based upon the one or more coefficients.

14. The self-interference channel estimation system of claim 11, wherein the processor is configured to:
   provide, to the receiver, a sample of the transmission signal including the message signal and the swept tone prior to the transmitting,
   wherein the estimating the self-interference channel includes comparing the sample with the swept tone and the portion of the message signal received at the receiver after a transmission.

15. The self-interference channel estimation system of claim 11, wherein the swept tone is transmitted periodically during the transmitting at discrete stepped frequencies.

16. A non-transitory computer-readable medium including computer executable instructions, which when executed by a processor cause the processor to:
   transmit, from a transmitter of a frequency division duplex transceiver in a transmission band, a transmission signal including a message signal and a swept tone that changes frequency from below an upper edge to above a lower edge of a reception band of a receiver, the self-interference channel being defined between the transmitter and the receiver of the frequency division duplex transceiver, such that at least a portion of the message signal leaks into a signal received at the receiver;
   determine, at an infinite impulse response (IIR) filter of the receiver, an infinite impulse response of the self-interference channel based upon a reception of the swept tone swept at each frequency in the reception band; and
   estimate the self-interference channel between the transmitter and the receiver, based upon the infinite impulse response.

17. The non-transitory computer-readable medium of claim 16, wherein the computer executable instructions when executed by the processor further cause the processor to:
   inject, at the transmitter, a fixed tone outside the reception band in addition to the message signal and the swept tone; and
   determine, at the receiver, a coefficient for automatic gain control and temperature variation based upon a change in a gain and a phase of the fixed tone.

18. The non-transitory computer-readable medium of claim 17, wherein the computer executable instructions when executed by the processor further cause the processor to:
   up-convert, at the transmitter, the fixed tone and the swept tone centered around a central frequency of the reception band.

19. The non-transitory computer-readable medium of claim 16, wherein the computer executable instructions when executed by the processor further cause the processor to:
   determine one or more coefficients of the IIR filter at the receiver, and determine, a best-fitting curve indicating a gain response and a best-fitting curve indicating a phase response of the self-interference channel based upon the one or more coefficients.

20. The non-transitory computer-readable medium of claim 16, wherein the computer executable instructions when executed by the processor further cause the processor to:
   provide, to the receiver, a sample of the transmission signal including the message signal and the swept tone prior to the transmitting,
   wherein the estimation of the self-interference channel includes comparing the sample with the swept tone and the portion of the message signal received at the receiver after the transmitting.

* * * * *